United States Patent
Kobayashi

(10) Patent No.: US 7,734,946 B2
(45) Date of Patent: Jun. 8, 2010

(54) TRANSMISSION/RECEPTION SYSTEM, TRANSMISSION APPARATUS AND METHOD, RECEPTION APPARATUS AND METHOD, TRANSMISSION/RECEPTION APPARATUS AND METHOD, AND COMPUTER-READABLE STORAGE MEDIUM

(75) Inventor: Toshiharu Kobayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 1346 days.

(21) Appl. No.: 11/051,291

(22) Filed: Feb. 4, 2005

(65) Prior Publication Data

US 2005/0190762 A1 Sep. 1, 2005

(30) Foreign Application Priority Data

Feb. 6, 2004 (JP) .............................. 2004-030402

(51) Int. Cl.
*G06F 11/00* (2006.01)
(52) U.S. Cl. .............................. 714/4; 709/231; 370/352
(58) Field of Classification Search ................. 379/389, 379/395.1; 709/231, 236; 370/352; 714/4–6
See application file for complete search history.

(56) References Cited

U.S. PATENT DOCUMENTS

| | | | | |
|---|---|---|---|---|
| 5,077,743 A * | 12/1991 | Bitzer et al. | ................. | 714/795 |
| 5,128,665 A * | 7/1992 | DeLuca et al. | ............. | 340/7.44 |
| 5,432,787 A * | 7/1995 | Chethik | ....................... | 370/473 |
| 6,058,476 A * | 5/2000 | Matsuzaki et al. | .......... | 713/169 |
| 6,118,790 A * | 9/2000 | Bolosky et al. | ............. | 370/468 |
| 6,460,137 B1 * | 10/2002 | Akiyama et al. | ............ | 713/160 |
| 6,701,452 B1 * | 3/2004 | Kinjo et al. | .................... | 714/6 |
| 6,738,355 B1 * | 5/2004 | Love et al. | ................... | 370/252 |
| 7,349,675 B2 * | 3/2008 | Karr et al. | ................... | 455/102 |

FOREIGN PATENT DOCUMENTS

| JP | 7-143100 | 6/1995 |
|---|---|---|
| JP | 9-8673 | 1/1997 |
| JP | 11-136220 | 5/1999 |
| JP | 2003-134095 | 9/2003 |

(Continued)

OTHER PUBLICATIONS

John W. Byers et al., "A Digital Fountain Approach to Reliable Distribution of Bulk Data"(1998) (12 pages).

(Continued)

*Primary Examiner*—Simon Sing
(74) *Attorney, Agent, or Firm*—Finnegan, Henderson, Farabow, Garrett & Dunner, L.L.P.

(57) ABSTRACT

A method and apparatus is disclosed by which communication with a higher degree of accuracy can be achieved with increased easiness. A transmission apparatus transmits base data formed by dividing transmission data and redundant data produced by exclusive OR operation using a coefficient matrix prepared in advance to a reception apparatus. The base data and the redundant data have restoration relating information relating to a restoration process added thereto. The reception apparatus specifies lost base data based on the information added to the received base data and redundant data and aligns the acquired redundant data. The reception apparatus utilizes a coefficient matrix prepared in advance to perform exclusive OR operation to restore the lost base data and produces reception data corresponding to the original transmission data. The apparatus and method can be applied to a communication system.

24 Claims, 39 Drawing Sheets

FOREIGN PATENT DOCUMENTS

JP          2003-258776          9/2003

OTHER PUBLICATIONS

Atsushi Yamamoto et al., "A Study of Burst Packet Loss Recovery Using Convolutional Codes" (2001) (8 pages).

Yosuke Senta et al., "Computer Environment and Data Sharing using DirectShare" (2003) (8 pages).

Notifications of Reasons for Refusal, dated Oct. 23, 2009, issued by the Japanese Patent Office in Application No. 2004-030402 (3 pages).

* cited by examiner

F I G. 9
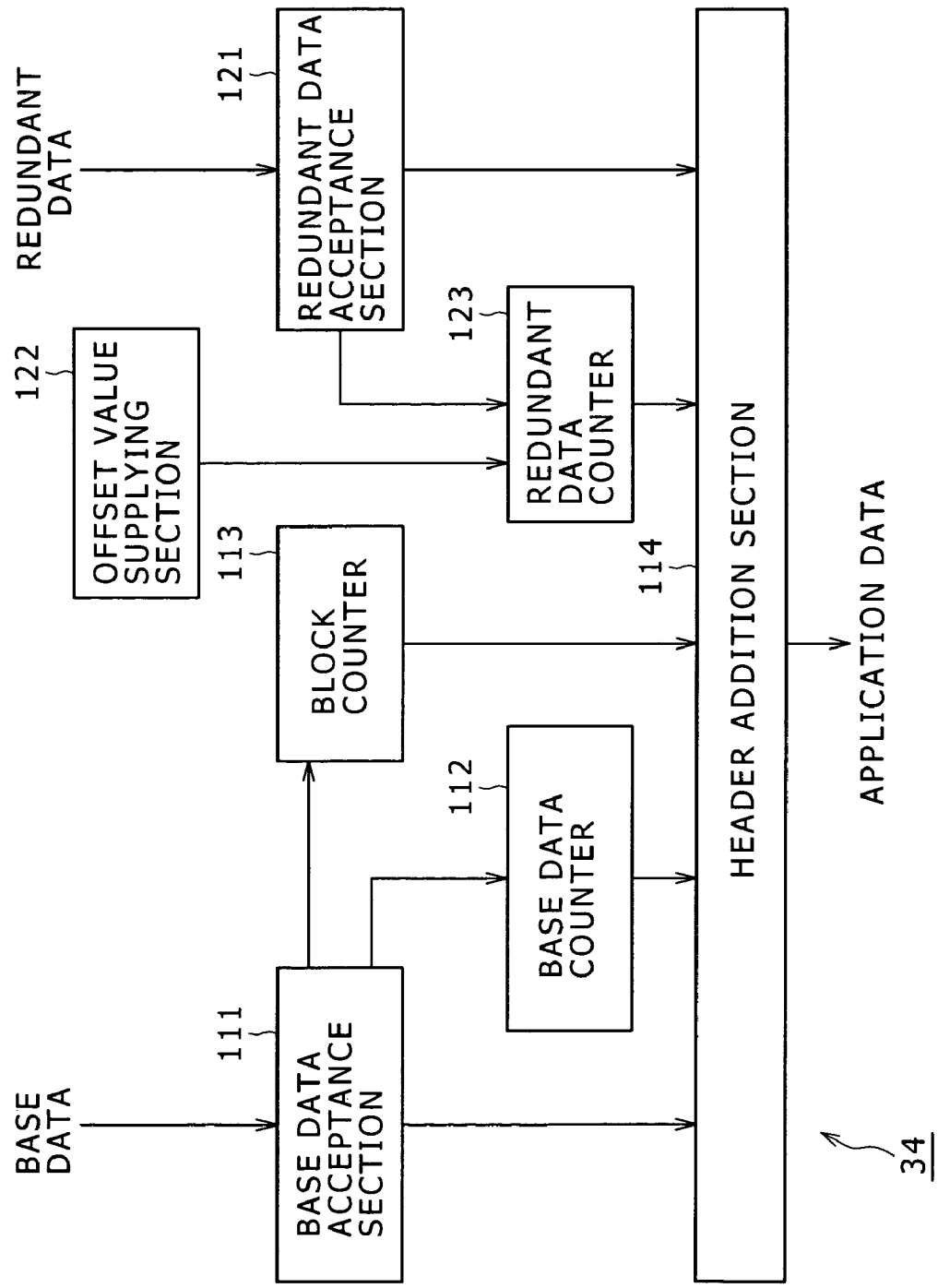

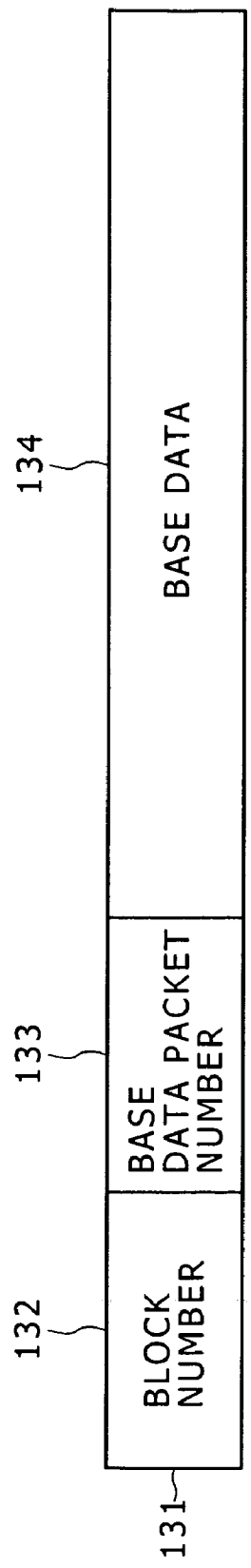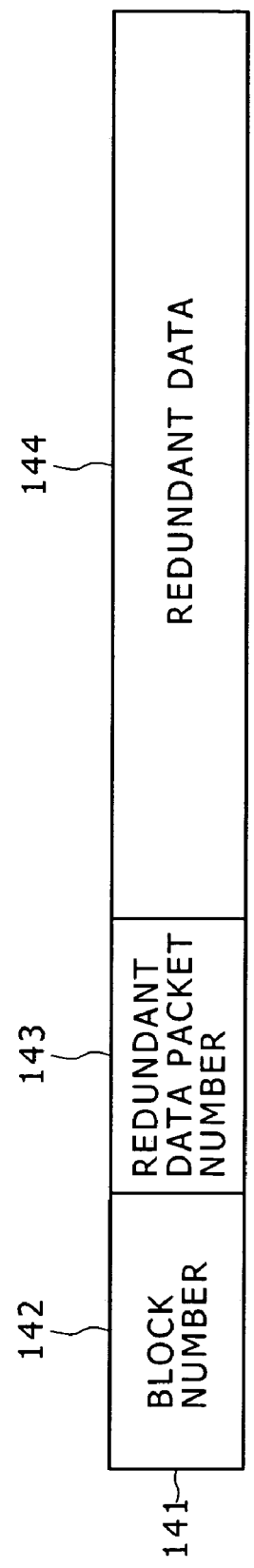

FIG. 11

| BLOCK NUMBER | PACKET NUMBER | BASE DATA / REDUNDANT DATA |
|---|---|---|
| 0 | 0 | BASE DATA |
| 0 | 1 | BASE DATA |
| 0 | 2 | BASE DATA |
| 0 | 3 | BASE DATA |
| — | — | — |
| 0 | 999 | BASE DATA |
| 0 | 1000 | REDUNDANT DATA |
| 0 | 1001 | REDUNDANT DATA |
| — | — | REDUNDANT DATA |
| 0 | 1099 | REDUNDANT DATA |

FIG. 25
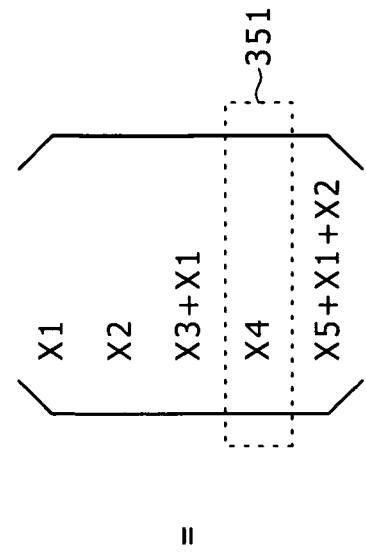
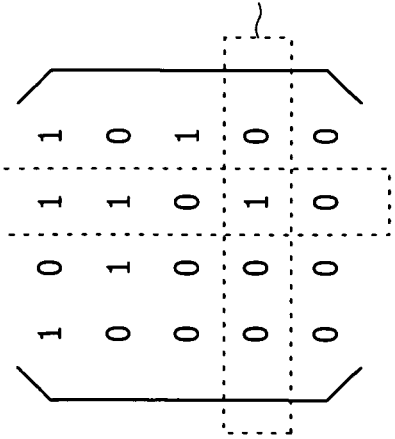

FIG. 26
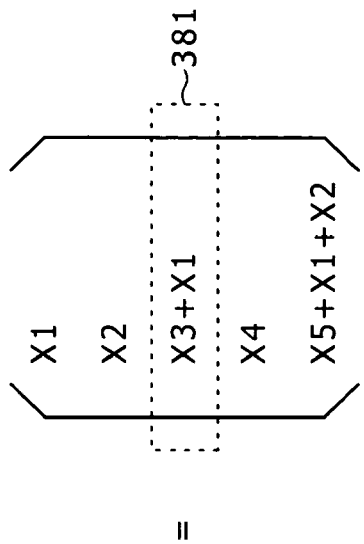
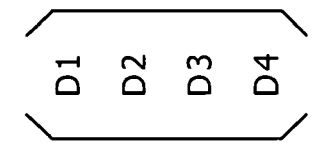
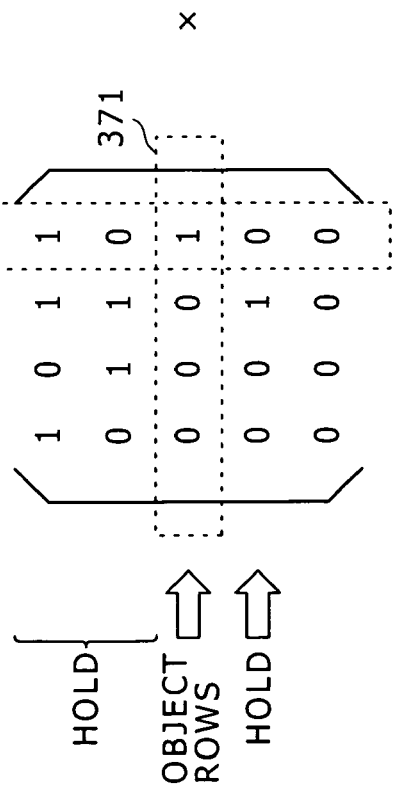

FIG. 29

| 391 | | EOR | REED-SOLOMON FEC (REFERENCE VALUE) |
|---|---|---|---|
| | PRE-PROCESSING | 140 ms | 8600 ms |
| | GAUSSIAN ELIMINATION | 70 ms | 600 ms |
| | DATA RESTORATION | 30 ms | 400 ms |
| | SUM TOTAL | 240 ms (↓ 2.8%) | 9600 ms (↓ 90%) |

FIG. 30

| | | EOR | | RS-FEC |
|---|---|---|---|---|
| PACKET NUMBER / BLOCK | 1000 | 1000 | 100 |
| REDUNDANT PACKET NUMBER | 100 | 200 | 10 |
| PACKET LOSS RATE WITH ERROR RATE IS $10^{-8}$ | 5.0% | 6.1% | 1.0% |
| PACKET LOSS RATE WITH ERROR RATE IS $10^{-14}$ | 3.5% | 5.0% | 0.3% |

401

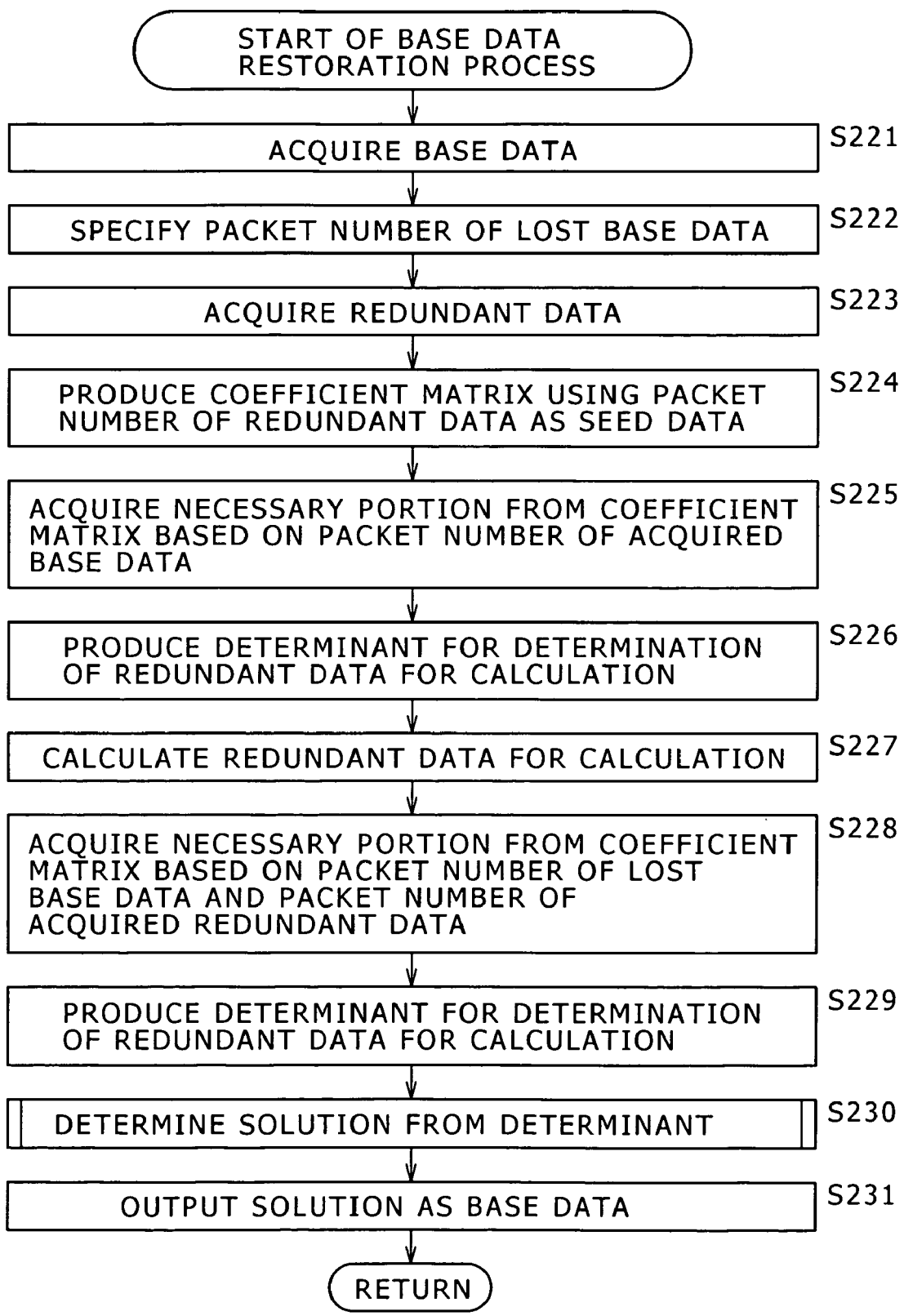

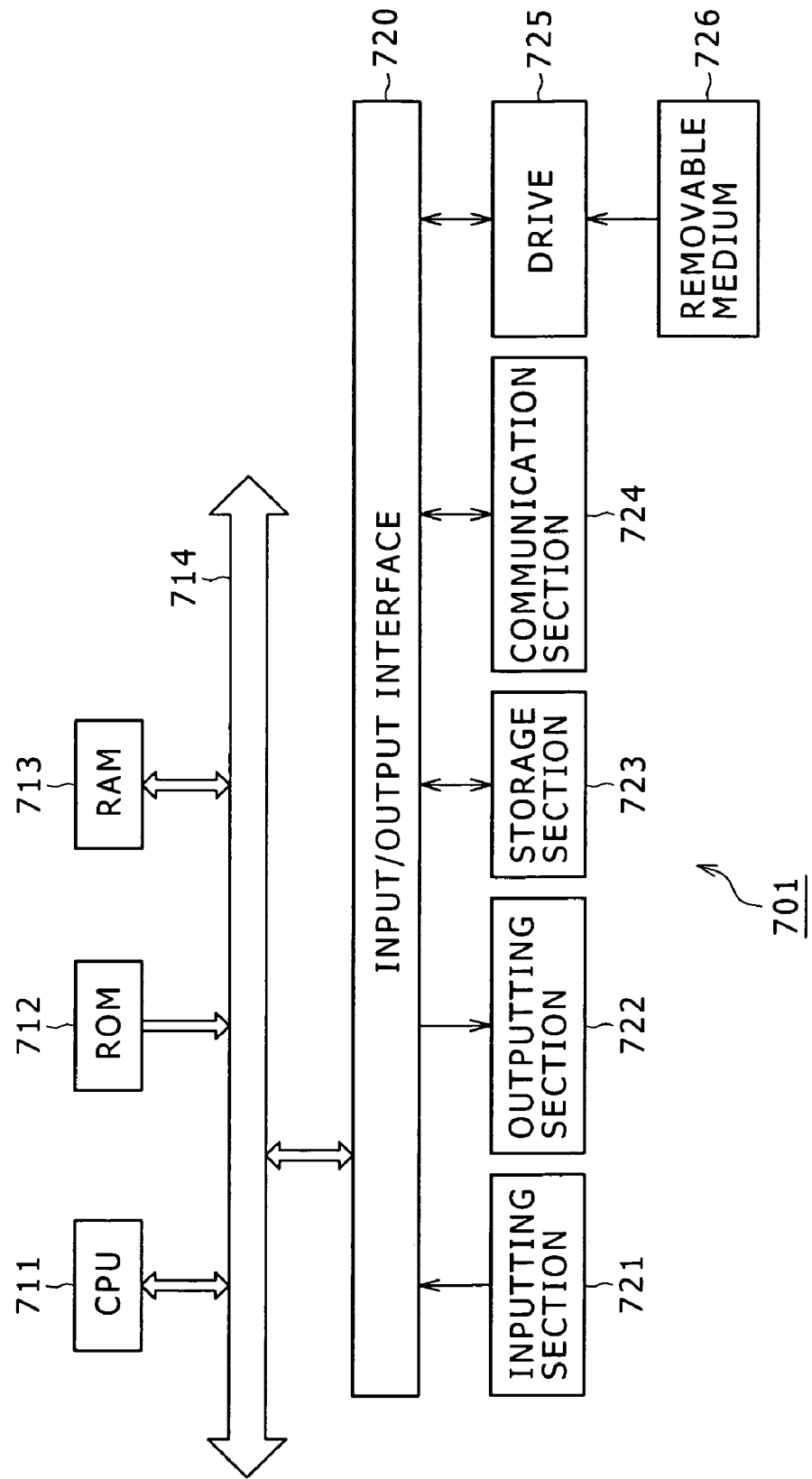

TRANSMISSION/RECEPTION SYSTEM, TRANSMISSION APPARATUS AND METHOD, RECEPTION APPARATUS AND METHOD, TRANSMISSION/RECEPTION APPARATUS AND METHOD, AND COMPUTER-READABLE STORAGE MEDIUM

BACKGROUND OF THE INVENTION

This invention relates to a transmission/reception system, a transmission apparatus and method, a reception apparatus and method, a transmission/reception apparatus and method, and a program, and more particularly to a transmission/reception system, a transmission apparatus and method, a reception apparatus and method, a transmission/reception apparatus and method, and a program by which the load of a restoration process for a lost packet is moderated and accurate communication can be achieved readily.

Various methods have conventionally been proposed for error correction in data communication. One of such error correction method is disclosed, for example, in Japanese Patent No. 3427382 (hereinafter referred to as Patent Document 1). According to the method, where data of a plurality of channels are transmitted through a wired, wireless, an optical or some other transmission medium or a recording medium on which noise of a high level distributed over a wide frequency band is superposed, at least one of the channels is selected as an error correction channel. A result of exclusive OR or modulo addition of data of the other channels is used as data of the error correction channel. It is decided that data of a plurality of channels with regard to which decision of reception is performed or data of a plurality of channels with regard to which decision of reproduction is performed suffer from an error if a result of exclusive OR or modulo addition of decision data of the error correction channel and decision data of a channel paired with the error correction channel does not exhibit a particular value determined in advance such as "0". Further, the quality is detected for each channel, and since the error occurrence probability of data of a channel which exhibits deterioration of the quality is high, a result of exclusive OR or modulo addition of data of the other channels except the data of the channel is replaced with the data of the channel of the quality deterioration to perform error correction.

In recent years, as data communication, streaming distribution, real time broadcasting and so forth of data such as sound and image data through a network represented by the Internet have been and are increasing progressively thanks to development of a broadband communication network.

In such data distribution through a network as described above, packet loss sometimes occurs in the network, and it is sometimes impossible to cope with such packet loss only by such error correction for received data as described above.

Thus, error correction methods for a lost packet have been proposed. For example, according to one of such error correction methods, the receiver side performs re-sending control of issuing a request to re-send a lost packet to the sender side. Also an error detection and correction method (FEC: Forward Error Correction) which uses the Reed Solomon code has been proposed and is disclosed in Japanese Patent Laid-Open No. Hei 11-136220 (hereinafter referred to as Patent Document 2).

In the error correction process for a lost packet by the Reed Solomon code, the transmission apparatus produces an error correction code for transmission data for every block unit of a predetermined size, produces a redundant packet from the error correction code, and distributes the produced redundant packet together with packetized original or base data.

The reception apparatus receives the packet of the base data and the redundant packet distributed in this manner. Then, if the packet of the base data is lost, then the lost packet is restored using the received redundant packet.

However, in the method which performs re-sending control described above, every time packet loss occurs, a re-sending request is supplied from the receiver side to the sender side. Therefore, error correction can be performed with a high probability. However, where data are transmitted to a plurality of apparatus as in multicast distribution, re-sending requests supplied from various apparatus on the receiver side are concentrated on the sender side apparatus, resulting in the possibility that the load to the sender side apparatus may increase. Further, since such re-sending control as described above involves communication, predetermined time is required for an error correction process. Thus, for example, where real-time processing is required for reproduction of the receiver side as in the case of streaming distribution, there is the possibility that the processing may not be performed in time.

On the other hand, in the case of such an error detection and correction method which uses the Reed Solomon code as described above, arithmetic operation on a Galois field is required in a process for production of redundant data or a process for restoration of a lost packet. Therefore, the error detection and correction method has a subject to be solved that such arithmetic operation increases the load of the transmission and reception process.

Accordingly, for example, when a contents distribution server distributes contents data by streaming distribution to a large number of terminal apparatus as in multicast or broadcast distribution, where such an error detection and correction method which uses the Reed Solomon code as described above is applied, the real-time process is required for distribution processing to perform the streaming distribution. Therefore, high-performance hardware specifications which can execute a redundant packet production process of a high load at a high speed are required for the distribution server, and consequently, an increased cost is required for the distribution server. Similarly, also for a terminal apparatus which executes a restoration process, high-performance hardware specifications are required, resulting in increase of the production cost.

Thus, it seems a possible idea to reduce redundant packets to be produced in order to decrease arithmetic operation processing on a Galois field thereby to lower the production cost. However, if the redundant packets are reduced, then the packet restoration performance drops, and if error correction is impossible, then it is sometimes necessary to issue a request for re-sending of the packet.

However, in the case of multicast or broadcast distribution, if a distribution server processes all re-sending request from various terminal apparatus while it performs distribution, then the load increases and may possibly have an influence on the distribution process. Further, in the case of streaming distribution, since the real-time processing is required also for re-sending requests, it is actually difficult for the distribution server to respond normally to such re-sending requests. Thus, there is the possibility that the streaming distribution may not be performed normally.

SUMMARY OF THE INVENTION

It is an object of the present invention to provide a transmission/reception system, a transmission apparatus and method, a reception apparatus and method, a transmission/reception apparatus and method, and a program by which the load of a restoration process is reduced to achieve a high-speed restoration process of a high restoration performance without increasing the production cost and communication can be performed readily with a high degree of accuracy.

In order to attain the object described above, according to an aspect of the present invention, there is provided a transmission/reception system, including a transmission apparatus for transmitting transmission data, and a reception apparatus for receiving the transmission data transmitted from the transmission apparatus. The transmission apparatus is operable to divide block data of the transmission data to produce a plurality of first data having a predetermined size, arbitrarily select a plurality of ones of the produced first data, produce second data representative of results of exclusive OR operation of the selected first data, add first relating information which relates to a restoration process of the first data by the reception apparatus and second relating information to the first data and the second data, respectively, packetize the first data having the first relating information added thereto and the second data having the second relating information added thereto and transmit the resulting packets to the reception apparatus. The reception apparatus is operable to receive both of the first data and the second data, decide, based on the first relating information added to the first data received by the reception apparatus, whether or not the reception apparatus fails to receive some of the first data, produce, when it is decided that the reception apparatus fails to receive some of the first data, a determinant for the restoration process using exclusive OR operation based on the second relating information added to the second data received by the reception apparatus and solve the produced determinant to perform the restoration process thereby to restore the first data.

The transmission/reception system includes a transmission apparatus for transmitting transmission data, and a reception apparatus for receiving the transmission data transmitted from the transmission apparatus. The transmission apparatus divides block data of the transmission data to produce a plurality of first data having a predetermined size. Then, the transmission apparatus arbitrarily selects a plurality of ones of the produced first data and produces second data representative of results of exclusive OR operation of the selected first data. The transmission apparatus further adds first relating information which relates to a restoration process of the first data by the reception apparatus and second relating information to the first data and the second data, respectively. Then, the transmission apparatus packetizes the first data having the first relating information added thereto and the second data having the second relating information added thereto and transmits the resulting packets to the reception apparatus. The reception apparatus receives both of the first data and the second data and decides based on the first relating information added to the first data received by the reception apparatus, whether or not the reception apparatus fails to receive some of the first data. Then, when it is decided that the reception apparatus fails to receive some of the first data, the reception apparatus produces a determinant for the restoration process using exclusive OR operation based on the second relating information added to the second data received by the reception apparatus. Then, the reception apparatus solves the produced determinant to perform the restoration process thereby to restore the first data.

According to another aspect of the present invention, there is provided a transmission apparatus for transmitting transmission data to a reception apparatus, including a first production section for dividing block data of the transmission data to produce a plurality of first data having a predetermined size, a second production section for arbitrarily selecting a plurality of ones of the first data produced by the first production section and producing second data representative of results of exclusive OR operation of the selected first data, an addition section for adding restoration relating information which relates to a restoration process, which is performed using the second data received by the reception apparatus, of the first data which the reception apparatus fails to receive to at least one of the first data produced by the first production section and the second data produced by the second production section, and a transmission section for packetizing the first data and the second data to at least one of which the restoration relating information is added by the addition section and transmitting the resulting packets to the reception apparatus.

According to a further aspect of the present invention, there is provided a transmission method of a transmission apparatus for transmitting transmission data to a reception apparatus, including a first production step of dividing block data of the transmission data to produce a plurality of first data having a predetermined size, a second production step of arbitrarily selecting a plurality of ones of the first data produced by the process of the first production step and producing second data representative of results of exclusive OR operation of the selected first data, an addition step of adding restoration relating information which relates to a restoration process, which is performed using the second data received by the reception apparatus, of the first data which the reception apparatus fails to receive to at least one of the first data produced by the process of the first production step and the second data produced by the process of the second production step, and a transmission control step of controlling so as to packetize the first data and the second data to at least one of which the restoration relating information is added by the process of the addition step and transmit the resulting packets to the reception apparatus.

According to a still further aspect of the present invention, there is provided a program for causing a computer of a transmission apparatus to perform a transmission process of transmitting transmission data to a reception apparatus, including a first production step of dividing block data of part of the transmission data to produce a plurality of first data having a predetermined size, a second production step of arbitrarily selecting a plurality of ones of the first data produced by the process of the first production step and producing second data representative of results of exclusive OR operation of the selected first data, an addition step of adding restoration relating information which relates to a restoration process, which is performed using the second data received by the reception apparatus, of the first data which the reception apparatus fails to receive to at least one of the first data produced by the process of the first production step and the second data produced by the process of the second production step, and a transmission control step of controlling so as to packetize the first data and the second data to at least one of which the restoration relating information is added by the process of the addition step and transmit the resulting packets to the reception apparatus.

In the transmission apparatus and method and the first program, block data of transmission data are divided to produce a plurality of first data having a predetermined size, and a plurality of ones of the first data produced are arbitrarily selected and second data representative of results of exclusive OR operation of the selected first data are produced. Then, restoration relating information which relates to a restoration process, which is performed using the second data received by the reception apparatus, of the first data which the reception apparatus fails to receive is added to at least one of the first data and the second data thus produced. Then, the first data and the second data to at least one of which the restoration relating information are packetized and transmitted to the reception apparatus.

According to a yet further aspect of the present invention, there is provided a reception apparatus for receiving packet data transmitted from a transmission apparatus and formed by dividing block data of transmission data, including a reception section for receiving both of first data which are the packet data and second data representative of results of exclusive OR operation of a plurality of ones of the first data, a decision section for deciding, based on first relating information relating to a restoration process and added to the first data received by the reception section, whether or not the reception section fails to receive some of the first data, a determinant production section for producing, when it is decided by the decision section that the reception section fails to receive some of the first data, a determinant for the restoration process using exclusive OR operation based on second relating information added to the second data received by the reception section and relating to the restoration process, and a restoration section for solving the determinant produced by the determinant production section to perform the restoration process thereby to restore the first data.

According to a yet further aspect of the present invention, there is provided a reception method of a reception apparatus for receiving packet data transmitted from a transmission apparatus and formed by dividing block data of transmission data, including a reception control step of controlling so as to receive both of first data which are the packet data and second data representative of results of exclusive OR operation of a plurality of ones of the first data, a decision step of deciding, based on first relating information relating to a restoration process and added to the first data received by the control by the process of the reception control step, whether or not the reception apparatus fails to receive some of the first data, a determinant production step of producing, when it is decided by the decision process of the decision step that the reception apparatus fails to receive some of the first data, a determinant for the restoration process using exclusive OR operation based on second relating information added to the received second data and relating to the restoration process, and a restoration step of solving the determinant produced by the process of the determinant production step to perform the restoration process thereby to restore the first data.

According to a yet further aspect of the present invention, there is provided a program for causing a computer of a reception apparatus to perform a reception process of receiving packet data transmitted from a transmission apparatus and formed by dividing block data of transmission data, including a reception control step of controlling so as to receive both of first data which are the packet data and second data representative of results of exclusive OR operation of a plurality of ones of the first data, a decision step of deciding, based on first relating information relating to a restoration process and added to the first data received by the control by the process of the reception control step, whether or not the reception apparatus fails to receive some of the first data, a determinant production step of producing, when it is decided by the decision process of the decision step that the reception apparatus fails to receive some of the first data, a determinant for the restoration process using exclusive OR operation based on second relating information added to the received second data and relating to the restoration process, and a restoration step of solving the determinant produced by the process of the determinant production step to perform the restoration process thereby to restore the first data.

In the reception apparatus and method and the second program, both of first data which are packet data and second data representative of results of exclusive OR operation of a plurality of ones of the first data are received. Then, it is decided, based on first relating information relating to a restoration process and added to the received first data, whether or not the reception apparatus fails to receive some of the first data. When it is decided that the reception apparatus fails to receive some of the first data, a determinant for the restoration process using exclusive OR operation is produced based on second relating information added to the received second data and relating to the restoration process. Then, the determinant thus produced is solved to perform the restoration process thereby to restore the first data.

According to an additional aspect of the present invention, there is provided a transmission/reception apparatus for transmitting and receiving transmission data, including a first production section for dividing block data of the transmission data to produce a plurality of first data having a predetermined size, a second production section for arbitrarily selecting a plurality of ones of the first data produced by the first production section and producing second data representative of results of exclusive OR operation of the selected first data, an addition section for adding first relating information which relates to a restoration process of the first data to the first data produced by the production section and adding second relating information which relates to the restoration process of the first data to the second data produced by the second production section, a transmission section for packetizing the first data to which the first relating information is added by the addition section and the second data to which the second relating information is added by the addition section and transmitting the resulting packets to a different transmission/reception apparatus, a reception section for receiving both of the first data and the second data transmitted from the different transmission/reception apparatus, a decision section for deciding, based on the first relating information added to the first data received by the reception section, whether or not the reception section fails to receive some of the first data, a determinant production section for producing, when it is decided by the decision section that the reception section fails to receive some of the first data, a determinant for the restoration process using exclusive OR operation based on the second relating information added to the second data received by the reception section, and a restoration section for solving the determinant produced by the determinant production section to perform the restoration process thereby to restore the first data.

According to another additional aspect of the present invention, there is provided a transmission/reception method of a transmission/reception apparatus for transmitting and receiving transmission data, including a first production step of dividing block data of the transmission data to produce a plurality of first data having a predetermined size, a second production step of arbitrarily selecting a plurality of ones of the first data produced by the process of the first production step and producing second data representative of results of exclusive OR operation of the selected first data, an addition step of adding first relating information which relates to a restoration process of the first data to the first data produced by the process of the first production step and adding second relating information which relates to the restoration process of the first data to the second data produced by the process of the second production step, a transmission step of packetizing the first data to which the first relating information is added by the process of the addition step and the second data to which the second relating information is added by the process of the addition step and transmitting the resulting packets to a different transmission/reception apparatus, a reception control step of controlling so as to receive both of the first data and the second data transmitted from the different transmission/reception apparatus, a decision step of deciding, based on the first relating information added to the first data received by the control by the process of the reception control step, whether or not the different transmission/reception apparatus fails to receive some of the first data, a determinant production step of producing, when it is decided by the decision process of the decision step that the different transmission/reception apparatus fails to receive some of the first data, a determinant for the restoration process using exclusive OR operation based on the second relating information added to the received second data, and a restoration step of solving the determinant produced by the process of the determinant production step to perform the restoration process thereby to restore the first data.

According to a further additional aspect of the present invention, there is provided a program for causing a computer of a transmission/reception apparatus to perform a transmission/reception process for transmitting and receiving transmission data, including a first production step of dividing block data of the transmission data to produce a plurality of first data having a predetermined size, a second production step of arbitrarily selecting a plurality of ones of the first data produced by the process of the first production step and producing second data representative of results of exclusive OR operation of the selected first data, an addition step of adding first relating information which relates to a restoration process of the first data to the first data produced by the process of the first production step and adding second relating information which relates to the restoration process of the first data to the second data produced by the process of the second production step, a transmission step of packetizing the first data to which the first relating information is added by the process of the addition step and the second data to which the second relating information is added by the process of the addition step and transmitting the resulting packets to a different transmission/reception apparatus, a reception control step of controlling so as to receive both of the first data and the second data transmitted from the different transmission/reception apparatus, a decision step of deciding, based on the first relating information added to the first data received by the control by the process of the reception control step, whether or not the different transmission/reception apparatus fails to receive some of the first data, a determinant production step of producing, when it is decided by the decision process of the decision step that the different transmission/reception apparatus fails to receive some of the first data, a determinant for the restoration process using exclusive OR operation based on the second relating information added to the received second data, and a restoration step of solving the determinant produced by the process of the determinant production step to perform the restoration process thereby to restore the first data.

In the transmission/reception apparatus and method and the third program, block data of transmission data are divided to produce a plurality of first data having a predetermined size, and a plurality of ones of the first data thus produced are arbitrarily selected and second data representative of results of exclusive OR operation of the selected first data are produced. Then, first relating information which relates to a restoration process of the first data is added to the produced first data, and second relating information which relates to the restoration process of the first data is added to the produced second data. Further, the first data to which the first relating information is added and the second data to which the second relating information is added are packetized and transmitted to a different transmission/reception apparatus. On the other hand, both of first data and second data transmitted from the different transmission/reception apparatus are received, and it is decided, based on the first relating information added to the received first data, whether or not the different transmission/reception apparatus fails to receive some of the first data. Then, when it is decided that the different transmission/reception apparatus fails to receive some of the first data, a determinant for the restoration process using exclusive OR operation is produced based on the second relating information added to the received second data. Then, the determinant thus produced is solved to perform the restoration process thereby to restore the first data.

With the transmission/reception system, transmission apparatus and method, reception apparatus and method, transmission/reception apparatus and method, and programs, data can be transmitted and received. Particularly, a restoration process of a higher performance can be achieved and communication with a higher degree of accuracy can be achieved with increased easiness.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 9 is a block diagram showing an example of a detailed configuration of an application data production section shown in FIG. 2;

FIGS. 10A and 10B are diagrammatic views illustrating an example of a configuration of application data;

FIG. 11 is a view illustrating an example of packet numbers;

FIGS. 23 to 26 are views illustrating an example of a procedure of a Gaussian elimination method;

FIG. 29 is a view illustrating an example of a result of comparison in processing speed between a restoration process by EOR operation and another restoration process which uses a Reed Solomon code;

FIG. 30 is a view illustrating an example of a result of comparison in error rate between a restoration process by EOR operation and another restoration process which uses a Reed Solomon code;

FIG. 36 is a flow chart illustrating another example of a base data restoration process;

FIG. 39 is a block diagram showing an example of a configuration of a personal computer.

DETAILED DESCRIPTION OF THE PREFERRED EMBODIMENTS

Figure 1:
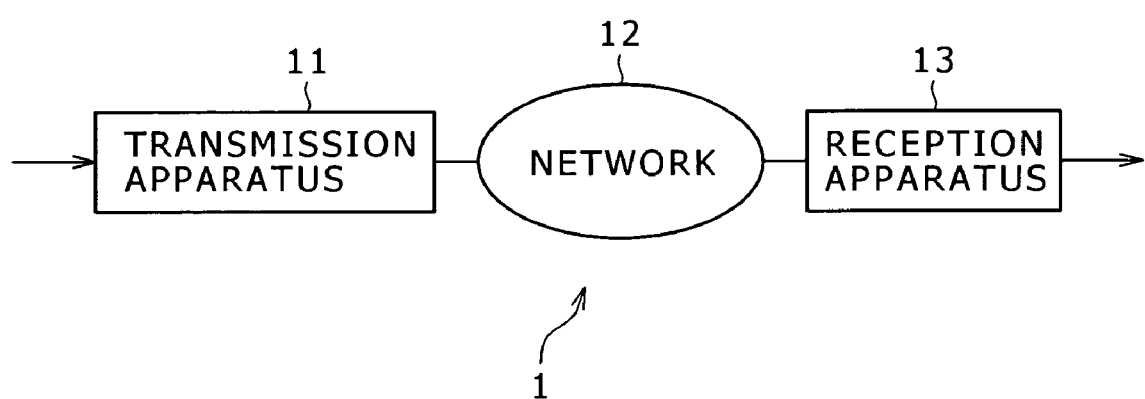
FIG. 1 is a block diagram showing an example of a configuration of a communication system to which the present invention is applied.

Before preferred embodiments of the present invention are described in detail, a corresponding relationship between several features recited in the accompanying claims and particular elements of the preferred embodiments described below is described. The description, however, is merely for the confirmation that the particular elements which support the invention as recited in the claims are disclosed in the description of the embodiments of the present invention. Accordingly, even if some particular element which is recited in description of the embodiments is not recited as one of the features in the following description, this does not signify that the particular element does not correspond to the feature. On the contrary, even if some particular element is recited as an element corresponding to one of the features, this does not signify that the element does not correspond to any other feature than the element.

Further, the following description does not signify that the present invention corresponding to particular elements described in the embodiments of the present invention is all described in the claims. In other words, the following description does not deny the presence of an invention which corresponds to a particular element described in the description of the embodiments of the present invention but is not recited in the claims, that is, the description does not deny the presence of an invention which may be filed for patent in a divisional patent application or may be additionally included into the present patent application as a result of later amendment to the claims.

According to the present invention, there is provided a transmission/reception system (for example, a communication system 1 of FIG. 1) including a transmission apparatus (for example, a transmission apparatus 11 of FIG. 1) for transmitting transmission data (for example, transmission data 51 of FIG. 3) and a reception apparatus (for example, a reception apparatus 13 of FIG. 1) for receiving the transmission data transmitted from the transmission apparatus. The transmission apparatus is operable to divide block data (for example, a block 52 of FIG. 3) of the transmission data to produce a plurality of first data (for example, base data 53 of FIG. 3) having a predetermined size (for example, a step S1 and another step S2 of FIG. 15), arbitrarily select a plurality of ones of the produced first data, produce second data (for example, redundant data 54 of FIG. 3) representative of results of exclusive OR operation of the selected first data (for example, a step S3 of FIG. 15), add first relating information (for example, a base data packet number 133) which relates to a restoration process of the first data by the reception apparatus and second relating information (for example, a redundant data packet number 143 of FIG. 10) to the first data and the second data, respectively (for example, a step S4 of FIG. 15), packetize the first data having the first relating information added thereto and the second data having the second relating information added thereto and transmit the resulting packets to the reception apparatus (for example, a step S7 of FIG. 15). The reception apparatus is operable to receive both of the first data and the second data (for example, a step S91 of FIG. 19), decide, based on the first relating information added to the first data received by the reception apparatus, whether or not the reception apparatus fails to receive some of the first data (for example, a step S97 of FIG. 19), produce, when it is decided that the reception apparatus fails to receive some of the first data, a determinant for the restoration process using exclusive OR operation based on the second relating information added to the second data received by the reception apparatus (for example, a step S129 of FIG. 20) and solve the produced determinant to perform the restoration process thereby to restore the first data (for example, a step S130 of FIG. 20).

According to the present invention, there is provided a transmission apparatus (for example, a transmission apparatus 11 of FIG. 1) for transmitting transmission data (for example, transmission data 51 of FIG. 3) to a reception apparatus (for example, a reception apparatus 13 of FIG. 1). The transmission apparatus includes a first production section (for example, a block dividing section 32 of FIG. 2) for dividing block data (for example, a block 52 of FIG. 3) of the transmission data to produce a plurality of first data (for example, base data 53 of FIG. 3) having a predetermined size, a second production section (for example, a redundant data production section 33 of FIG. 2) for arbitrarily selecting a plurality of ones of the first data produced by the first production section and producing second data (for example, redundant data 54 of FIG. 3) representative of results of exclusive OR operation of the selected first data, an addition section (for example, an application data production section 34 of FIG. 2) for adding restoration relating information (for example, a base data packet number 133 or a redundant data packet number 143 of FIG. 10) which relates to a restoration process, which is performed using the second data received by the reception apparatus, of the first data which the reception apparatus fails to receive to at least one of the first data produced by the first production section and the second data produced by the second production section, and a transmission section (for example, a UDP packetization section 35 to Ethernet (R) processing section 39 of FIG. 2) for packetizing the first data and the second data to at least one of which the restoration relating information is added by the addition section and transmitting the resulting packets to the reception apparatus.

Figure 18:
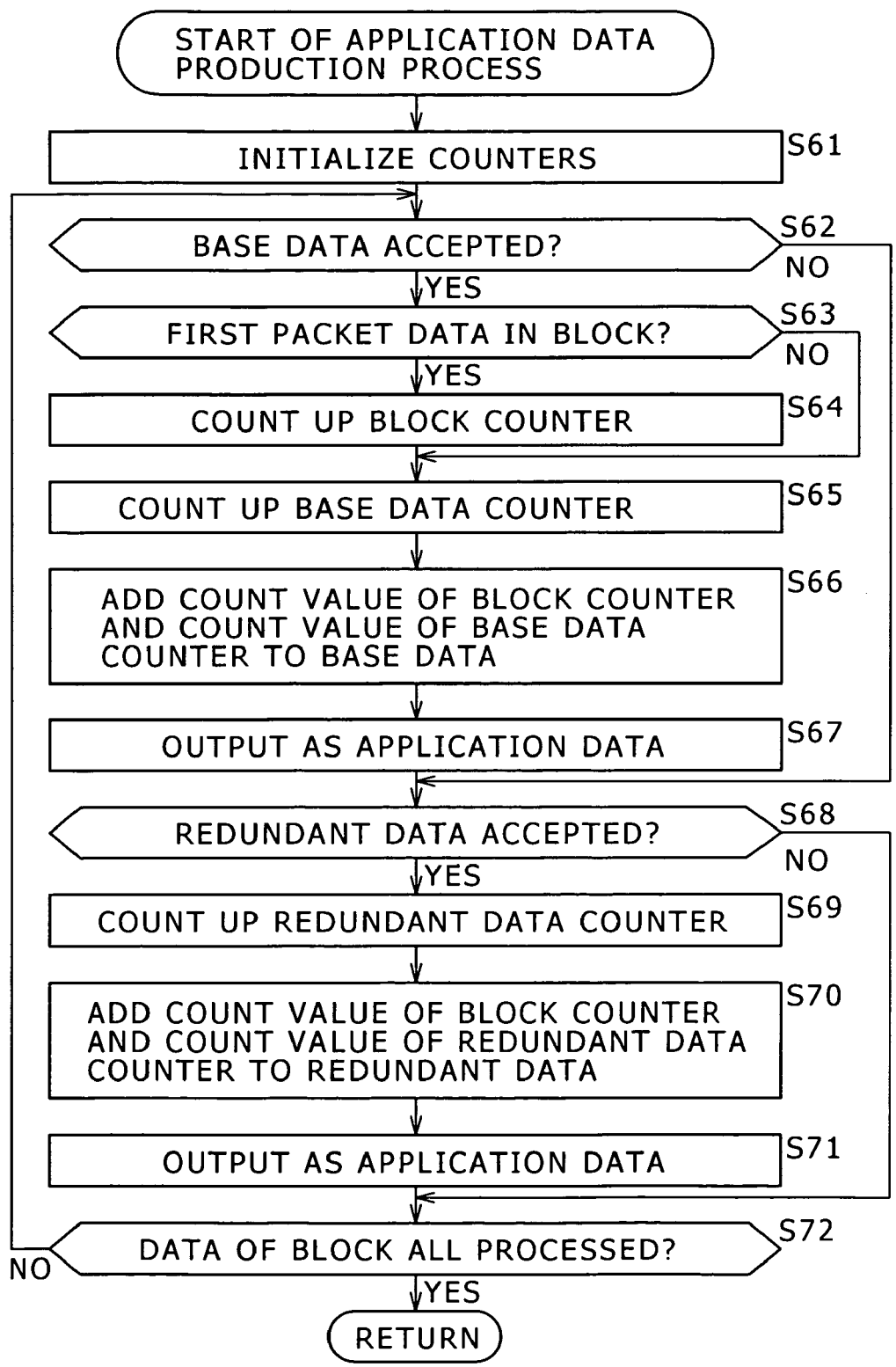
FIG. 18 is a flow chart illustrating an example of an application data production process.

The restoration relating information may include first relating information (for example, the base data packet number 133 of FIG. 10) for specifying the first data which the reception apparatus fails to receive and second relating information (for example, the redundant data packet number 143 of FIG. 10) for allowing the reception apparatus to align the second data received by the reception apparatus in the restoration process, and the addition section may add the first relating information to the first data and adds the second relating information to the second data (for example, a step S66 and another step S70 of FIG. 18).

The first relating information may be a first packet number (for example, the base data packet number 133 of FIG. 10) for identifying the first data and the second relating information may be a second packet number second relating information (for example, the redundant data packet number 143 of FIG. 10) for identifying the second data.

The restoration relating information may further include third relating information (for example, a block number 132 and another block number 142 of FIG. 10) for specifying the block data corresponding to the first data or the second data received by the reception apparatus, and the addition section may add the third relating information to the first data and the second data (for example, a step S66 and another step S70 of FIG. 18).

The third relating information may be a block number for identifying the block data (for example, a block number 132 and another block number 142 of FIG. 10).

The second production section may use a predetermined coefficient matrix prepared in advance for arbitrarily selecting the first data to produce the second data.

The restoration relating information may include first relating information (for example, a base data packet number 133 of FIG. 10) for specifying the first data which the reception apparatus fails to receive and second relating information (for example, a redundant data packet number 143 of FIG. 10) for allowing the reception apparatus to produce a coefficient matrix for use for arithmetic operation of the restoration process, and the addition section may add the first relating information to the first data and adds the second relating information to the second data (for example, a step S66 and a step S70 of FIG. 18).

The second production section may produce a coefficient matrix for arbitrarily selecting a plurality of ones of the first data based on the second relating information (for example, a step S224 of FIG. 36) and use the produced coefficient matrix to produce the second data (for example, a step S230 of FIG. 36).

The first relating information may be a first packet number (for example, a base data packet number 133 of FIG. 10) for identifying the first data and the second relating information may be a second packet number (for example, a redundant data packet number 143 of FIG. 10) for identifying the second data.

The restoration relating information may further include third relating information (for example, a block number 132 and another block number 142 of FIG. 10) for specifying the block data corresponding to the first data or the second data received by the reception apparatus, and the addition section may add the third relating information to the first data and the second data (for example, a step S66 and another step S70 of FIG. 18).

The third relating information may be a block number (for example, the block number 132 and the block number 142 of FIG. 10) for identifying the block data.

Figure 15:
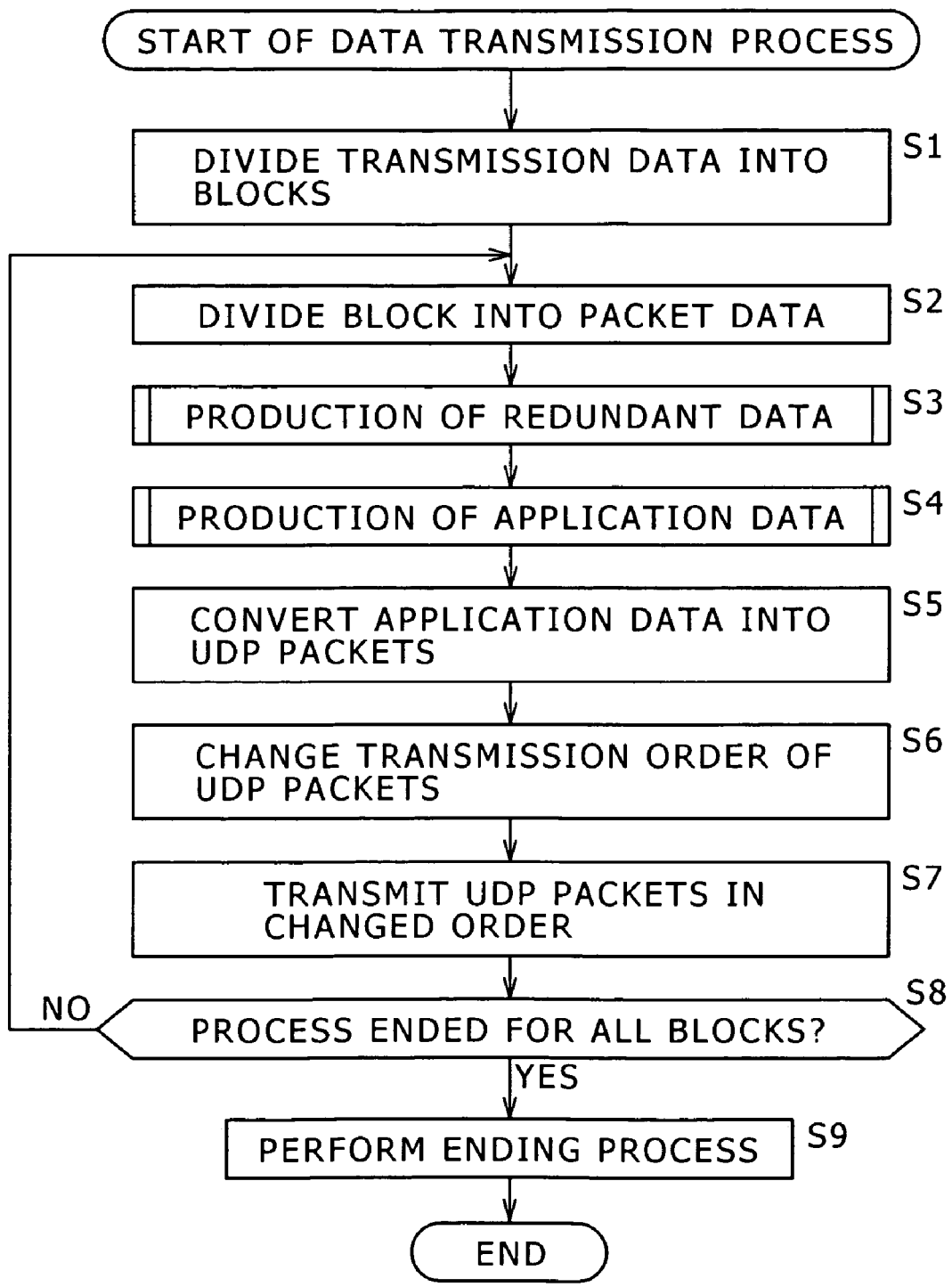
FIG. 15 is a flow chart illustrating an example of a data transmission process.

The transmission section may transmit the packetized first data and second data in an arbitrary order (for example, a step S6 and another step S7 of FIG. 15).

According to the present invention, there is provided a transmission method of a transmission apparatus (for example, a transmission apparatus 11 of FIG. 1) for transmitting transmission data (for example, transmission data 51 of FIG. 3) to a reception apparatus (for example, a reception apparatus 13 of FIG. 1). The transmission method include a first production step (for example, a step S1 and another step S2 of FIG. 15) of dividing block data (for example, a block 52 of FIG. 3) of part of the transmission data to produce a plurality of first data (for example, base data 53 of FIG. 3) having a predetermined size, a second production step (for example, a step S3 of FIG. 15) of arbitrarily selecting a plurality of ones of the first data produced by the process of the first production step and producing second data (for example, redundant data 54 of FIG. 3) representative of results of exclusive OR operation of the selected first data, an addition step (for example, a step S4 of FIG. 15) of adding restoration relating information (for example, a base data packet number 133 or a redundant data packet number 143 of FIG. 10) which relates to a restoration process, which is performed using the second data received by the reception apparatus, of the first data which the reception apparatus fails to receive to at least one of the first data produced by the process of the first production step and the second data produced by the process of the second production step, and a transmission control step (for example, a step S7 of FIG. 15) of controlling so as to packetize the first data and the second data to at least one of which the restoration relating information is added by the process of the addition step and transmit the resulting packets to the reception apparatus.

According to the present invention, there is provided a first program for causing a computer of a transmission apparatus (for example, a transmission apparatus 11 of FIG. 1) to perform a transmission process of transmitting transmission data (for example, transmission data 51 of FIG. 3) to a reception apparatus (for example, a reception apparatus 13 of FIG. 1). The first program includes a first production step (for example, a step S1 and another step S2 of FIG. 15) of dividing block data (for example, a block 52 of FIG. 3) of part of the transmission data to produce a plurality of first data (for example, base data 53 of FIG. 3) having a predetermined size, a second production step (for example, a step S3 of FIG. 15) of arbitrarily selecting a plurality of ones of the first data produced by the process of the first production step and producing second data (for example, redundant data 54 of FIG. 3) representative of results of exclusive OR operation of the selected first data, an addition step (for example, a step S4 of FIG. 15) of adding restoration relating information (for example, a base data packet number 133 or a redundant data packet number 143 of FIG. 10) which relates to a restoration process, which is performed using the second data received by the reception apparatus, of the first data which the reception apparatus fails to receive to at least one of the first data produced by the process of the first production step and the second data produced by the process of the second production step, and a transmission control step (for example, a step S7 of FIG. 15) of controlling so as to packetize the first data and the second data to at least one of which the restoration relating information is added by the process of the addition step and transmit the resulting packets to the reception apparatus.

Figure 3:
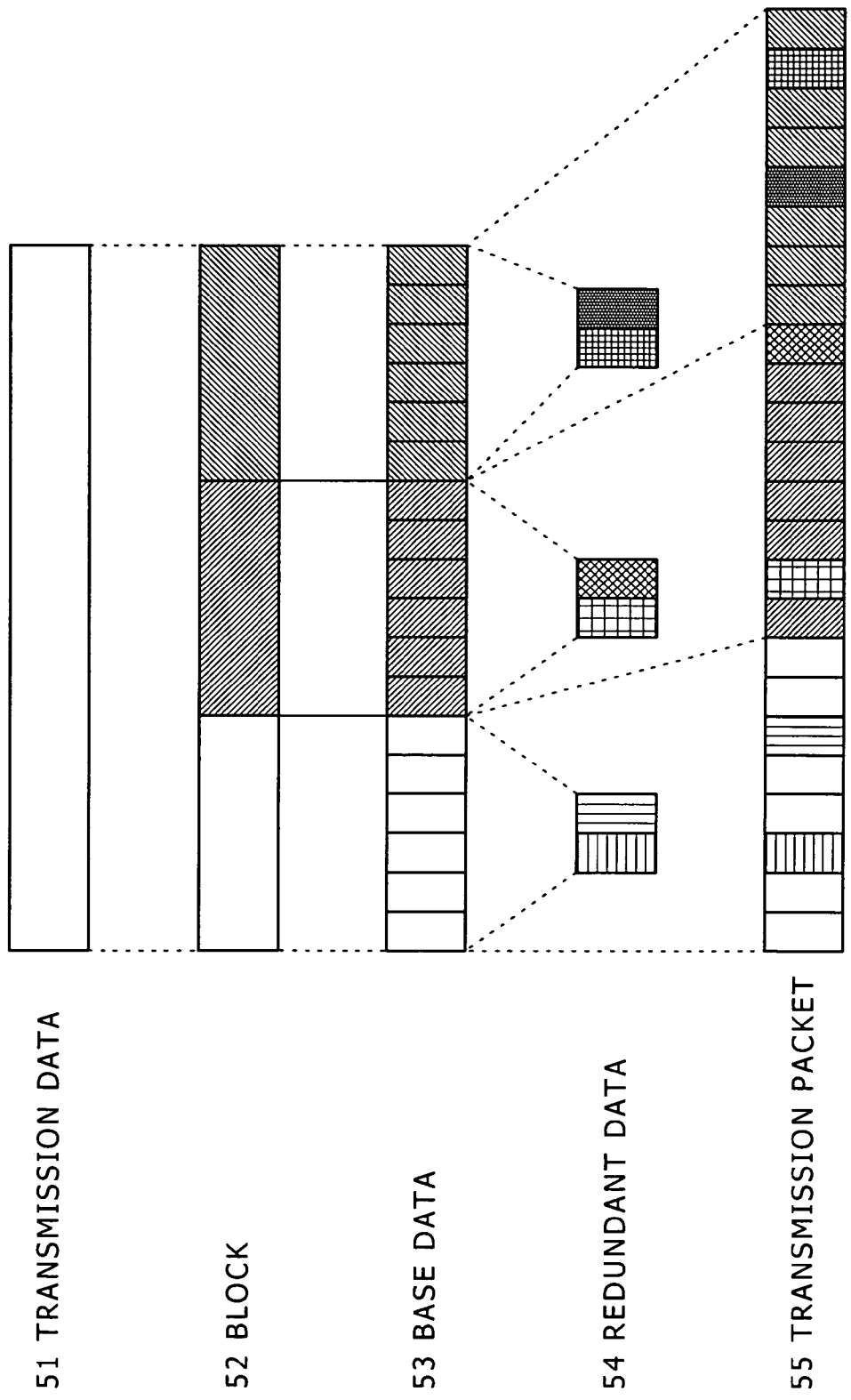
FIG. 3 is a diagrammatic view illustrating flows of data in the communication system of FIG. 1.

According to the present invention, there is provided a reception apparatus (for example, a reception apparatus 13 of FIG. 1) for receiving divided packet data (for example, base data 81 and redundant data 82 of FIG. 6) transmitted from a transmission apparatus (for example, a transmission apparatus 11 of FIG. 1) and formed by dividing block data (for example, a block 52 of FIG. 3) of transmission data (for example, transmission data 51 of FIG. 3). The reception apparatus includes a reception section (for example, an Ethernet (R) processing section 221 of FIG. 12) for receiving both of first data (for example, base data 241 of FIG. 13) which are the packet data and second data (for example, redundant data 242 of FIG. 13) representative of results of exclusive OR operation of a plurality of ones of the first data, a decision section (for example, a packet loss decision section 226 of FIG. 12) for deciding, based on first relating information (for example, a base data packet number 133 of FIG. 10) relating to a restoration process and added to the first data received by the reception section, whether or not the reception section fails to receive some of the first data, a determinant production section (for example, a determinant production section 253 of FIG. 14) for producing, when it is decided by the decision section that the reception section fails to receive some of the first data, a determinant for the restoration process using exclusive OR operation based on second relating information (for example, a redundant data packet number 143 of FIG. 10) added to the second data received by the reception section and relating to the restoration process, and a restoration section (for example, a determinant arithmetic operation section 256 of FIG. 14) for solving the determinant produced by the determinant production section to perform the restoration process thereby to restore the first data.

The first relating information may be a first packet number (for example, a base data packet number 133 of FIG. 10) for identifying the first data and the second relating information may be a second packet number (for example, a redundant data packet number 143 of FIG. 10) for identifying the second data.

Figure 20:
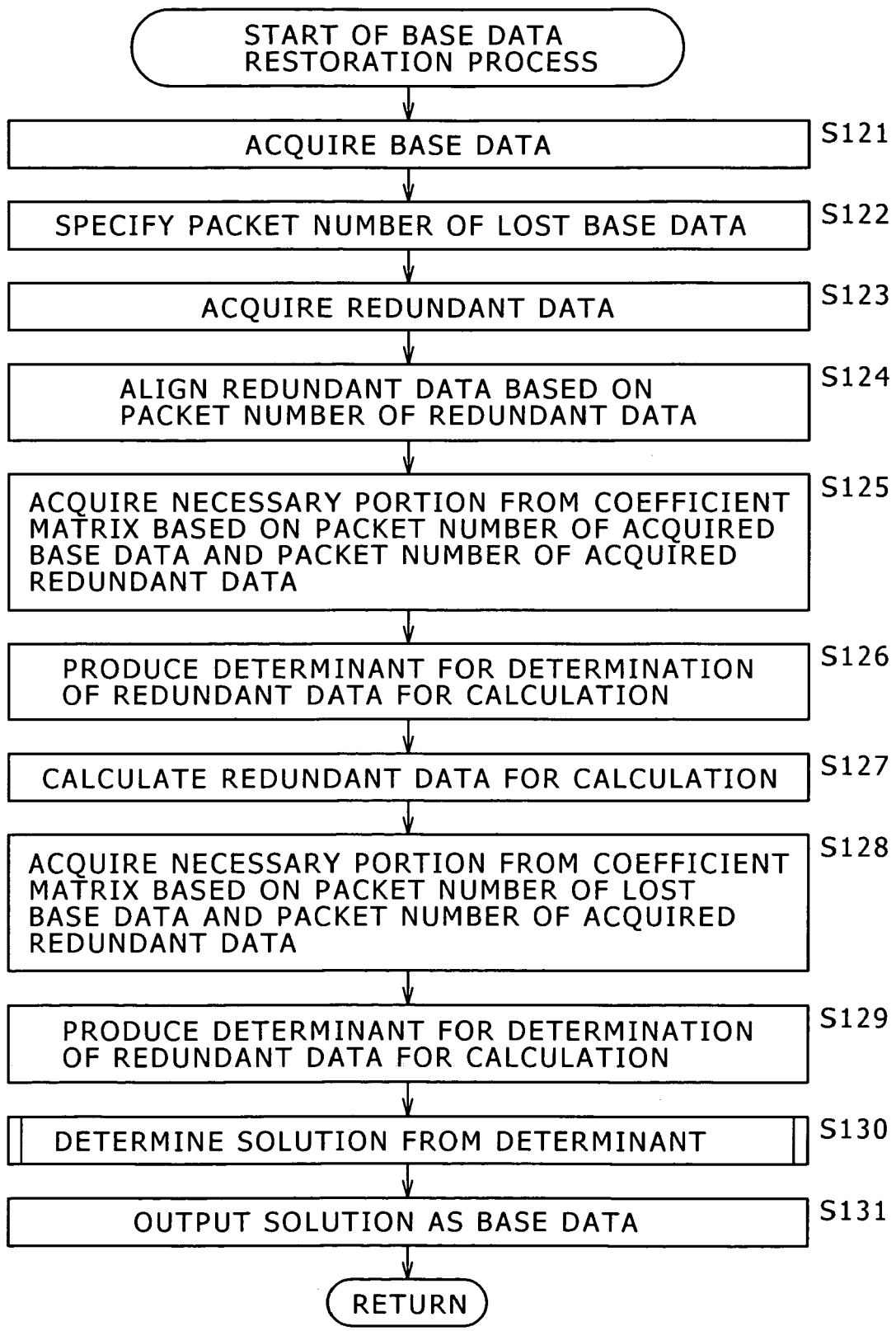
FIG. 20 is a flow chart illustrating an example of a base data restoration process.

The determinant production section may align the second data based on the second relating information (for example, a step S124 of FIG. 20) and produce the determinant using the aligned second data, the first data received by the reception section and a predetermined coefficient matrix prepared in advance (for example, a step S129 of FIG. 20).

The determinant production section may use the second data and the first data received by the reception section to produce the second data for arithmetic operation (for example, a step S127 of FIG. 20) and produce the determinant using the produced second data, the first data received by the reception section and a predetermined coefficient matrix prepared in advance.

The reception apparatus may further include a coefficient matrix production section (for example, a coefficient matrix supplying section 255 of FIG. 14 which executes a process at step S224 of FIG. 36) for producing a coefficient matrix for the restoration process using the second relating information, the determinant production section producing the determinant using the first data and the second data received by the reception section and the coefficient matrix produced by the coefficient matrix production section.

According to the present invention, there is provided a reception method of a reception apparatus (for example, a reception apparatus 13 of FIG. 1) for receiving divided packet data (for example, base data 81 and redundant data 82 of FIG. 6) transmitted from a transmission apparatus (for example, a transmission apparatus 11 of FIG. 1) and formed by dividing block data (for example, a block 52 of FIG. 3) of transmission data (for example, transmission data 51 of FIG. 3). The reception method includes a reception control step (for example, a step S91 of FIG. 19) of controlling so as to receive both of first data (for example, base data 241 of FIG. 13) which are the packet data and second data (for example, redundant data 242 of FIG. 13) representative of results of exclusive OR operation of a plurality of ones of the first data, a decision step (for example, a step S97 of FIG. 19) of deciding, based on first relating information (for example, a base data packet number 133 of FIG. 10) relating to a restoration process and added to the first data received by the control by the process of the reception control step, whether or not the reception apparatus fails to receive some of the first data, a determinant production step (for example, a step S129 of FIG. 20) of producing, when it is decided by the decision process of the decision step that the reception apparatus fails to receive some of the first data, a determinant for the restoration process using exclusive OR operation based on second relating information (for example, a redundant data packet number 143 of FIG. 10) added to the received second data and relating to the restoration process, and a restoration step (for example, a step S130 of FIG. 20) of solving the determinant produced by the process of the determinant production step to perform the restoration process thereby to restore the first data.

According to the present invention, there is provided a second program for causing a computer of a reception apparatus (for example, a reception apparatus 13 of FIG. 1) to perform a reception process of receiving divided packet data (for example, base data 81 and redundant data 82 of FIG. 6) transmitted from a transmission apparatus (for example, a transmission apparatus 11 of FIG. 1) and formed by dividing block data (for example, a block 52 of FIG. 3) of transmission data (for example, transmission data 51 of FIG. 3). The second program includes a reception control step (for example, a step S91 of FIG. 19) of controlling so as to receive both of first data (for example, base data 241 of FIG. 13) which are the packet data and second data (for example, redundant data 242 of FIG. 13) representative of results of exclusive OR operation of a plurality of ones of the first data, a decision step (for example, a step S97 of FIG. 19) of deciding, based on first relating information (for example, a base data packet number 133 of FIG. 10) relating to a restoration process and added to the first data received by the control by the process of the reception control step, whether or not the reception apparatus fails to receive some of the first data, a determinant production step (for example, a step S129 of FIG. 20) of producing, when it is decided by the decision process of the decision step that the reception apparatus fails to receive some of the first data, a determinant for the restoration process using exclusive OR operation based on second relating information (for example, a redundant data packet number 143 of FIG. 10) added to the received second data and relating to the restoration process, and a restoration step (for example, a step S130 of FIG. 20) of solving the determinant produced by the process of the determinant production step to perform the restoration process thereby to restore the first data.

Figure 37:
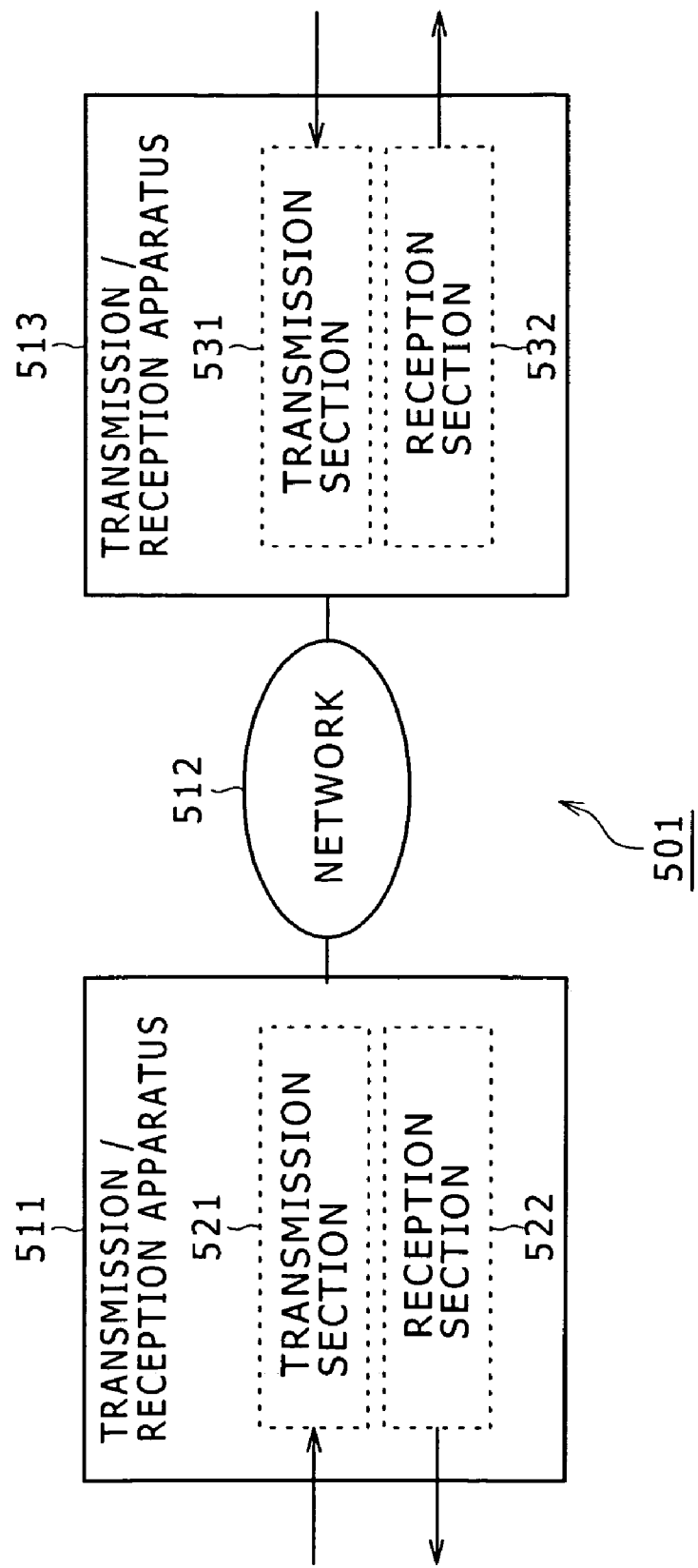
FIG. 37 is a block diagram showing another example of a configuration of the communication system to which the present invention is applied.

According to the present invention, there is provided a transmission/reception apparatus (for example, a transmission/reception apparatus 511 or another transmission/reception apparatus 513 of FIG. 37) for transmitting and receiving transmission data (for example, transmission data 51 of FIG. 3). The transmission/reception apparatus includes a first production section (for example, a block dividing section 32 of FIG. 2) for dividing block data (for example, a block 52 of FIG. 3) of part of the transmission data to produce a plurality of first data (for example, base data 53 of FIG. 3) having a predetermined size, a second production section (for example, a redundant data production section 33 of FIG. 2) for arbitrarily selecting a plurality of ones of the first data produced by the first production section and producing second data (for example, redundant data 54 of FIG. 3) representative of results of exclusive OR operation of the selected first data, an addition section (for example, an application data production section 34 of FIG. 2) for adding first relating information (for example, a base data packet number 133 of FIG. 10) which relates to a restoration process of the first data to the first data produced by the production section and adding second relating information (for example, a redundant data packet number 143 of FIG. 10) which relates to the restoration process of the first data to the second data produced by the second production section, a transmission section (for example, a UDP packetization section 35 to Ethernet (R) processing section 39 of FIG. 2) for packetizing the first data to which the first relating information is added by the addition section and the second data to which the second relating information is added by the addition section and transmitting the resulting packets to a different transmission/reception apparatus, a reception section (for example, an Ethernet (R) processing section 221 of FIG. 12) for receiving both of the first data and the second data transmitted from the different transmission/reception apparatus, a decision section (for example, a packet loss decision section 226 of FIG. 12) for deciding, based on the first relating information added to the first data received by the reception section, whether or not the reception section fails to receive some of the first data, a determinant production section (for example, a determinant production section 253 of FIG. 14) for producing, when it is decided by the decision section that the reception section fails to receive some of the first data, a determinant for the restoration process using exclusive OR operation based on the second relating information added to the second data received by the reception section, and a restoration section (for example, a determinant arithmetic operation section 256 of FIG. 14) for solving the determinant produced by the determinant production section to perform the restoration process thereby to restore the first data.

According to the present invention, there is provided a transmission/reception method of a transmission/reception apparatus (for example, a transmission/reception apparatus 511 or another transmission/reception apparatus 513 of FIG. 37) for transmitting and receiving transmission data (for example, transmission data 51 of FIG. 3). The transmission/reception method includes a first production step (for example, a step S1 and another step S2 of FIG. 15) of dividing block data (for example, a block 52 of FIG. 3) of part of the transmission data to produce a plurality of first data (for example, base data 53 of FIG. 3) having a predetermined size, a second production step (for example, a step S3 of FIG. 15) of arbitrarily selecting a plurality of ones of the first data produced by the process of the first production step and producing second data (for example, redundant data 54 of FIG. 3) representative of results of exclusive OR operation of the selected first data, an addition step (for example, a step S4 of FIG. 15) of adding first relating information (for example, a base data packet number 133 of FIG. 10) which relates to a restoration process of the first data to the first data produced by the process of the first production step and adding second relating information (for example, a redundant data packet number 143 of FIG. 10) which relates to the restoration process of the first data to the second data produced by the process of the second production step, a transmission step (for example, a step S7 of FIG. 15) of packetizing the first data to which the first relating information is added by the process of the addition step and the second data to which the second relating information is added by the process of the addition step and transmitting the resulting packets to a different transmission/reception apparatus, a reception control step (for example, a step S91 of FIG. 19) of controlling so as to receive both of the first data and the second data transmitted from the different transmission/reception apparatus, a decision step (for example, a step S97 of FIG. 19) of deciding, based on the first relating information added to the first data received by the control by the process of the reception control step, whether or not the different transmission/reception apparatus fails to receive some of the first data, a determinant production step (for example, a step S129 of FIG. 20) of producing, when it is decided by the decision process of the decision step that the different transmission/reception apparatus fails to receive some of the first data, a determinant for the restoration process using exclusive OR operation based on the second relating information added to the received second data, and a restoration step (for example, a step S130 of FIG. 20) of solving the determinant produced by the process of the determinant production step to perform the restoration process thereby to restore the first data.

According to the present invention, there is provided a third program for causing a computer of a transmission/reception apparatus (for example, a transmission/reception apparatus 511 or another transmission/reception apparatus 513 of FIG. 37) to perform a transmission/reception process for transmitting and receiving transmission data (for example, transmission data 51 of FIG. 3). The third program includes a first production step (for example, a step S1 and another step S2 of FIG. 15) of dividing block data (for example, a block 52 of FIG. 3) of the transmission data to produce a plurality of first data (for example, base data 53 of FIG. 3) having a predetermined size, a second production step (for example, a step S3 of FIG. 15) of arbitrarily selecting a plurality of ones of the first data produced by the process of the first production step and producing second data (for example, redundant data 54 of FIG. 3) representative of results of exclusive OR operation of the selected first data, an addition step (for example, a step S4 of FIG. 15) of adding first relating information (for example, a base data packet number 133 of FIG. 10) which relates to a restoration process of the first data to the first data produced by the process of the first production step and adding second relating information (for example, a redundant data packet number 143 of FIG. 10) which relates to the restoration process of the first data to the second data produced by the process of the second production step, a transmission step (for example, a step S7 of FIG. 15) of packetizing the first data to which the first relating information is added by the process of the addition step and the second data to which the second relating information is added by the process of the addition step and transmitting the resulting packets to a different transmission/reception apparatus, a reception control step (for example, a step S91 of FIG. 19) of controlling so as to receive both of the first data and the second data transmitted from the different transmission/reception apparatus, a decision step (for example, a step S97 of FIG. 19) of deciding, based on the first relating information added to the first data received by the control by the process of the reception control step, whether or not the different transmission/reception apparatus fails to receive some of the first data, a determinant production step (for example, a step S129 of FIG. 20) of producing, when it is decided by the decision process of the decision step that the different transmission/reception apparatus fails to receive some of the first data, a determinant for the restoration process using exclusive OR operation based on the second relating information added to the received second data, and a restoration step (for example, a step S130 of FIG. 20) of solving the determinant produced by the process of the determinant production step to perform the restoration process thereby to restore the first data.

In the following, preferred embodiments of the present invention are described with reference to the accompanying drawings.

FIG. 1 shows an example of a configuration of a communication system to which the present invention is applied.

Referring to FIG. 1, the communication system 1 shown includes a transmission apparatus 11 which transmits data, and a network 12 represented by a LAN (Local Area Network), the Internet or the like and having the transmission apparatus 11 connected thereto. The communication system 1 further includes a reception apparatus 13 which is connected to the network 12 and receives data transmitted from the transmission apparatus 11.

The transmission apparatus 11 transmits, when it acquires contents data to be transmitted (transmission data) such as stream data supplied thereto from the outside, the transmission data to the reception apparatus 13 set as a transmission destination of data through the network 12. Thereupon, the transmission apparatus 11 divides the transmission data into packets and transmits the packets using a predetermined protocol such as the UDP (User Datagram Protocol). Further, the transmission apparatus 11 produces redundant data for a data restoration process from the transmission data as hereinafter described. The transmission apparatus 11 divides also the redundant data into packets and transmits the packets to the reception apparatus 13 together with the base data (transmission data).

When the reception apparatus 13 receives packets supplied thereto from the transmission apparatus 11, it restores original transmission data (contents data) based on the received packets and supplies the restored contents data to the outside. Thereupon, the reception apparatus 13 restores a packet (packet for transmission data) which has not been received successfully, that is, a lost packet, using the received redundant data.

As described above, in the communication system 1, the transmission apparatus 11 produces, in addition to transmission data, a plurality of redundant data for error correction against packet loss produced from the transmission data and transmits the redundant data to the reception apparatus 13 together with the transmission data. The reception apparatus 13 performs a restoration process of original transmission data which have not been received successfully based on the redundant data (received redundant data). Through the process, the reception apparatus 13 can restore the lost data without issuing a re-sending request to the transmission apparatus 11.

Figure 2:
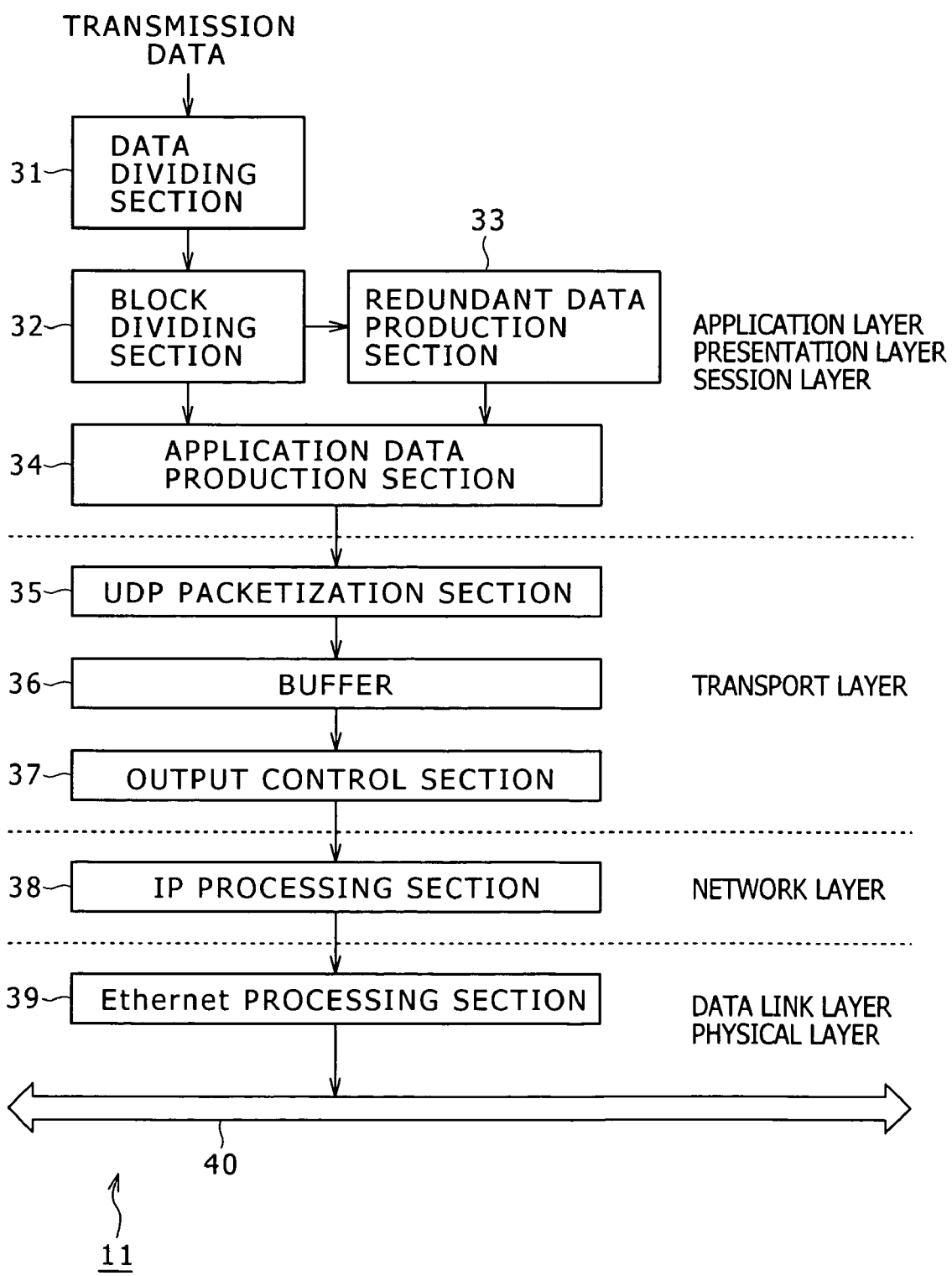
FIG. 2 is a block diagram showing an example of a configuration of a transmission apparatus shown in FIG. 1.

FIG. 2 shows an example of a detailed configuration of the transmission apparatus 11. Variation of transmission data processed by the transmission apparatus 11 is illustrated in FIG. 3.

Referring to FIG. 2, a data dividing section 31 of the transmission apparatus 11 divides transmission data such as contents data supplied thereto from the outside of the transmission apparatus 11 into blocks of a predetermined data size and supplies the blocks to a block dividing section 32. In particular, the data dividing section 31 accumulates the transmission data supplied thereto into a buffer (not shown) built therein and supplies, every time data of the predetermined data size are accumulated, the accumulated data as a block to the block dividing section 32.

Referring to FIG. 3, transmission data 51 supplied to the transmission apparatus 11 are divided into a plurality of blocks 52 of a predetermined data size unit by the data dividing section 31. In FIG. 3, it can be seen that the transmission data 51 are divided into three blocks 52.

The block dividing section 32 divides the transmission data in a block unit supplied thereto from the data dividing section 31 further so as to have a predetermined data size similarly to the data dividing section 31. In particular, the block dividing section 32 divides the transmission data in a block unit so as to have a data size (packet size) for packetization to produce data for a packet (packet data). The block dividing section 32 supplies the produced packet data to a redundant data production section 33 and an application data production section 34.

Referring to FIG. 3, for example, each of the blocks 52 is divided into base data 53, which are packet data of a data size used in packetization, by the block dividing section 32. In FIG. 3, each of the blocks 52 is divided into six base data 53. Naturally, the dividing number is determined depending upon the data size of packet data and the data size of a block, and one block may be divided into any number of packet data.

Referring back to FIG. 2, when the redundant data production section 33 acquires packet data (base data) obtained by dividing the original transmission data for one block, it produces redundant data to be used for restoration of a lost packet on the receiver side based on the acquired base data for one block. More particularly, the redundant data production section 33 selects arbitrary base data from within the base data for one block, and synthesizes the selected base data by EOR (Exclusive OR) arithmetic operation to obtain redundant data. A more particular production method is hereinafter described.

It is to be noted that redundant data for a restoration process are obtained by synthesis of a plurality of base data by EOR operation and cannot be utilized as they are as base data. However, the redundant data substantially contain contents of the base data. Accordingly, since the redundant data overlap in information with the base data, the data for a restoration process are hereinafter referred to as "redundant data". Further, the redundant data have a data size equal to that of the base data as hereinafter described, and also the redundant data are packetized and transmitted.

In particular, as packet data (data of the packet size), base data (packet data produced by dividing transmission data) and redundant data (packet data for lost packet restoration produced based on the base data) are available. In the following description, where there is no necessity to distinguish base data and redundant data, the term "packet data" is used for the data, but where there is the necessity to distinguish them, they are referred to as base data and redundant data, respectively.

The redundant data production section 33 supplies the produced redundant data to the application data production section 34.

The application data production section 34 adds a header to each of the base data supplied thereto from the block dividing section 32 and the redundant data supplied thereto from the redundant data production section 33 to produce application data. In other words, as such application data, application data including base data to which a header is added and application data including redundant data to which a header is added are available. Contents of the header are hereinafter described.

The application data production section 34 supplies the produced application data to a UDP packetization section 35.

It is to be noted that the processes described above are processes of the application layer, presentation layer and session layer of the OSI layer model (Open System Interconnection layer model) which is a model of the structure of the seven-layer network protocol standardized by the ISO (International Organization for Standardization).

The UDP packetization section 35 to which the application data are supplied packetizes the received application data based on the UDP protocol and supplies the thus produced UDP packets to a buffer 36.

Figure 4:
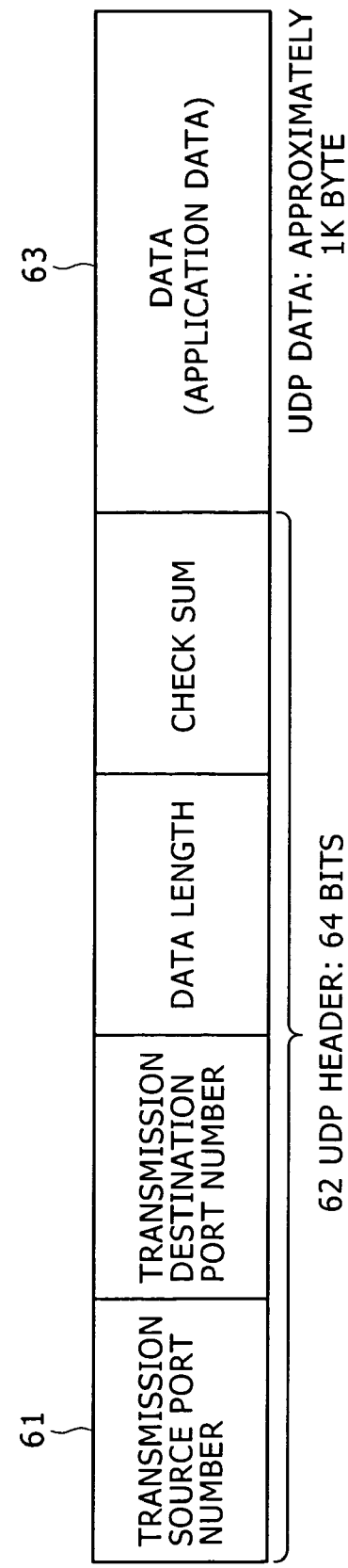
FIG. 4 is a diagrammatic view illustrating an example of a configuration of a UDP packet.

Referring to FIG. 4, the UDP packet 61 includes a UDP header 62 of 64 bits and application data 63. The UDP header 62 includes information of a port number of a transmission source, a port number of a transmission destination, a data length of the application data 63, a check sum and so forth. The data size of the application data has a predetermined value determined arbitrarily and usually is approximately 1K bytes.

Referring back to FIG. 2, the buffer 36 is formed from a semiconductor memory such as a RAM (Random Access Memory) and accumulates UDP packets supplied thereto from the UDP packetization section 35. Then, the buffer 36 outputs the accumulated UDP packets under the control of an output control section 37.

When UDP packets are accumulated for one block into the buffer 36, the output control section 37 acquires the UDP packets in an arbitrary (random) order and supplies them to an IP (Internet Protocol) processing section 38. In other words, the buffer 36 and the output control section 37 change (shuffle) the outputting order of UDP packets produced by the UDP packetization section 35 such that the UDP packets containing base data and the UDP packets containing the redundant data are outputted in an arbitrary order.

Generally, upon transmission of packets, the receiver side sometimes fails to receive a plurality of successive packets because of loss in a burst in a network or the like. Further, as hereinafter described, the restoration capacity of the reception apparatus 13 in restoration of lost base data substantially increases in proportion to the number of received redundant data. Accordingly, when the transmission apparatus 11 outputs base data and reproduction data individually in order, if such burst packet loss as mentioned above occurs in a concentrated manner with the redundant data, then there is the possibility that the restoration capacity deteriorates extremely.

Thus, the buffer 36 and the output control section 37 of the transmission apparatus 11 shuffle UDP packets to change the outputting order of the UDP packets such that base data and redundant data are transmitted in a mixed manner and in a random order as described above. Consequently, even if burst packet loss occurs upon transmission of packets, concentration of the loss upon redundant data can be suppressed, also the withstanding property against burst packet loss can be enhanced. In other words, the transmission apparatus 11 can transmit data with a higher degree of accuracy to the reception apparatus 13, and the communication system 1 can implement transmission and reception of data with a higher degree of accuracy.

For example, in FIG. 3, after the base data 53 and the redundant data 54 are converted into UDP packets, the UDP packets are shuffled so that they are transmitted in an arbitrary outputting order as transmission packets 55.

It is to be noted that the processes of the UDP packetization section 35 through the output control section 37 are processes of the transport layer of the OSI layer model.

The IP processing section 38 performs a process of the network layer of the OSI layer model to convert UDP packets supplied thereto from the output control section 37 into IP packets based on the IP protocol, and supplies the IP packets to an Ethernet (R) processing section 39.

The Ethernet (R) processing section 39 performs processes of the data link layer and the physical layer based on standards of the Ethernet (R) to further packetize the IP packets supplied thereto from the IP processing section 38 and outputs the resulting packets to the network 12 through a cable 40 so that the packets may be transmitted to the reception apparatus 13.

The packets outputted from the Ethernet (R) processing section 39 are supplied to the reception apparatus 13 through the network 12.

Figure 5:
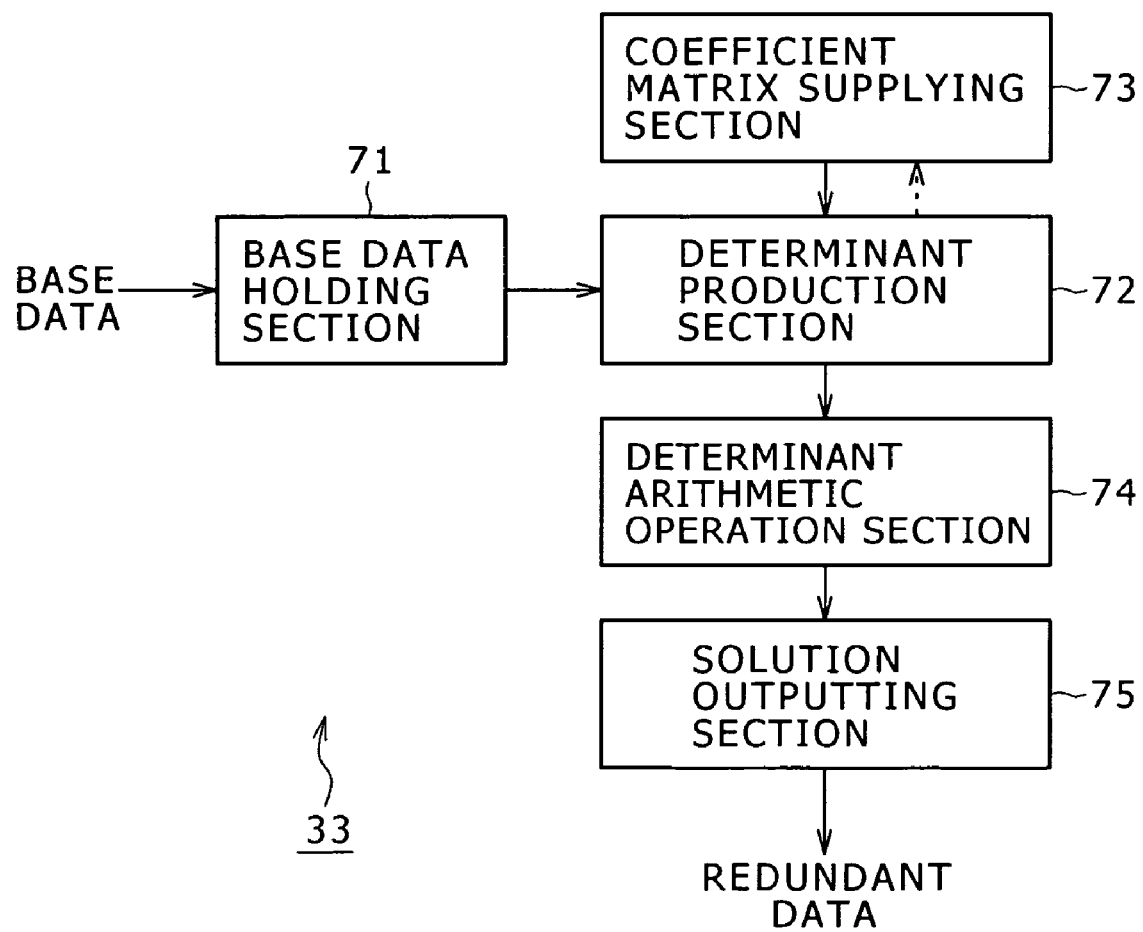
FIG. 5 is a block diagram showing an example of a detailed configuration of a redundant data production section shown in FIG. 2.

Now, details of the redundant data production section 33 shown in FIG. 2 are described. It is to be noted that the following description relates to a case wherein the transmission apparatus 11 produces N base data ($D_1$ to $D_N$) from transmission data of one block and produces M redundant data S ($S_1$ to $S_M$) from the N base data D. FIG. 5 shows an example of a detailed configuration of the redundant data production section 33.

Referring to FIG. 5, base data supplied from the block dividing section 32 shown in FIG. 2 are supplied to and held by a base data holding section 71. After base data for one block are held, the base data holding section 71 supplies the base data to a determinant production section 72.

When base data for one block are acquired, the determinant production section 72 issues a request for a coefficient matrix to be used for production of a determinant for production of redundant data to a coefficient matrix supplying section 73 as indicated by a broken line arrow mark in FIG. 5. The coefficient matrix has M rows and N columns and includes factors any of which is "1" or "0". The coefficient matrix is used for selection of base data to be used for EOR operation. As hereinafter described, all redundant data are determined by integration of the coefficient matrix and another matrix which includes the base data as factors thereof. Accordingly, the rows of the coefficient matrix correspond to redundant data different from each other, and the factors of the rows are integrated with base data different from each other. In other words, the individual redundant data represent results of EOR operation of those factors of the coefficient matrix which have the value "1" and the integrated base data.

When the coefficient matrix supplying section 73 receives such a request for a coefficient matrix as described above, it supplies, in response to the request, a coefficient matrix produced in advance from pseudo-random numbers using a linear congruence method to the determinant production section 72.

After the coefficient matrix is acquired, the determinant production section 72 uses the coefficient matrix and base data for one block to produce a determinant for production of redundant data for the block. More particularly, the determi nant production section 72 produces such a determinant as given by the following expression (1):

$$\begin{bmatrix} S_1 \\ S_2 \\ \vdots \\ \vdots \\ S_M \end{bmatrix} = \begin{bmatrix} 1 & 0 & 1 & \cdots & \cdots & 0 \\ 0 & 1 & 0 & \cdots & \cdots & 1 \\ \vdots & \vdots & \vdots & \ddots & & \vdots \\ \vdots & \vdots & \vdots & & \ddots & \vdots \\ 1 & 1 & 0 & \cdots & \cdots & 1 \end{bmatrix} \times \begin{bmatrix} D_1 \\ D_2 \\ \vdots \\ \vdots \\ D_N \end{bmatrix} \quad (1)$$

In the expression (1) above, the first term on the right side represents a coefficient matrix of M rows and N columns and is a coefficient matrix supplied from the coefficient matrix supplying section 73. The second term on the right side represents a matrix of the base data D ($D_1$ to $D_N$) while the matrix on the left side represents redundant data S ($S_1$ to $S_M$) calculated from the determinant. It is to be noted that, in the expression (1), not addition but EOR operation for each bit is performed. The value of each factor of the coefficient matrix is determined at random as hereinafter described. In other words, the expression (1) represents that the redundant data $S_1$ to $S_M$ are results of EOR operation of base data arbitrarily selected from among the base data $D_1$ to $D_N$.

After such a determinant as described above is produced, the determinant production section 72 supplies the determinant to a determinant arithmetic operation section 74. It is to be noted that the determinant indicates a same thing as simultaneous equations. This similarly applies to the following description.

The determinant arithmetic operation section 74 arithmetically operates such a determinant as given by the expression (1). In particular, the determinant arithmetic operation section 74 integrates the column factors of each row of the coefficient matrix of the first term of the right side of the expression (1) with the respective corresponding row components (base data $D_1$ to $D_N$) of the second term of the right side. Then, the determinant arithmetic operation section 74 uses results of the integration to perform EOR operation for each of the corresponding bits to calculate one EOR operation result for each row and sets the calculated EOR operation results as redundant data S.

Here, an arithmetic operation procedure in the integration of two matrices where normal decimal numbers are used is described. First, the rows of the matrix of the first term are integrated with the column of the matrix of the second term. More particularly, the rows of the matrix of the first term and the column of the matrix of the second row are integrated for each corresponding factors. For example, as regards the first row of the first term, the factor of the ith column of the row is integrated with the factor of the ith row of the column of the second term. After the integration is performed in this manner, all of the results of the integrations of the factors are added. For example, where the matrix of the first term is a matrix of N columns and the matrix of the second term is a matrix of N rows, in each of the integrations of the row of the matrix of the first term and the column of the matrix of the second term, integration results between the N factors are obtained. Therefore, the N integration results are added, and a result of the addition is set as an integration result of the row of the matrix of the first term and the column of the matrix of the second term.

Also with the determinant of the expression (1) given hereinabove, arithmetic operation is performed in an arithmetic operation procedure basically similar to such an arithmetic operation procedure as just described. However, since the base data D and the redundant data S are bit trains of binary numbers, EOR operation for each bit is used in place of the addition process of integration results of factors in the arithmetic operation procedure described above wherein decimal numbers are used.

Describing in order of the arithmetic operation procedure, the determinant arithmetic operation section 74 integrates the rows of the coefficient matrix of the first term of the right side of the expression (1) with the column of the matrix (matrix which includes the base data $D_1$ to $D_N$ as factors thereof) of the second term on the right side. More particularly, the factors of the columns of each row of the coefficient matrix of the first term on the right side are integrated with the factors (base data $D_1$ to $D_N$) of the matrix of the second term on the right side, respectively. Since the values of the factors of the coefficient matrix of the first term on the right side are "1" or "0", the integration results of the factors become either the factors (base data $D_1$ to $D_N$) of the second term on the right side or "0" (more particularly, a bit train which includes a number of bits equal to the number of bits of the base data D and wherein the values of the bits are "0").

Then, the determinant arithmetic operation section 74 synthesizes the integration results of the factors by EOR operation for the individual bits corresponding to each other as described above. Here, the EOR operation is described. In particular, the value of the EOR operation result of the value "0" and the value "0" is "0"; the value of the EOR operation result of the value "0" and the value "1" is "1"; the value of the EOR operation result of the value "1" and the value "0" is "1"; and the value of the EOR operation result of the value "1" and the value "1" is "0". Accordingly, the EOR operation result of a bit train of "11110000" and another bit train of "10101010" is "01011010". The determinant arithmetic operation section 74 repeats such EOR operation as described above to synthesize all of the integration results of the factors. Then, this EOR operation result is set as one redundant data S.

Such arithmetic operation as described above is repeated for the rows of the coefficient matrix of the first term on the right side of the expression (1) to determine the redundant data $S_1$ to $S_M$ all represented as the factors of the matrix of the first term on the left side of the expression (1).

It is to be noted that, since the value of each factor of a coefficient matrix is "0" or "1" as described hereinabove, the integration results of the factors of the coefficient matrix and the base data $D_1$ to $D_N$ become either the factors (base data $D_1$ to $D_N$) of the second term on the right side or "0". Accordingly, where the integration is represented in other words, the determinant arithmetic operation section 74 selects or extracts the base data D to be used for production of redundant data S by integration of the factors and the base data $D_1$ to $D_N$.

Further, since the integration results of the factors are synthesized by EOR operation for the individual bits corresponding to each other as described above, the value of each of the bits of the synthesis result (EOR operation result) is "1" where the number of those integration results whose value is "1" is an odd number from among the bits of the integration results of the EOR operation corresponding to the bit, but is "0" where the number of those integration results whose value is "1" is an even number. Accordingly, where the EOR operation is represented by other words, the determinant arithmetic operation section 74 tabulates the values of the bits of the integration results of the individual factors for each of the bits corresponding to each other and, if the number of those integration results whose value is "1" is an odd number, the determinant arithmetic operation section 74 sets the value of a bit of the redundant data S corresponding to the bit to "1", but if the number of those integration results whose value is "1" is an even number, the determinant arithmetic operation section 74 sets the value of a bit of the redundant data S corresponding to the bit to "0".

In particular, the determinant arithmetic operation section 74 selects base data D from among the base data $D_1$ to $D_N$ in accordance with a predetermined method. Then, if the number of those bits of the selected base data D corresponding to each other which have the value "1" is an odd number, then the determinant arithmetic operation section 74 sets the value of a bit of the redundant data S corresponding to the bits to "1". However, if the number of those bits which have the value "1" is an even number, the determinant arithmetic operation section 74 sets the value of a bit of the redundant data S corresponding to the bits to "0".

The determinant arithmetic operation section 74 performs arithmetic operation in such a manner as described above to determine redundant data S ($S_1$ to $S_M$) and supplies the redundant data S to a solution outputting section 75. In particular, the transmission apparatus 11 produces such packet data as illustrated in FIG. 6 from the transmission data and transmits the packet data.

Figure 6:
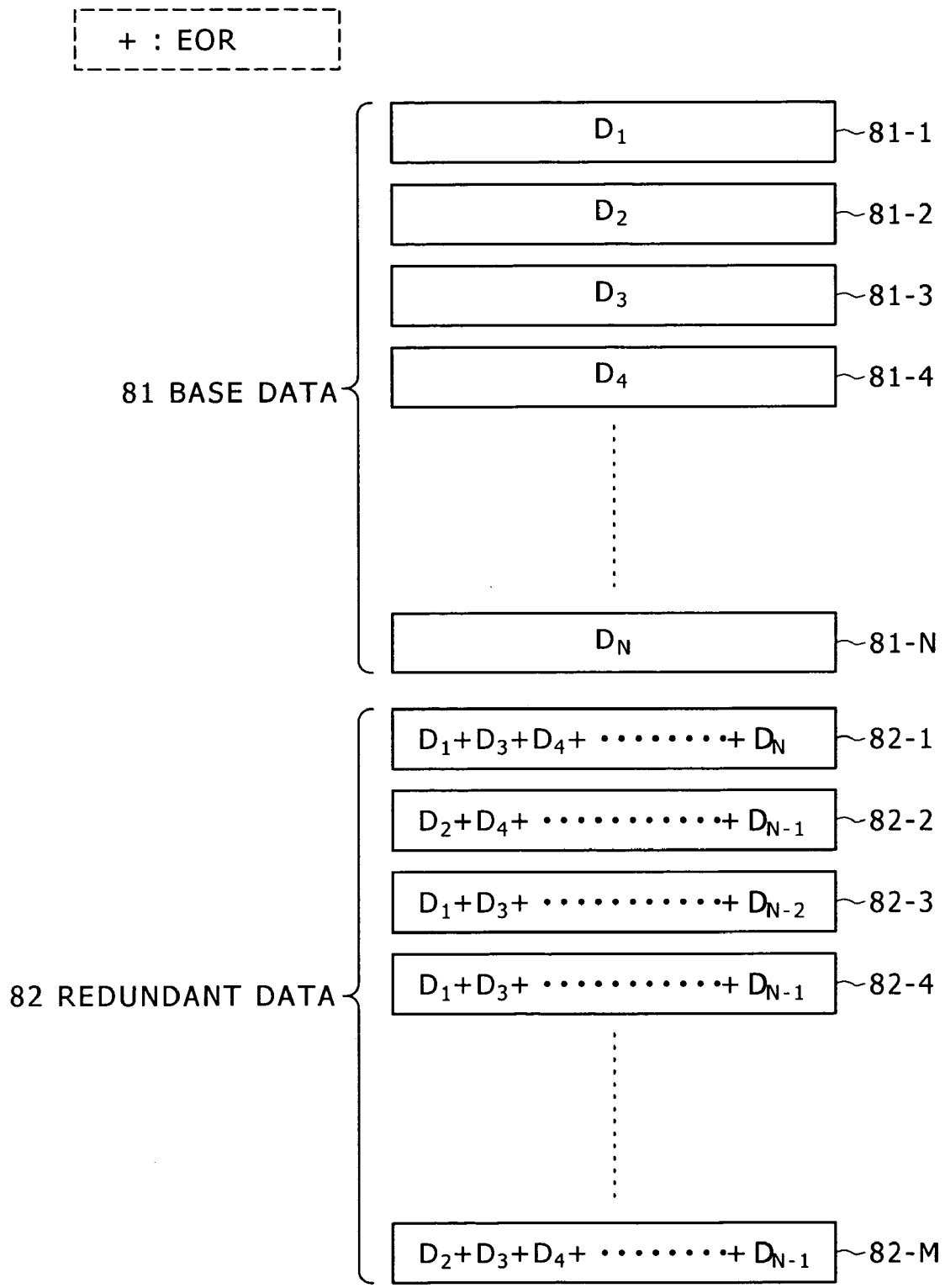
FIG. 6 is a diagrammatic view illustrating an example of a configuration of packet data.

Referring to FIG. 6, base data 81 are formed from packet data 81-1 to 81-N, and redundant data 82 are formed from packet data 82-1 to 82-M. The packet data 81-1 to 81-N of the base data 81 correspond to the base data $D_1$ to $D_N$, respectively, and the packet data 82-1 to 82-M of the redundant data 82 are EOR operation results (exclusive OR results) of the base data selected arbitrarily from among the base data $D_1$ to $D_N$.

The solution outputting section 75 supplies the EOR operation results as redundant data S to the application data production section 34 shown in FIG. 2 at a predetermined timing.

Now, a coefficient matrix used for such EOR operation as described above is described.

Figure 7:
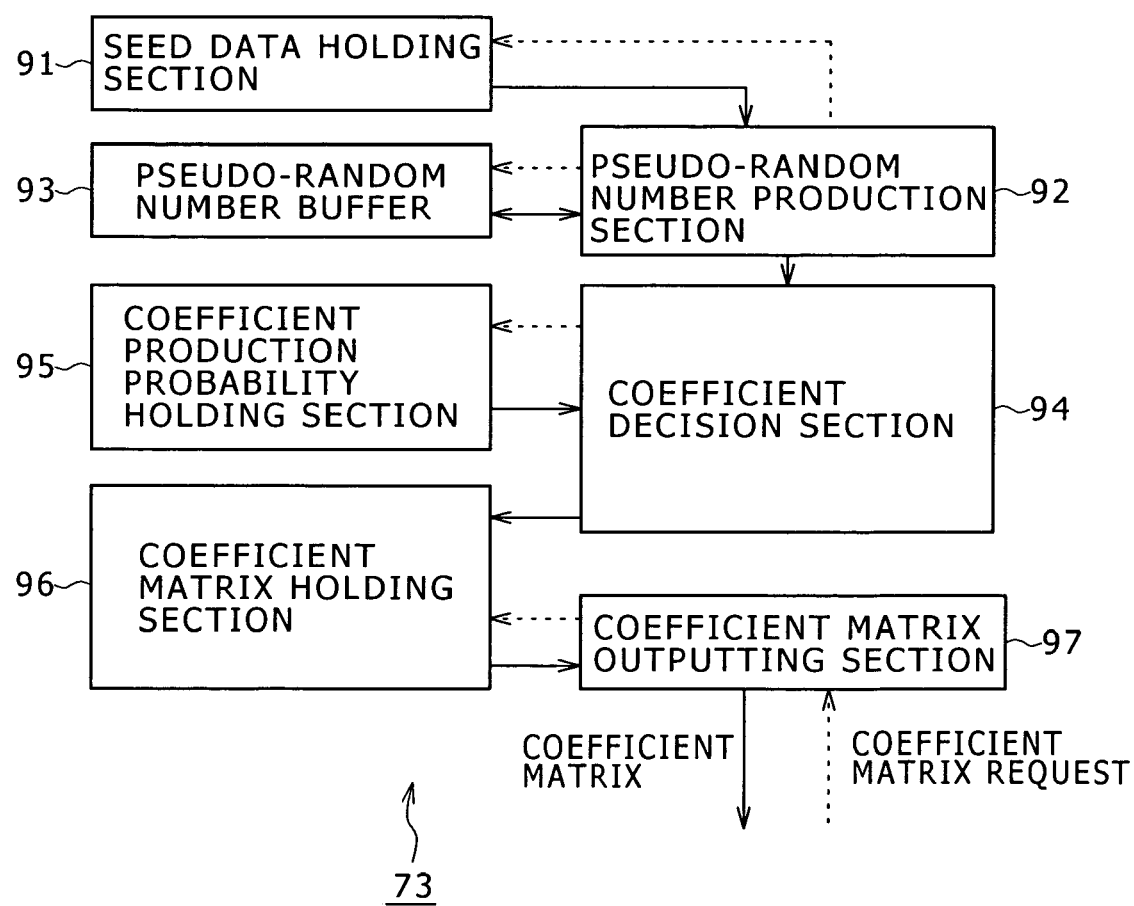
FIG. 7 is a block diagram showing an example of a detailed configuration of a coefficient matrix supplying section shown in FIG. 5.

FIG. 7 shows an example of a detailed configuration of the coefficient matrix supplying section 73 shown in FIG. 5.

Referring to FIG. 7, the coefficient matrix supplying section 73 includes a seed data holding section 91 formed from a storage device such as a RAM and used to hold seed data to be used for generation of a pseudo-random number hereinafter described. It is to be noted that, although any value may be used as the seed data, it is assumed that, in the following description, an arbitrary constant determined in advance is used as the seed data.

A pseudo-random number production section 92 issues a request for the seed data to the seed data holding section 91 (broken line arrow mark in FIG. 7) at a predetermined timing such as, for example, when the power supply is made available. The seed data holding section 91 supplies the seed data to the pseudo-random number production section 92 in accordance with the request. After the pseudo-random number production section 92 acquires the seed data, it performs such modulo arithmetic operation of the linear congruence method as represented by the following expression (2) based on the seed data to generate a pseudo-random number:

$$rand = 1664525L * rand + 1013904223L \quad (2)$$

where the variable L is the seed data and the variable rand on the right side is a pseudo-random number calculated by arithmetic operation in the immediately preceding operation cycle (that is, rand on the left side in the last arithmetic operation). The initial value of the variable rand is "0". The pseudo-random number production section 92 performs the modulo arithmetic operation of the expression (2), for example, by 32-bit arithmetic operation.

After the pseudo-random number production section 92 arithmetically operates the expression (2) to calculate the variable rand (pseudo-random number), it supplies the value to a pseudo-random number buffer 93 so as to be held by the same and further supplies the value to a coefficient decision section 94. The rand held in the pseudo-random number buffer 93 is read out again by the pseudo-random number production section 92 and is substituted into the variable rand on the right side of the expression (2) in and utilized by the pseudo-random number arithmetic operation in the next operation cycle.

The processes described above are repeated until the pseudo-random number production section 92 generates M×N pseudo-random numbers and successively supplies them to the coefficient decision section 94.

The coefficient decision section 94 decides the values of the factors of the coefficient matrix one by one based on the values of the acquired pseudo-random number. At this time, the coefficient decision section 94 sets, for example, a threshold value for the values of the acquired pseudo-random numbers and decides, if the value of an acquired pseudo-random number is equal to or higher than the threshold value, then the coefficient decision section 94 decides that the value of the factor of the coefficient matrix is "1". However, if the value is lower than the threshold value, then the coefficient decision section 94 decides that the value of the factor of the coefficient matrix is "0". Then, the coefficient decision section 94 supplies a result of the decision to a coefficient matrix holding section 96 so as to be held by the same.

Thereupon, the coefficient decision section 94 acquires a coefficient production probability p held by the coefficient production probability holding section 95 and determines the value of the threshold value based on the value of the coefficient production probability p. In particular, the coefficient decision section 94 sets the threshold value so that the ratio of those factors which have the value "1" in all of the factors of the coefficient matrix formed from the values of "0" and "1" may become equal to (approach) the value of the coefficient production probability p.

The coefficient production probability p is a constant determined in advance which is higher than "0" but lower than "1" and stochastically designates what rate the factors which have the value "1" occupy among all factors of the coefficient matrix. In particular, for example, if the value of the coefficient production probability p is "0.5", the coefficient decision section 94 sets the threshold value so that the number of those factors which have the value "0" and the number of those factors which have the value "1" in the generated coefficient matrix may become substantially equal to (approach) 1:1. For example, if it is assumed that the values of the pseudo-random number is distributed at an equal probability to all of 32 bits, the coefficient decision section 94 sets the threshold value to "2147483648".

The decision results ("0" or "1") are supplied one by one from the coefficient decision section 94 to a coefficient matrix holding section 96 in such a manner as described above, and the coefficient matrix holding section 96 produces and holds a coefficient matrix of M rows×N columns whose factors are the decision results.

Then, if a request for a coefficient matrix is received from the determinant production section 72, then a coefficient matrix outputting section 97 issues a request for and acquires the held coefficient matrix to and from the coefficient matrix holding section 96 and supplies the acquired coefficient matrix to the determinant production section 72.

The coefficient matrix supplying section 73 produces a coefficient matrix and supplies the coefficient matrix in response to a request in such a manner as described above.

Figure 8:
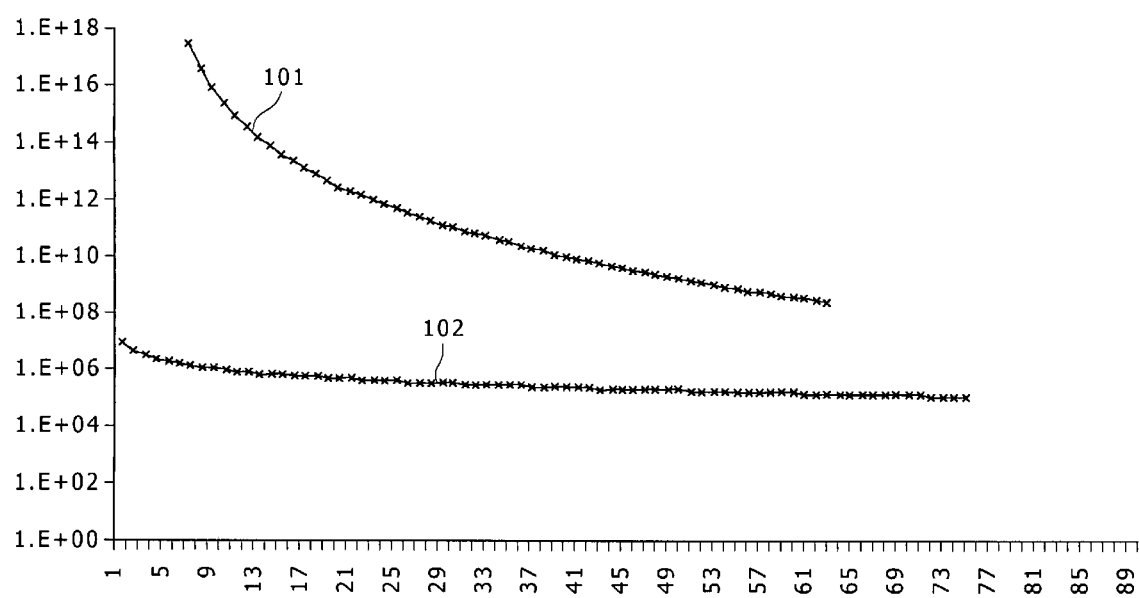
FIG. 8 is a graph illustrating an example of a relationship between a production method of a coefficient matrix and a restoration capacity.

It is to be noted that the coefficient matrix may naturally be calculated at any timing only if it is before a request for a coefficient matrix is received. Further, the coefficient matrix may be common to all blocks or may otherwise be produced for every block so that matrices independent of each other may be applied to the blocks. However, where a coefficient matrix is used commonly to blocks as indicated by a curve 101 in FIG. 8, the restoration capacity on the receiver side is higher than where a coefficient matrix is produced newly for every block as indicated by another curve 102. FIG. 8 is a graph illustrating a relationship of the restoration capacities, and the axis of abscissa represents the number of lost packets and the axis of ordinate represents the restoration capacity (reciprocal to the frequency of impossibility in restoration).

Now, description is given of the application data.

FIG. 9 shows an example of a detailed configuration of the application data production section 34 shown in FIG. 2.

Referring to FIG. 9, before packet data are supplied to the application data production section 34, a base data counter 112, a block counter 113 and a redundant data counter 123 are initialized first. In particular, the count values of the base data counter 112 and the block counter 113 are set to "0" while the count value of the redundant data counter 123 is set to an offset value supplied from an offset value supplying section 122. The offset value supplying section 122 holds a predetermined value such as, for example, the data number of base data in one block as an offset value and supplies the value to the redundant data counter 123 so that the packet number of redundant data may be set so as not to overlap with any packet number of base data.

When base data are supplied from the block dividing section 32, if the base data are the first packet data of a block, then a base data acceptance section 111 causes the base data counter 112 and the block counter 113 to count up. On the other hand, if the base data supplied from the block dividing section 32 are not the first packet data of a block, then the base data acceptance section 111 causes only the base data counter 112 to count up. The base data counter 112 and the block counter 113 supply the count values thereof to a header addition section 114 at a predetermined timing.

Further, the base data acceptance section 111 initializes the count value of the base data counter 112 after the last packet data of a block are processed.

Further, after the counters are adjusted, the base data acceptance section 111 supplies the base data to the header addition section 114. The header addition section 114 adds the count values supplied thereto from the base data counter 112 and the block counter 113 as a header to the base data supplied thereto from the base data acceptance section 111 as seen in FIG. 10A to produce application data.

Referring to FIG. 10A, the application data 131 include a block number 132 and an base data packet number 133 added as a header and base data 134. The block number 132 is a number for identification of the block, and values different from one another are allocated to different blocks. The value of the block number 132 is the count value supplied from the block counter 113. The base data packet number 133 is a number for identification of the base data, and values different from one another are allocated to different base data. The value of the base data packet number 133 is the count value supplied from the base data counter 112. In particular, as seen from a table 151 shown in FIG. 11, in one block, the value ("0" in FIG. 11) of the block number 132 is common to the application data, and the value of the base data packet number 133 increases one by one (in FIG. 11, "0" to "999").

Such a header as described above is added to the base data 134 to produce the application data 131. It is to be noted that the block number 132 is information for specifying to which block the packet data acquired by the reception apparatus 13 belong (to which block data the packet data correspond), and the base data packet number 133 is information for specifying a packet decided as the lost packet by the reception apparatus 13. Since such information is added to the packet data to produce application data, the reception apparatus 13 can refer to the information in a process of the application layer. Further, although a packet number is added also to an IP packet and so forth, this is information for use for re-sending control and so forth but cannot be utilized for a restoration process and so forth of data and is different in application and characteristic from the information described above.

Referring back to FIG. 9, a redundant data acceptance section 121 causes the redundant data counter 123 to count up when redundant data are supplied thereto from the redundant data production section 33. The redundant data counter 123 and the block counter 113 supply the count values thereof to the header addition section 114 at a predetermined timing.

Further, the redundant data acceptance section 121 initializes the count value of the redundant data counter 123, the offset value supplying section 122 supplies the offset value to the redundant data counter 123.

Further, the redundant data acceptance section 121 supplies redundant data to the header addition section 114 after the redundant data counter 123 is adjusted. The header addition section 114 adds the count values supplied thereto from the redundant data counter 123 and the block counter 113 as a header to the redundant data supplied thereto from the redundant data acceptance section 121 as seen in FIG. 10B to produce application data.

Referring to FIG. 10B, the application data 141 include a block number 142 and a redundant data packet number 143 added as a header and redundant data 144. The block number 142 is the count value supplied from the block counter 113. The redundant data packet number 143 is a number for identification of the redundant data, and values different from one another are allocated to different redundant data. The value of the redundant data packet number 143 is the count value supplied from the redundant data counter 123. In particular, as seen from the table 151 shown in FIG. 11, in one block, the value ("0" in FIG. 11) of the block number 142 is common to the application data, and the value of the redundant data packet number 143 increases one by one (in FIG. 11, "1000" to "1099"). In the case of FIG. 11, since the number of base data per one block is set to 1,000, the offset value is set to "1000".

Such a header as described above is added to the redundant data 144 to produce the application data 141. It is to be noted that the block number 142 is information for specifying to which block the packet data acquired by the reception apparatus 13 belong, and the redundant data packet number 143 is information for aligning the packet acquired by the reception apparatus 13. Since such information is added to the packet data to produce application data, the reception apparatus 13 can refer to the information in a process of the application layer. Further, although a packet number is added also to an IP packet and so forth, this is information for use for re-sending control and so forth but cannot be utilized for a restoration process and so forth of data and is different in application and characteristic from the information described above.

As described above, application data include either base data or redundant data. The application data are packetized based on the UDP, the IP or the like as described above and supplied to the reception apparatus 13 through the network.

Where the application data production section 34 adds a block number to base data or redundant data in this manner, the reception apparatus 13 can identify a block of received data and process the received data in a unit of a block as hereinafter described.

Further, since the application data production section 34 adds a base data packet number for each base data, the reception apparatus 13 can specify lost base data (which the reception apparatus 13 has failed to receive) based on the packet number as hereinafter described.

Furthermore, since the application data production section 34 adds a base data packet number to each base data and adds a redundant data packet number to each redundant data, the reception apparatus 13 can align the redundant data and can cut out, when to restore base data, a necessary portion readily and accurately from a coefficient matrix of M rows and N columns prepared in advance, a determinant for restoring the base data can be produced readily and accurately.

Now, the receiver side of data is described.

Figure 12:
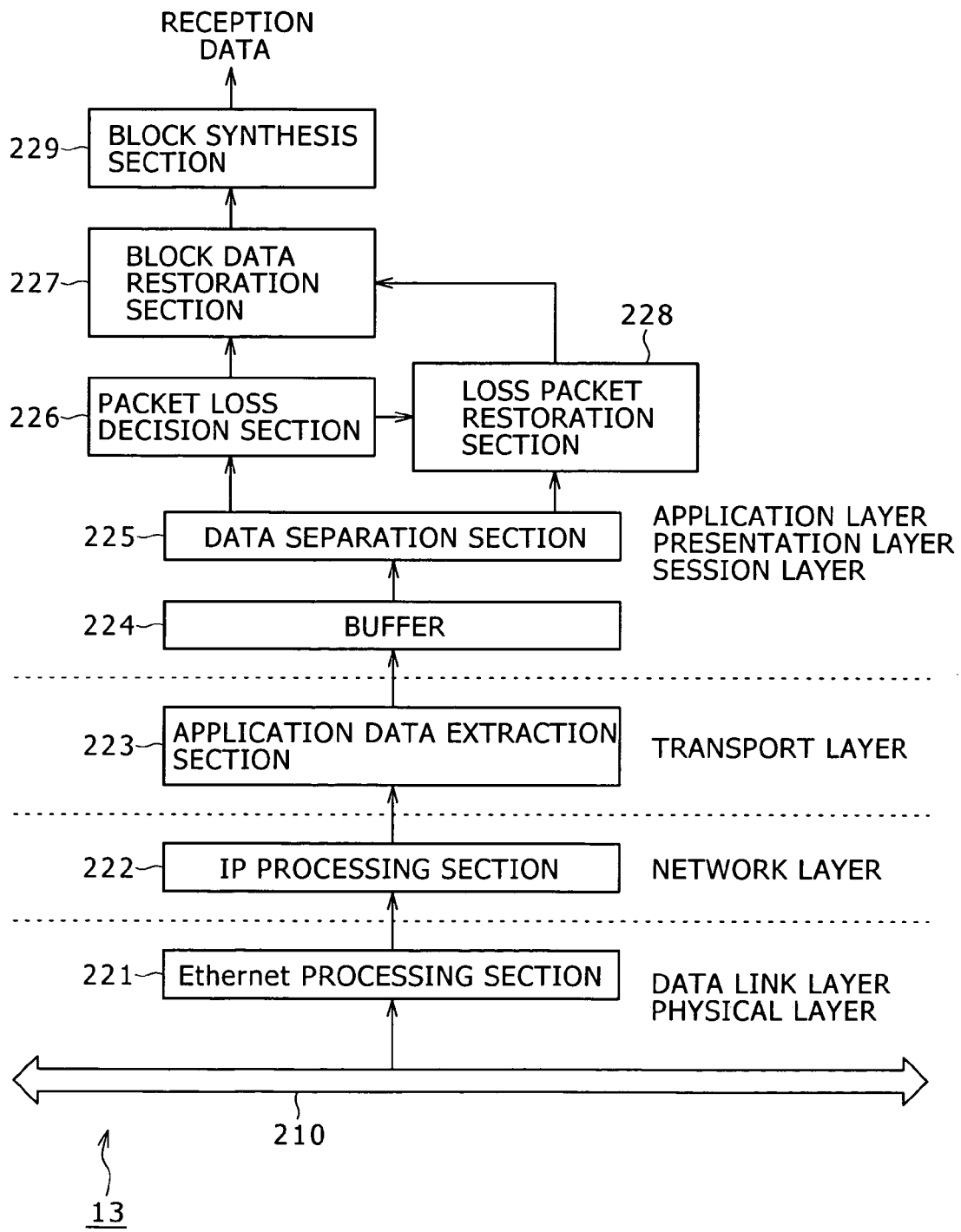
FIG. 12 is a block diagram showing an example of a configuration of a reception apparatus shown in FIG. 1.

FIG. 12 shows an example of a detained configuration of the reception apparatus 13 shown in FIG. 1.

A packet supplied to the reception apparatus 13 through the network 12 is supplied to an Ethernet (R) processing section 221 through a cable 210. The Ethernet (R) processing section 221 performs processes of the data link layer and the physical layer based on the Ethernet (R) standards to extract an IP packet from the packet supplied thereto, and supplies the IP packet to an IP processing section 222.

The IP processing section 222 performs a process of the network layer based on the IP protocol to extract a UDP packet from the IP packet supplied thereto, and supplies the UDP packet to an application data extraction section 223. The application data extraction section 223 performs a process of the transport layer based on the UDP protocol to extract application data from the UDP packet, and supplies the application data to a buffer 224.

The buffer 224 holds the application data and manages the application data in a unit of a block based on the block number added to the application data. Then, the buffer 224 supplies the application data to a data separation section 225 for each block.

The data separation section 225 classifies the application data supplied thereto depending upon whether the application data contain base data or redundant data based on the packet number added to the application data. Then, the data separation section 225 supplies application data containing base data to a packet loss decision section 226 and supplies application data containing redundant data to a loss packet restoration section 228.

Figure 13:
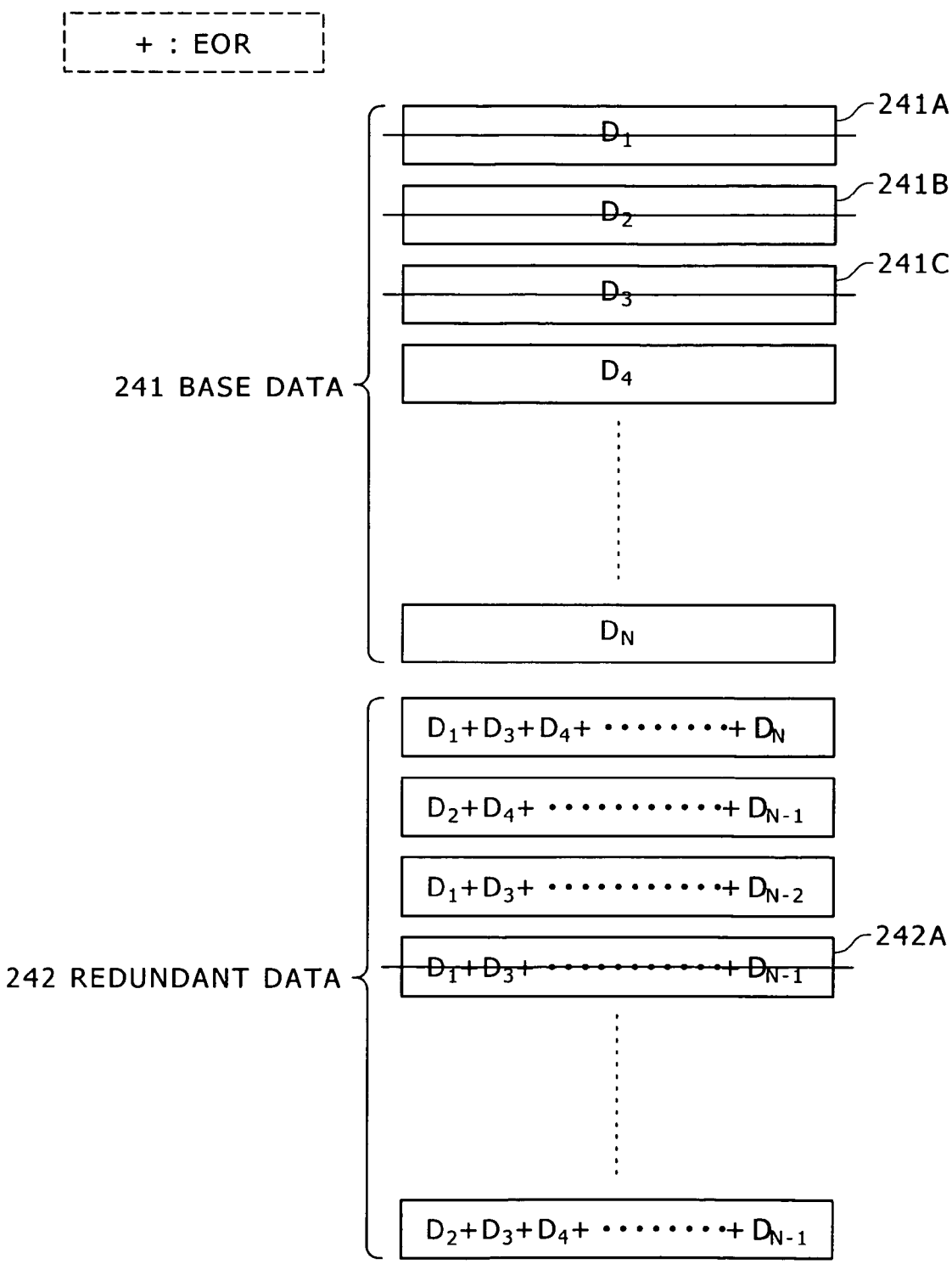
FIG. 13 is a diagrammatic view illustrating a manner wherein a packet is lost.

Although a packet transmitted from the transmission apparatus 11 is transmitted toward the reception apparatus 13, sometimes it is not received by the reception apparatus 13 from various causes. Accordingly, the reception apparatus 13 sometimes fails to receive some of packets which form one block as seen in FIG. 13. In FIG. 13, three packet data 241A to 241C of base data 241 and one packet data 242A of redundant data 242 supplied from the transmission apparatus 11 are lost and not received by the reception apparatus 13. In such an instance, the reception apparatus 13 cannot restore the block data only using the base data 241 received successfully because of absence of the base data $D_1$ to $D_3$. Therefore, in such an instance, the reception apparatus 13 uses the redundant data 242 received successfully to restore the lost packet data 241A to 241C.

The packet loss decision section 226 decides based on the packet numbers of the base data supplied thereto whether or not a packet is lost. If the packet loss decision section 226 decides that a packet is lost, then it supplies the application data including the base data to the block data restoration section 227, also at the same time, along with the decision results, the packet loss decision section 226 supplies the application data including the base data to the loss packet restoration section 228. On the other hand, if no packet is lost, then the packet loss decision section 226 supplies the application data including the base data to a block data restoration section 227.

The block data restoration section 227 synthesizes the base data of the application data supplied thereto from the packet loss decision section 226 to restore the block data. On the other hand, if the reception apparatus 13 decides loss of a packet and decides shortage of base data, then it uses the base data restored by the loss packet restoration section 228. After the block data restoration section 227 restores the block data, it supplies the block data to a block synthesis section 229.

The loss packet restoration section 228 performs EOR operation using the application data supplied thereto from the packet loss decision section 226 and containing the base data and the application data supplied thereto from the data separation section 225 and containing the redundant data to solve a determinant to restore the lost base data. Then, the loss packet restoration section 228 supplies the restored base data to the block data restoration section 227.

The block synthesis section 229 temporarily holds the block data supplied thereto from the block data restoration section 227 and combines blocks by adjusting timings at which the block data are to be outputted to produce a single series of continuous reception data (that is, transmission data of the transmission apparatus 11). Then, the block synthesis section 229 outputs the reception data to the outside of the reception apparatus 13.

It is to be noted that the processes executed by the buffer 224 and succeeding components described above are processes of the application layer, presentation layer and session layer of the OSI layer model.

Since the reception apparatus 13 receives data and restores lost base data by EOR operation in this manner, it can implement a high-speed restoration process of a high restoration performance without increasing the production cost and can receive data with a high degree of accuracy.

Now, restoration of a lost packet is described. It is to be noted that the following description is given of a case wherein K base data and L redundant data are lost from among N base data and M redundant data S transmitted from the transmission apparatus 11, respectively.

Figure 14:
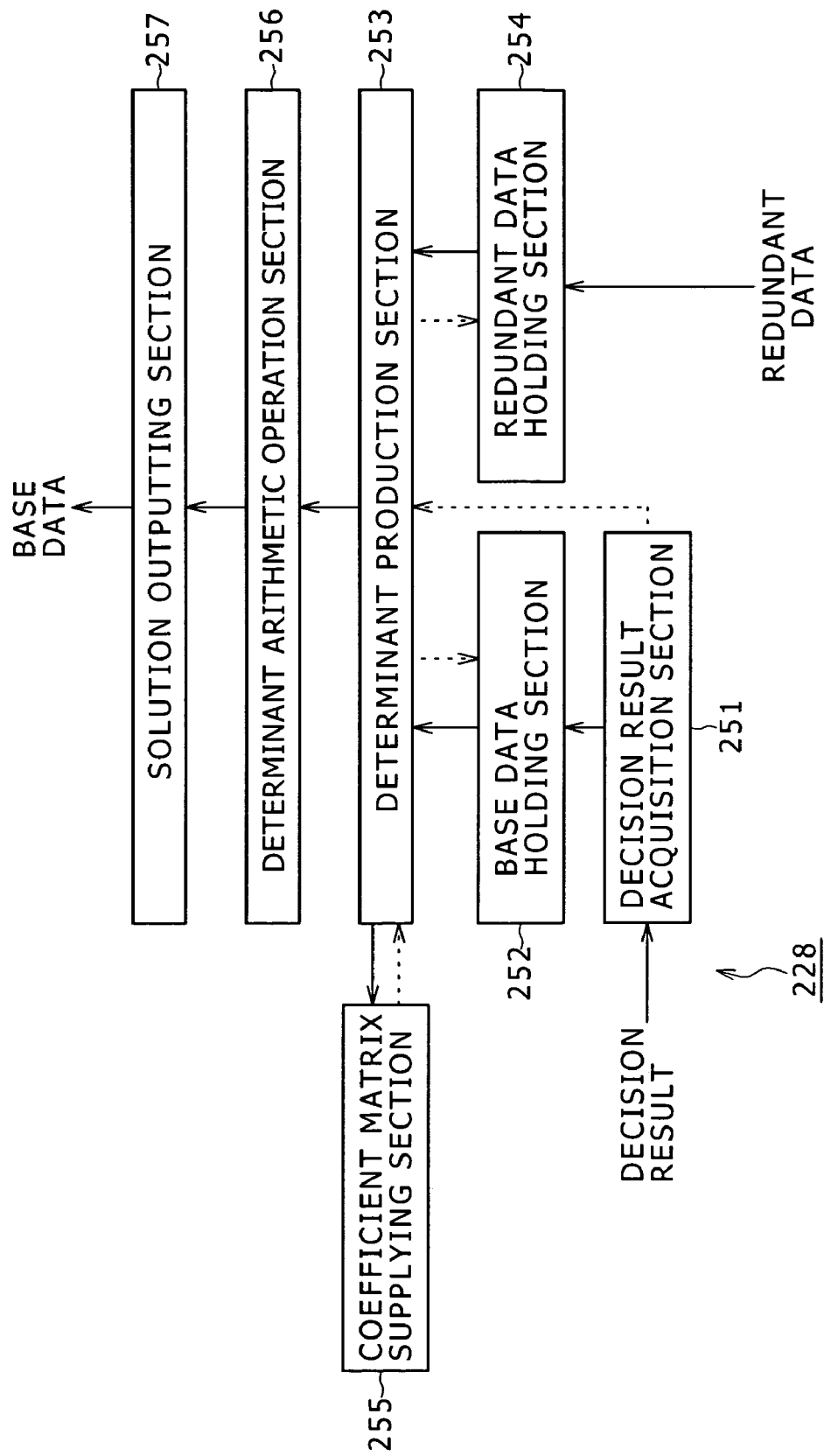
FIG. 14 is a block diagram showing an example of a detailed configuration of a packet restoration section shown in FIG. 12.

FIG. 14 shows an example of a detailed configuration of the loss packet restoration section 228.

Referring to FIG. 14, decision results supplied from the packet loss decision section 226 of FIG. 12 and application data of base data are supplied to a decision result acquisition section 251. After the information is acquired, the decision result acquisition section 251 supplies the application data of the base data to a base data holding section 252 and supplies, based on the decision results, an instruction to reproduce a determinant to a determinant production section 253.

Meanwhile, application data of redundant data supplied from the data separation section 225 of FIG. 12 are supplied to and temporarily held by a redundant data holding section 254.

After the determinant production section 253 receives the instruction to produce a determinant from the decision result acquisition section 251, it issues a request for and acquires base data to and from the base data holding section 252. Further, the determinant production section 253 issues a request for and acquires redundant data to and from the redundant data holding section 254 and further issues a request for and acquires a coefficient matrix to and from a coefficient matrix supplying section 255. It is to be noted that the coefficient matrix supplying section 255 has a configuration basically similar to that of the coefficient matrix supplying section 73 shown in FIG. 7 and operates similarly. Therefore, detailed description of the coefficient matrix supplying section 255 is omitted herein to avoid redundancy.

After the information mentioned above is received, the determinant production section 253 produces a determinant for calculating redundant data Q for arithmetic operation necessary for a determinant for arithmetic operation of lost base data. Lost base data are determined using received base data and redundant data as hereinafter described. However, since the received redundant data sometimes include also information of the received base data, the information of the received base data are substituted into the received redundant data at a first stage to produce redundant data Q for arithmetic operation formed only from EOR operation results of the lost base data. The determinant production section 253 produces the following expression (3) in order to produce the redundant data Q for arithmetic operation:

$$\begin{bmatrix} Q_1 \\ Q_2 \\ \vdots \\ \vdots \\ Q_{M-L} \end{bmatrix} = \begin{bmatrix} 1 & 0 & 1 & \cdots & \cdots & 1 \\ 0 & 1 & 1 & \cdots & \cdots & 0 \\ \vdots & \vdots & \vdots & \ddots & & \vdots \\ \vdots & \vdots & \vdots & & \ddots & \vdots \\ 1 & 1 & 0 & \cdots & \cdots & 0 \end{bmatrix} \times \begin{bmatrix} R_1 \\ R_2 \\ \vdots \\ \vdots \\ R_{N-K} \end{bmatrix} + \begin{bmatrix} J_1 \\ J_2 \\ \vdots \\ \vdots \\ J_{M-L} \end{bmatrix} \quad (3)$$

It is to be noted that, in the expression (3) above, the addition represents EOR operation. The factors $Q_1$ to $Q_{M-L}$ of the matrix on the left side of the expression (3) are redundant data for arithmetic operation corresponding to the received redundant data $J_1$ to $J_{M-L}$ which are factors of the matrix of the third term on the right side, respectively. The factors $R_1$ to $R_{N-K}$ of the matrix of the second term on the right side of the expression (3) represent the received base data. The coefficient matrix of the first term on the right side is a coefficient matrix of M-L rows and N-K columns cut out from the coefficient matrix of M rows and N columns produced by the coefficient matrix supplying section 255 in advance.

The determinant production section 253 aligns the received redundant data $J_1$ to $J_{M-L}$ based on the redundant data packet numbers and aligns the received base data $R_1$ to $R_{N-K}$ based on the base data packet numbers. Further, the determinant production section 253 cuts out, from the coefficient matrix of M rows and N columns held by the coefficient matrix supplying section 255, the factors of a portion corresponding to the received base data $R_1$ to $R_{N-K}$ and the received redundant data $J_1$ to $J_{M-L}$ to produce the expression (3).

As seen from the expression (3), the redundant data $Q_1$ to $Q_{M-L}$ for arithmetic operation are results of removal of the EOR operation results of the received base data $R_1$ to $R_{N-K}$ from the received redundant data $J_1$ to $J_{M-L}$, respectively. It is to be noted that, since the redundant data are EOR operation results of the base data, the information of the received base data included in the received redundant data J can be removed by performing EOR operation of the received base data R again.

In other words, the redundant data $Q_1$ to $Q_{M-L}$ for arithmetic operation determined in such a manner as described above make EOR operation results of the lost base data $P_1$ to $P_K$, respectively.

After such a determinant as described above is produced, the determinant production section 253 supplies the determinant to a determinant arithmetic operation section 256. The determinant arithmetic operation section 256 arithmetically operates the determinant to calculate redundant data Q for arithmetic operation and returns the redundant data Q for arithmetic operation to the determinant production section 253. After the determinant production section 253 acquires the redundant data Q for arithmetic operation, it now uses the redundant data Q for arithmetic operation to produce a determinant for restoration of the base data. The determinant production section 253 cuts out, based on the packet numbers of the received redundant data and the packet numbers of the lost base data, a portion (M-L rows and K columns) corresponding to the packet numbers from the coefficient matrix of M rows and N columns held in the coefficient matrix supplying section 255 and produces such a determinant as given by the following expression (4):

$$\begin{bmatrix} 0 & 0 & 1 & \cdots & \cdots & 1 \\ 0 & 1 & 0 & \cdots & \cdots & 1 \\ \vdots & \vdots & \vdots & \ddots & & \vdots \\ \vdots & \vdots & \vdots & & \ddots & \vdots \\ 1 & 0 & 0 & \cdots & \cdots & 1 \end{bmatrix} \times \begin{bmatrix} P_1 \\ P_2 \\ \vdots \\ \vdots \\ P_K \end{bmatrix} = \begin{bmatrix} Q_1 \\ Q_2 \\ \vdots \\ \vdots \\ Q_{M-L} \end{bmatrix} \quad (4)$$

where the first term on the left side is the cut out coefficient matrix and the factors of the matrix of the second term on the left side are the lost data $P_1$ to $P_K$ while the factors of the matrix on the right side are the redundant data Q1 to QM-L for arithmetic operation.

It is to be noted that the value of M-L representative of the number of the redundant data $Q_1$ to $Q_{M-L}$ for arithmetic operation must be higher than the value of K which indicates the number of the lost base data. Particularly it is necessary for the coefficient matrix in the expression (4) to have the number of rows more than the number of columns. In other words, in order to restore all of the lost base data, it is at least necessary for the reception apparatus 13 to receive a number of redundant data greater than the number of the lost base data.

After such a determinant as given by the expression (4) above is produced, the determinant production section 253 supplies the determinant to the determinant arithmetic operation section 256. After the determinant is acquired, the determinant arithmetic operation section 256 uses, for example, the Gaussian elimination to determine solutions to the lost base data $P_1$ to $P_K$. Although an example of the solution determination method is hereinafter described, any method may be used only if it can calculate lost base data.

After the solutions to the lost base data $P_1$ to $P_K$ are determined, the determining arithmetic operation section 256 supplies the solutions to a solution outputting section 257. The solution outputting section 257 uses the solutions to restore the application data of the lost base data and supplies the restored application data to the block data restoration section 227 shown in FIG. 12.

Where the reception process is performed in such a manner as described above, the reception apparatus 13 can restore lost base data without issuing a re-sending request to the transmission apparatus 11. Further, since redundant data for the restoration process are produced by EOR operation, the load of arithmetic operation is moderated and it is possible to reproduce redundant data readily or perform a restoration process using the redundant data. Accordingly, a high-speed restoration process of a high restoration performance can be implemented without increasing the production cost of the transmission apparatus 11 and communication with a high degree of accuracy can be achieved readily.

Now, flows of processing of the components of the transmission apparatus 11 described hereinabove are described.

After supply of transmission data from the outside is started, the transmission apparatus 11 starts a data transmission process. The data transmission process of the transmission apparatus 11 shown in FIG. 2 is described below with reference to a flow chart of FIG. 15.

First, when transmission data are supplied from the outside, the data dividing section 31 of the transmission apparatus 11 divides the transmission data into blocks and supplies the divided block data to the block dividing section 32 at step S1. Then at step S2, the block dividing section 32 further divides the block data supplied thereto into packet data and supplies the packet data as base data to the redundant data production section 33 and the application data production section 34. It is to be noted that the following processes are executed in a unit of a block.

The redundant data production section 33 to which the packet data are supplied executes a redundant data production process to produce redundant data by EOR operation and supplies the redundant data to the application data production section 34 at step S3. Details of the redundant data production process are hereinafter described with reference to a flow chart of FIG. 16.

At step S4, the application data production section 34 to which the base data and the redundant data are supplied executes an application data production process to produce application data and supplies the produced application data to the UDP packetization section 35. It is to be noted that details of the application data production process is hereinafter described with reference to a flow chart of FIG. 18.

At step S5, the UDP packetization section 35 to which the application data are supplied converts the application data into UDP packets and supplies the UDP packets to the buffer 36. The buffer 36 temporarily holds the UDP packets supplied thereto, and at step S6, the output control section 37 extracts the UDP packets held in the buffer 36 in an arbitrary order to change the transmission order of the UDP packets. The output control section 37 supplies the extracted UDP packets to the IP processing section 38. At step S7, the IP processing section 38 converts the UDP packets supplied thereto into IP packets and supplies the IP packets to the Ethernet (R) processing section 39. The Ethernet (R) processing section 39 further converts the IP packets supplied thereto into packets or the like, and transmits the packets (individually including the UDP packets) in the order changed by the output control section 37 to the network 12 (reception apparatus 13) through the cable 40.

Then, the block dividing section 32 decides at step S8 whether or not the process is completed for all of the blocks which form the transmission data supplied to the transmission apparatus 11 from the outside. If the block dividing section 32 decides that the transmission process for all blocks is not completed as yet, then the block dividing section 32 returns the processing to step S2 so that the processes at the steps beginning with the step S2 are repeated for a next block.

The data transmission process is executed in such a manner as described above. Consequently, the transmission apparatus 11 can produce redundant data at a high speed and transmit data readily and accurately without performing a process of a heavy load such as arithmetic operation of a Galois field. Further, since the transmission apparatus 11 can shuffle packet data to change the transmission order of the packet data and transmit the packet data in an order independent of the packet numbers, also the withstanding property against burst packet loss can be enhanced. Further, since the transmission apparatus 11 performs the transmission process in this manner, the reception apparatus 13 which receives the packets transmitted from the transmission apparatus 11 can implement a high-speed restoration process of a high restoration performance without increasing the production cost. In other words, the communication system 1 can perform communication of a higher degree of accuracy readily.

Figure 16:
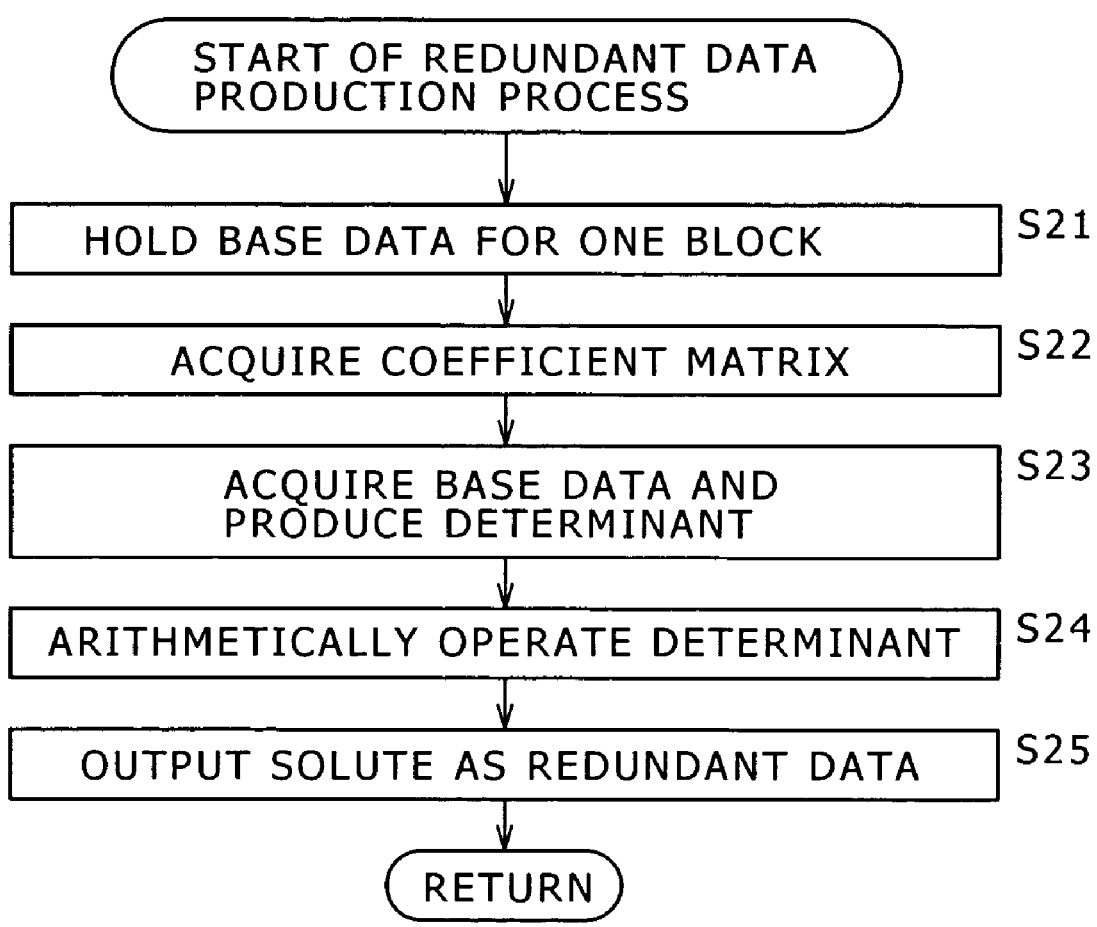
FIG. 16 is a flow chart illustrating an example of a redundant data production process.

Now, the redundant data production process executed at step S3 of FIG. 15 is described with reference to a flow chart of FIG. 16.

The base data holding section 71 of the redundant data production section 33 to which the base data are supplied from the block dividing section 32 temporarily holds the received base data until the base data are accumulated for one block at step S21.

After the base data for one block are held by the base data holding section 71, the determinant production section 72 issues a request for a coefficient matrix to the coefficient matrix supplying section 73 at step S23. The coefficient matrix supplying section 73 supplies a coefficient matrix prepared in advance to the determinant production section 72 in accordance with the request. The preparation process of the coefficient matrix is hereinafter described with reference to a flow chart of FIG. 17.

After the determinant production section 72 acquires the coefficient matrix, it acquires, at step S23, the base data for one block held by the base data holding section 71 and produces a determinant for production of redundant data by EOR operation of arbitrary base data like the expression (1). After the determinant production section 72 produces the determinant, it supplies the determinant to the determinant arithmetic operation section 74.

The determinant arithmetic operation section 74 to which the determinant is supplied performs, at step S24, EOR operation and arithmetically operates the determinant to obtain solutions, and supplies the solutions to the solution outputting section 75.

The solution outputting section 75 outputs, at step S25, the solutions supplied thereto as redundant data for a loss packet restoration process to the application data production section 34. Then, the processing is returned to step S4 of FIG. 15 so that the processes at the steps beginning with step S4 are executed.

Since base data are used to perform EOR operation to produce redundant data in such a manner as described above, the redundant data production section 33 can produce redundant data readily at a high speed. Consequently, the transmission apparatus 11 can produce redundant data at a high speed without performing a process of a high load such as arithmetic operation of a Galois field, and can transmit data readily and accurately. Further, since the transmission apparatus 11 performs a transmission process in this manner, the reception apparatus 13 which receives packets transmitted from the transmission apparatus 11 can implement a high-speed restoration process of a high restoration performance without increasing the production cost. In other words, the communication system 1 can perform communication readily with a higher degree of accuracy.

Figure 17:
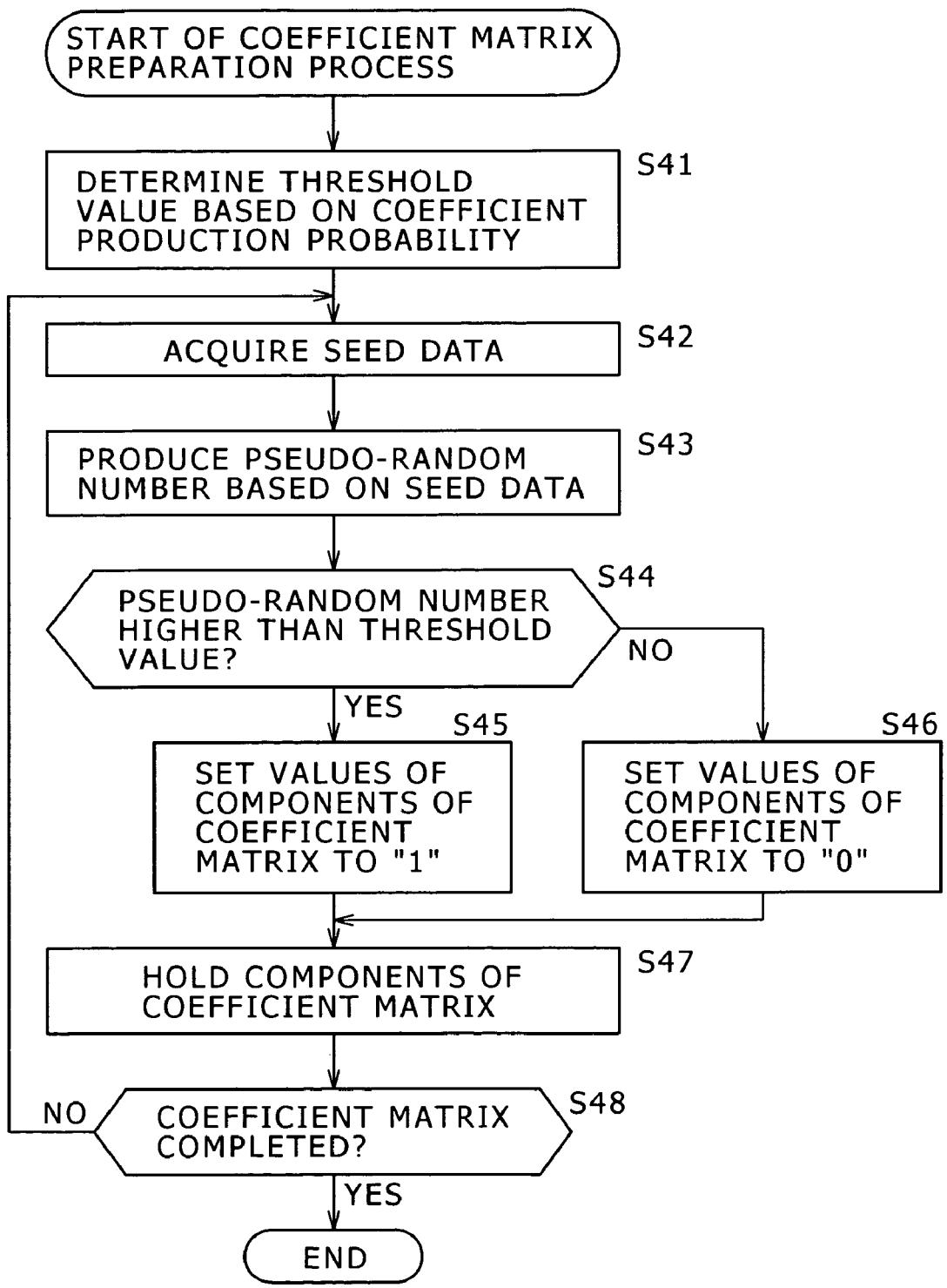
FIG. 17 is a flow chart illustrating an example of a coefficient matrix preparation process.

Now, the coefficient matrix preparation process executed by the coefficient matrix supplying section 73 of FIG. 7 is described with reference to a flow chart of FIG. 17. The coefficient matrix supplying section 73 executes the coefficient matrix preparation process, for example, when the power supply to the transmission apparatus 11 is made available.

The coefficient decision section 94 of the coefficient matrix supplying section 73 which starts the coefficient matrix preparation process acquires, first at step S41, a coefficient production probability p from the coefficient production probability holding section 95 and sets a threshold value for determination of the value of the coefficient based on the acquired coefficient production probability p.

Then at step S42, the pseudo-random number production section 92 acquires the seed data held in the seed data holding section 91 and acquires a pseudo-random number which is a result of arithmetic operation in the preceding cycle held in the pseudo-random number buffer 93. Then at step S43, the pseudo-random number production section 92 produces a pseudo-random number by such a linear congruence method as represented by the expression (2) given hereinabove based on the acquired seed data. The pseudo-random number production section 92 supplies the pseudo-random number produced thereby to the pseudo-random number buffer 93 so as to be held by the pseudo-random number buffer 93 and supplies the pseudo-random number also to the coefficient decision section 94.

At step S44, the coefficient decision section 94 decides whether or not the value of the pseudo-random number supplied thereto is equal to or higher than the threshold value set at step S41. If it is decided that the value of the pseudo-random number is equal to or higher than the threshold value, then the coefficient decision section 94 set the value of the factor of the coefficient matrix to be outputted in the present cycle to "1" at step s45 and outputs the factor to the coefficient matrix holding section 96. Thereafter, the processing is advanced to step S47. On the contrary if it is decided at step S44 that the value of the pseudo-random number supplied is lower than the threshold value, then the coefficient decision section 94 advances the processing to step S46, at which it sets the value of the factor of the coefficient matrix to be outputted in the present cycle to "0" and outputs the factor to the coefficient matrix holding section 96. Thereafter, the processing advances to step S47.

At step S47, the coefficient matrix holding section 96 to which the factor of the coefficient matrix is supplied holds the factor of the coefficient matrix. Then, at step S48, the coefficient matrix holding section 96 decides from the factors held therein whether or not the coefficient matrix is completed. If it is decided that the coefficient matrix is not completed, then the processing returns to step S42 so that the processes at the steps beginning with step S42 are executed by the pertaining sections before a next factor is supplied.

If it is decided at step S48 that all factors are supplied and the coefficient matrix is completed, then the coefficient matrix holding section 96 ends the coefficient matrix preparation process.

The coefficient matrix thus produced and held in coefficient matrix holding section 96 is requested from the coefficient matrix outputting section 97 which is requested from the determinant production section 72 to be output.

Since a pseudo-random number is used to determine the value of each factor of a coefficient matrix in such a manner as described above, the redundant data production section 33 can produce redundant data using base data selected at random from among the base data for one block. Consequently, one-sidedness of the distribution of base data to be used for production of redundant data can be suppressed. Accordingly, in the restoration process of the reception apparatus 13, dependency of the possibility of base data restoration upon the contents of lost redundant data can be suppressed. Further, through such processes as described above, the coefficient decision section 94 can stochastically control the number of base data to be included in redundant data with the coefficient production probability p.

Now, details of the application data production process executed at step S4 of FIG. 15 are described with reference to a flow chart of FIG. 18.

Before packet data are supplied such as, for example, when the power supply is made available, the base data acceptance section 111 of the application data production section 34 initializes the base data counter 112 and the block counter 113 so that they individually have, for example, the value "0" at step S61. Also the redundant data acceptance section 121 of the application data production section 34 initializes the redundant data counter 123 so that the count value of the redundant data counter 123 is set to an offset value supplied from the offset value supplying section 122.

At step S62, the base data acceptance section 111 decides whether or not base data are accepted. If it is decided that base data supplied from the block dividing section 32 are accepted, then the processing advances to step S63, at which it is decided whether or not the accepted base data are the first packet data in a block. If it is decided that the accepted base data are the first packet data of a block, then the base data acceptance section 111 advances the processing to step S64, at which it causes the block counter 113 to count up so that the count value of the block counter 113 is incremented by "1". Thereafter, the processing advances to step S65. It is to be noted that, if it is decided at step S63 that base data of the block have been accepted already and the accepted data are not the first packet of a block, then the base data acceptance section 111 bypasses the step S64 and advances the processing directly to step S65.

At step S65, the base data acceptance section 111 causes the base data counter 112 to count up so that the count value of the base data counter 112 is incremented by "1", and supplies the accepted base data to the header addition section 114. The header addition section 114 to which the base data are supplied acquires, at step S66, the count value from each of the base data counter 112 and the block counter 113 and adds the count value of the block counter 113 as the block number and the count value of the base data counter 112 as the base data packet number to the base data. Then, at step S67, the header addition section 114 supplies the base data to which the count values are added as application data to the UDP packetization section 35.

After the process at step S67 is ended, the header addition section 114 advances the processing to step S68. On the other hand, if it is decided at step S62 that base data are not accepted, then the base data acceptance section 111 bypasses the steps S63 to S67 and advances the processing directly to step S68.

At step S68, the redundant data acceptance section 121 decides whether or not redundant data are accepted. If it is decided that redundant data supplied from the redundant data production section 33 are accepted, then the processing advances to step S69, at which the redundant data acceptance section 121 causes the redundant data counter 123 to count up so that the count value of the redundant data counter 123 is incremented by "1" and supplies the accepted redundant data to the header addition section 114. The header addition section 114 to which the redundant data are supplied acquires, at step S70, the count value from each of the block counter 113 and the redundant data counter 123 and adds the count value of the block counter 113 as the block number and the count value of the redundant data counter 123 as the redundant data packet number to the redundant data. Then at step S71, the header addition section 114 supplies the redundant data to which the count values are added as application data to the UDP packetization section 35.

After the process at step S71 is ended, the header addition section 114 advances the processing to step S72. On the other hand, if it is decided at step S68 that redundant data are not accepted, then the redundant data acceptance section 121 bypasses the steps S69 to S71 and advances the processing directly to step S72.

At step S72, the header addition section 114 decides whether or not all of the base data and the redundant data of the block are processed. If it is decided that some packet data have not been processed as yet, then the processing returns to step S62 so that the processes at the steps beginning with step S62 are repeated. If it is decided at step S72 that all packet data are processed, then the header addition section 114 ends the application data production process and returns the processing to step S5 of FIG. 15.

Since the header addition section 114 of the application data production section 34 adds block numbers to base data and redundant data in such a manner as described above, the reception apparatus 13 can identify a block of received data and process the received data in a unit of a block.

Further, since the header addition section 114 adds a base data packet number to each base data, the reception apparatus 13 can specify lost base data (data which the reception apparatus 13 fails to receive) based on the packet numbers as hereinafter described.

Further, since the header addition section 114 adds a redundant data packet number to each redundant data, the reception apparatus 13 can align the redundant data when to restore the base data as hereinafter described, a determinant to be used for restoration of the base data can be produced readily and accurately.

Furthermore, since the header addition section 114 adds a base data packet number to each base data and adds a redundant data packet number to each redundant data, when the reception apparatus 13 tries to restore the base data, it can cut out a necessary portion from a coefficient matrix of M rows and N columns prepared in advance readily and accurately. Consequently, a determinant for restoration of the base data can be produced readily and accurately.

Now, a flow of processes executed by the reception apparatus 13 is described.

First, a data reception process of the reception apparatus 13 of FIG. 12 is described with reference to a flow chart of FIG. 19.

When a packet is transmitted from the transmission apparatus 11 to the reception apparatus 13 and supplied to the Ethernet (R) processing section 221 through the cable 210, the Ethernet (R) processing section 221 receives the packet at step S91. After the Ethernet (R) processing section 221 receives the packet, it extracts an IP packet from the packet and supplies the IP packet to the IP processing section 222. The IP processing section 222 extracts a UDP packet from the IP packet and supplies the UDP packet to the application data extraction section 223.

The application data extraction section 223 to which the UDP packet is supplied extracts application data from the UDP packet and supplies the application data to the buffer 224 at step S92. At step S93, the buffer 224 holds the application data supplied thereto. Then at step S94, the buffer 224 decides whether or not a predetermined interval of time elapses thereby to decide whether or not application data for one block are held. In particular, the buffer 224 accumulates application data of blocks for a predetermined period of time, and when the predetermined time elapses, the buffer 224 supplies the application data of the object blocks accumulated till then to the data separation section 225.

If it is decided at step S94 that the predetermined time does not elapse and application data for one block are not held as yet, then the buffer 224 returns the processing to step S91 so that the processes at the steps beginning with the step S91 are repeated. In other words, the reception apparatus 13 waits that the predetermined time elapses with the buffer 224 while the processes at steps S91 to S94 are repeated.

If it is decided at step S94 that the predetermined time elapses and therefore application data for one block are held, then the buffer 224 supplies the application data held therein (application data of an object block held for the predetermined period of time) to the data separation section 225, whereafter the processing advances to step S95. At step S95, the data separation section 225 separates the application data supplied thereto into base data and redundant data based on the packet number and so forth of them. Then, the data separation section 225 supplies the application data of base data to the packet loss decision section 226 and supplies the application data of redundant data to the loss packet restoration section 228.

The packet loss decision section 226 to which the application data are supplied confirms, at step S96, a lost packet based on the base data packet numbers of the application data supplied thereto, and decides, at step S97, whether or not base data are lost. If it is decided that base data are lost, then the packet loss decision section 226 supplies the application data of base data to the block data restoration section 227 and supplies the decision result and the application data of base data to the loss packet restoration section 228, whereafter the processing is advanced to step S98. At step S98, the loss packet restoration section 228 executes a base data restoration process to restore the lost base data and supplies the application data of the restored base data to the block data restoration section 227. It is to be noted that details of the base data restoration process are hereinafter described with reference to a flow chart of FIG. 20.

After the loss packet restoration section 228 restores the base data, it advances the processing to step S99. On the other hand, if it is decided at step S97 that all base data packet numbers are complete and no base data are lost, then the loss packet restoration section 228 supplies the application data of base data to the block data restoration section 227 and advances the processing to step S99 bypassing the step S98.

At step S99, the block data restoration section 227 extracts base data from the application data supplied thereto and unites the base data to restore block data, and supplies the restored block data to the block synthesis section 229. The block synthesis section 229 temporarily holds the block data supplied thereto and outputs the block data at a predetermined timing. In particular, the block synthesis section 229 successively outputs block data successively supplied thereto from the block data restoration section 227 to unite the block data thereby to output the united block data as reception data equivalent to the transmission data prior to the transmission to the outside of the reception apparatus 13.

The block synthesis section 229 decides, at step S100, whether or not the data reception process should be ended. If it is decided that processing of all block data as reception data is not completed as yet and hence the data reception process should not be ended, then the block synthesis section 229 returns the processing to step S91 so that the processes at the steps beginning with the step S91 are repeated by the pertaining sections.

On the other hand, if it is decided at step S100 that the data reception process should be ended, then the block synthesis section 229 causes the pertaining sections to execute an ending process thereby to end the data reception process.

Since the data reception process is executed in such a manner as described above, the reception apparatus 13 can implement a high-speed restoration process of a high restoration performance without increasing the production cost and can receive data readily and with a high degree of accuracy.

Figure 19:
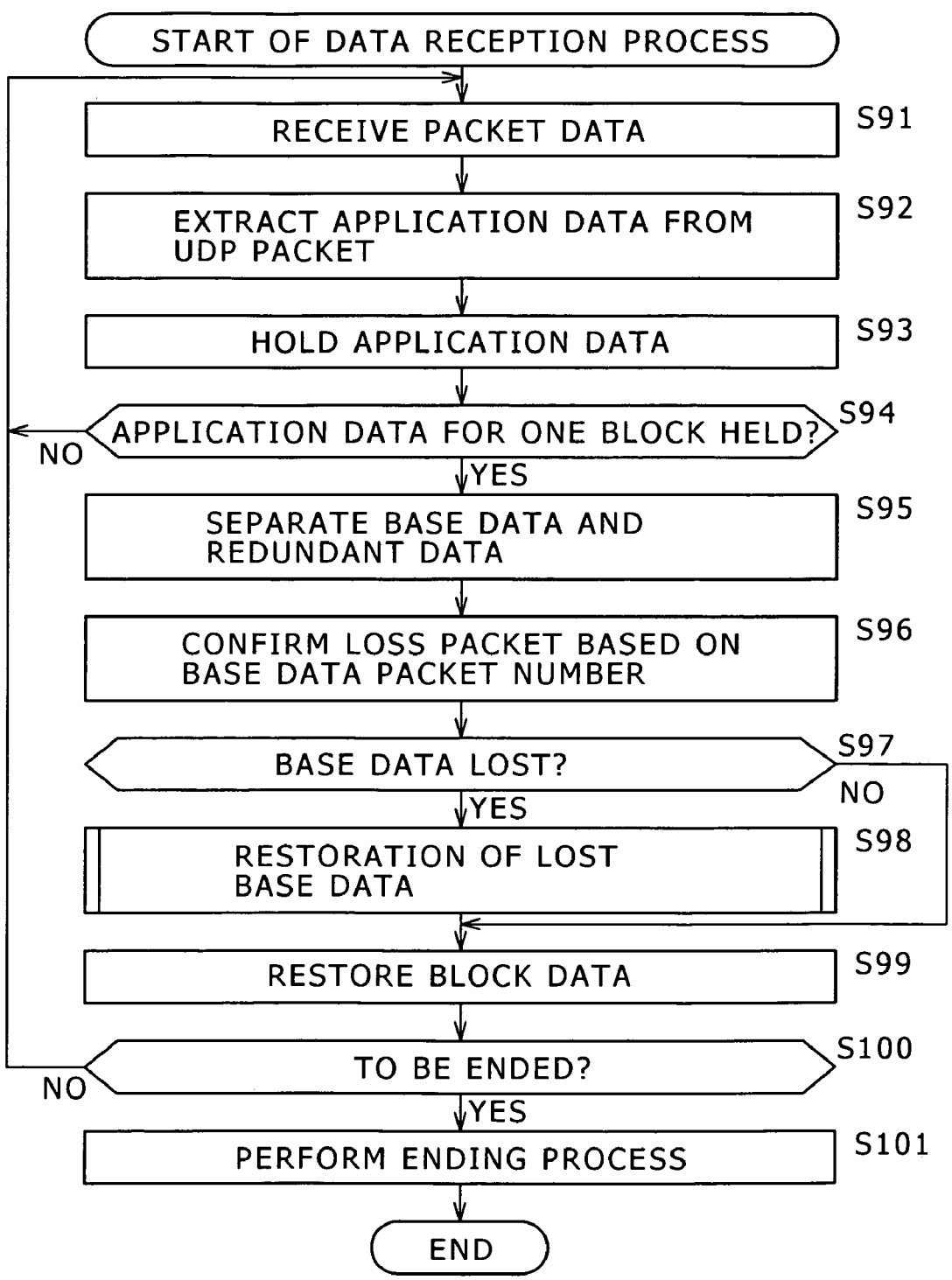
FIG. 19 is a flow chart illustrating an example of a data reception process.

Now, details of the base data restoration process executed at step S98 of FIG. 19 are described with reference to a flow chart of FIG. 20.

When the decision result acquisition section 251 of the loss packet restoration section 228 acquires a decision result from the packet loss decision section 226, it acquires application data of base data supplied thereto together with the decision result and supplies the acquired application data to the base data holding section 252 so as to be held by the same. Then, the decision result acquisition section 251 issues an instruction to produce a determinant to the determinant production section 253.

The determinant production section 253 starts a base data restoration process in accordance with the instruction and acquires, at step S121, the application data of base data from the base data holding section 252. Then at step S122, the determinant production section 253 refers to the base data packet number of the acquired application data to specify the packet number of lost base data.

At step S123, the determinant production section 253 acquires the application data of redundant data supplied thereto from the data separation section 225 and held in the redundant data holding section 254. Then at step S124, the determinant production section 253 refers to the redundant data packet number of the acquired application data and then aligns the redundant data based on the redundant data packet numbers in order to produce a determinant.

Further, at step S125, the determinant production section 253 refers to the base data packet numbers and the redundant data packet numbers of the acquired application data and acquires a necessary portion (M-L rows, N-K columns) from the coefficient matrix of M rows and N columns held in the coefficient matrix supplying section 255 based on the packet numbers.

It is to be noted that this process may be performed such that the coefficient matrix supplying section 255 cuts out a portion requested from the determinant production section 253 from within the coefficient matrix and supplies the cut out portion to the determinant production section 253 or the determinant production section 253 cuts out a necessary portion (M-L rows, N-K columns) from the coefficient matrix of M rows and N columns supplied thereto from the coefficient matrix supplying section 255.

In particular, the determinant production section 253 extracts factors of the coefficient matrix which correspond to both of the rows corresponding to the acquired redundant data and the columns corresponding to the acquired base data to acquire a new coefficient matrix which includes the extracted factors as factors thereof.

Then at step S126, the determinant production section 253 produces a determinant (for example, the expression (3)) for determination of redundant data for calculation from the acquired coefficient matrix and redundant data and supplies the produced determinant to the determinant arithmetic operation section 256.

At step S127, the determinant arithmetic operation section 256 arithmetically operates the determinant supplied thereto to calculate redundant data for calculation and returns the calculated redundant data to the determinant production section 253.

At step S128, the determinant production section 253 acquires, based on the packet numbers of the lost base data and the packet numbers of the redundant data for calculation acquired as described above, a necessary portion (M-L rows, K columns) from the coefficient matrix (M rows, N columns) held in the coefficient matrix supplying section 255.

It is to be noted that this process may be performed such that the coefficient matrix supplying section 255 cuts out a portion requested from the determinant production section 253 from within the coefficient matrix and supplies the cut out portion to the determinant production section 253 or the determinant production section 253 cuts out a necessary portion (M-L rows, K columns) from the coefficient matrix of M rows and N columns supplied thereto from the coefficient matrix supplying section 255.

In particular, the determinant production section 253 extracts factors of the coefficient matrix which correspond to both of the rows corresponding to the acquired redundant data and the columns corresponding to the lost base data to acquire a new coefficient matrix which includes the extracted factors as factors thereof.

Then at step S129, the determinant production section 253 uses the acquired coefficient matrix and the calculated redundant data for calculation to produce a determinant (for example, the expression (4)) for determination of the lost base data and supplies the produced determinant to the determinant arithmetic operation section 256.

At step S130, the determinant arithmetic operation section 256 executes a solution determination process to determine solutions to the determinant supplied therethrough by EOR operation and supplies the solutions to the solution outputting section 257. It is to be noted that details of the solution determination process are hereinafter described with reference to flow charts of FIGS. 21 and 22. At step S131, the solution outputting section 257 produces application data using the solutions supplied thereto as base data and supplies the application data to the block data restoration section 227. Thereafter, the base data restoration process is ended, and the processing returns to step S99 of FIG. 19.

Since the restoration process is performed in such a manner as described above, the loss packet restoration section 228 can implement a high-speed restoration process of a high restoration performance without increasing the production cost. Accordingly, the reception apparatus 13 can receive data readily and with a high degree of accuracy. Further, since the loss packet restoration section 228 refers to the base data packet numbers added to the application data of base data to specify the packet numbers of lost base data, the restoration process can be performed readily. Furthermore, since the loss packet restoration section 228 refers to the redundant data packet numbers added to the application data of redundant data, received redundant data can be aligned readily in order of the packet numbers and can be coordinated readily with a coefficient matrix prepared in advance to produce a determinant.

Now, details of the solution determination process executed at step S130 are described with reference to flow charts of FIGS. 21 and 22.

The determinant arithmetic operation section 256 to which a determinant for determination of lost base data is supplied refers to the coefficient matrix (M-L rows, K columns) included in the determinant to decide whether or not a factor of "1" exists in all of the columns at step S151. If at least one factor whose value is "1" does not exist in all columns of the coefficient matrix, then the lost base data which correspond to the column cannot be calculated, and therefore, the determinant arithmetic operation section 256 executes this decision process at step S151.

If it is decided at step S151 that at least one factor whose value is "1" exists in all of the columns, then the determinant arithmetic operation section 256 advances the processing to step S152, at which it sets a variable i to "1" and starts forward erasure of the Gaussian elimination. The forward erasure is a process of performing EOR operation between rows of the column matrix to deform the determinant so as to decrease the number of factors whose value is "1". A particular example of the forward erasure process is hereinafter described.

After the forward erasure process is started, the determinant arithmetic operation section 256 advances the processing to step S153, at which it successively detects those rows whose value in the ith column is "1" in order beginning with the first row of object rows. The object rows are those rows of the coefficient matrix which make an object of the forward erasure process. As hereinafter described, every time the forward erasure process advances, the object rows vary. It is to be noted that, in the initial state, the object rows are all rows of the coefficient matrix.

At step S154, the determinant arithmetic operation section 256 decides whether or not a plurality of rows are detected by the process at step S153. If it is decided that a plurality of rows are detected, then the determinant arithmetic operation section 256 performs, at step S155, EOR operation of factors of the row detected first and the rows detected second and so forth. At this time, also for the other terms of the determinant, EOR operation is performed so as to correspond to the EOR operation of the coefficient matrix.

After the EOR operation between the rows is performed, the determinant arithmetic operation section 256 advances the processing to step S156. If it is decided at step S154 that only one row whose factor in the ith column has the value of "1" is detected (at least one row is detected in each column because at least one component whose value is "1" exists in each row), then the processing advances to step S156 bypassing the step S155.

At step S156, the determinant arithmetic operation section 256 holds those detected (remaining as a result of the EOR operations) rows whose component in the ith column has the value "1" so as to be used for solution determination thereby to eliminate the rows from the object rows. Then, the processing advances to step S157, at which the determinant arithmetic operation section 256 increments the variable i by "1". Then, at step S158, the determinant arithmetic operation section 256 decides whether or not the value of the variable i is equal to or greater than K. If it is decided that the value of the variable i is smaller than K (that is, a column which has not been processed as yet remains), then the determinant arithmetic operation section 256 returns the processing to step S153 so that the processes at the steps beginning with step S153 are repeated for a next column.

The determinant arithmetic operation section 256 repeats the processes described above to advance the forward erasure process until the process is performed for all columns to decrease the number of those factors of the coefficient matrix which have the value "1".

Figure 22:
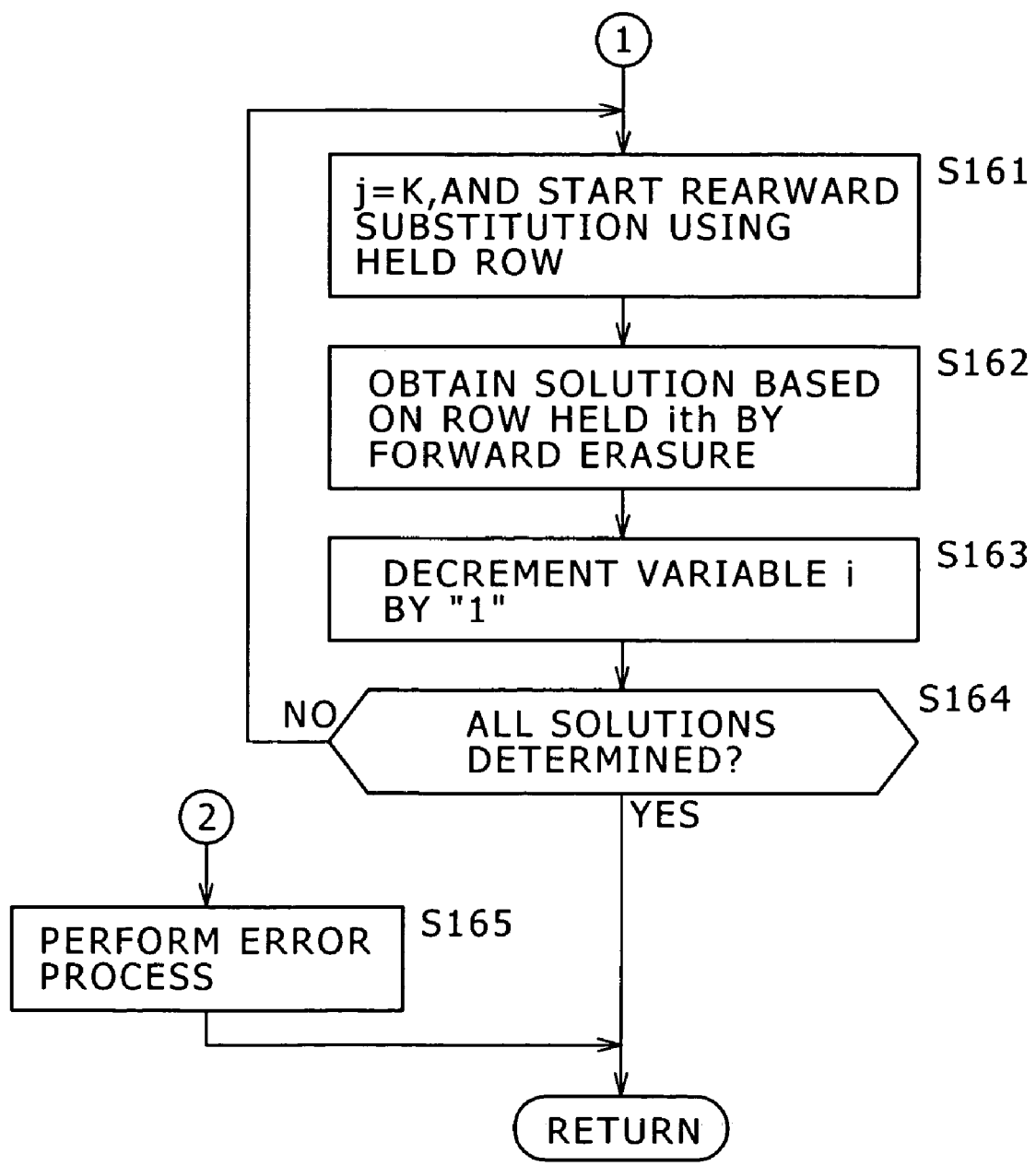

Then, if it is decided at step S158 that the value of the variable i is equal to or greater than K, then the determinant arithmetic operation section 256 advances the processing to step S161 of FIG. 22.

At step S161 of FIG. 22, the determinant arithmetic operation section 256 sets the variable i to K and uses the rows held therein to start rearward substation. The rearward substitution is a process of determining solutions of the base data based on a coefficient matrix wherein the number of factors whose value is "1" is decreased by the forward erasure described above and successively substituting the determined solutions into another equation. A particular example of the rearward substitution process is hereinafter described.

After the rearward substitution is started, the determinant arithmetic operation section 256 solves, at step S162, the equation for the row held ith by the forward erasure. It is to be noted that, as hereinafter described, the determinant arithmetic operation section 256 substitutes a solution determined in the past into a variable (base data) of the equation to solve the equation.

After the process at step S162 is ended, the determinant arithmetic operation section 256 advances the processing to step S163, at which it decrements the variable i by "1". Then at step S164, the determinant arithmetic operation section 256 decides whether or not all solutions (base data) are determined. If it is decided that an unknown variable (base data) remains and all solutions are not determined as yet, then the determinant arithmetic operation section 256 returns the processing to step S161 so that the processes at the steps beginning with step S161 are repeated until all solutions are determined.

If it is decided at step S164 that all solutions are determined, then the determinant arithmetic operation section 256 ends the solution determination process and returns the processing to step S131 of FIG. 20.

Figure 21:
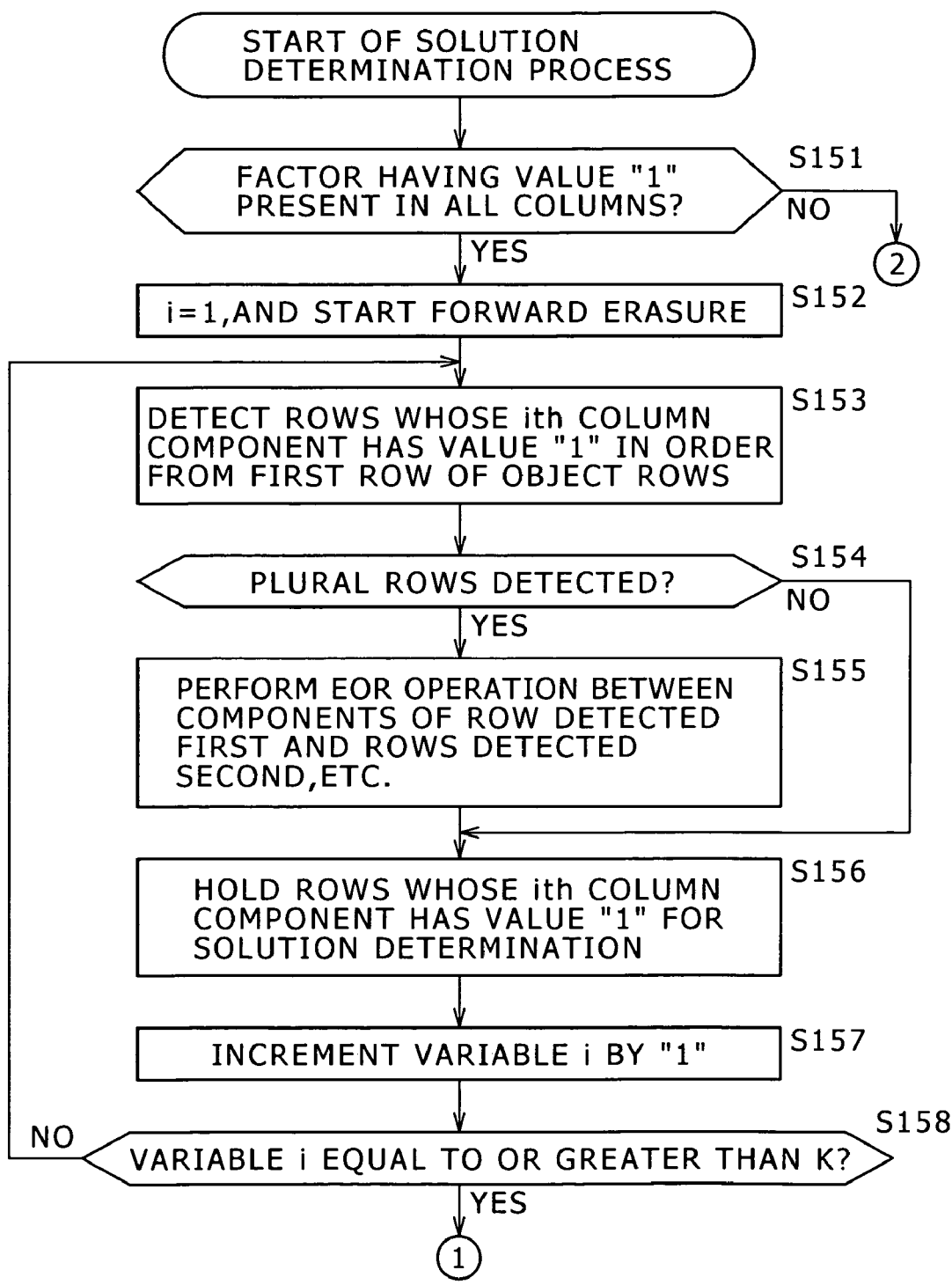
FIGS. 21 and 22 are flow charts illustrating an example of a solution determination process.

On the other hand, if it is decided at step S151 of FIG. 21 that a factor whose value is "1" does not exist in all columns, then since it is impossible to determine all solutions as described above, the determinant arithmetic operation section 256 advances to step S165 of FIG. 22. At step S165, the determinant arithmetic operation section 256 performs an error process to output a message that a lost packet cannot be restored or the like, and ends the solution determination process and returns the processing to step S131 of FIG. 20.

As described above, since the determinant arithmetic operation section 256 solves a determinant using the Gaussian elimination, the loss packet restoration section 228 can restore lost base data readily. Consequently, the transmission apparatus 11 can implement a high speed restoration process without increasing the production cost and can receive data readily with a high degree of accuracy.

Now, particular examples of the Gaussian elimination described above are described with reference to FIGS. 23 to 26. It is to be noted here that description is given of a case wherein five redundant data X1 to X5 for arithmetic operation are used to determine four lost base data D1 to D4 for simplified description. At this time, it is assumed that the coefficient matrix of a determinant is a matrix of 5 rows×4 columns having such factors as seen in FIG. 23 and the determinant production section 253 produces such a determinant as seen in FIG. 23.

Figure 23:
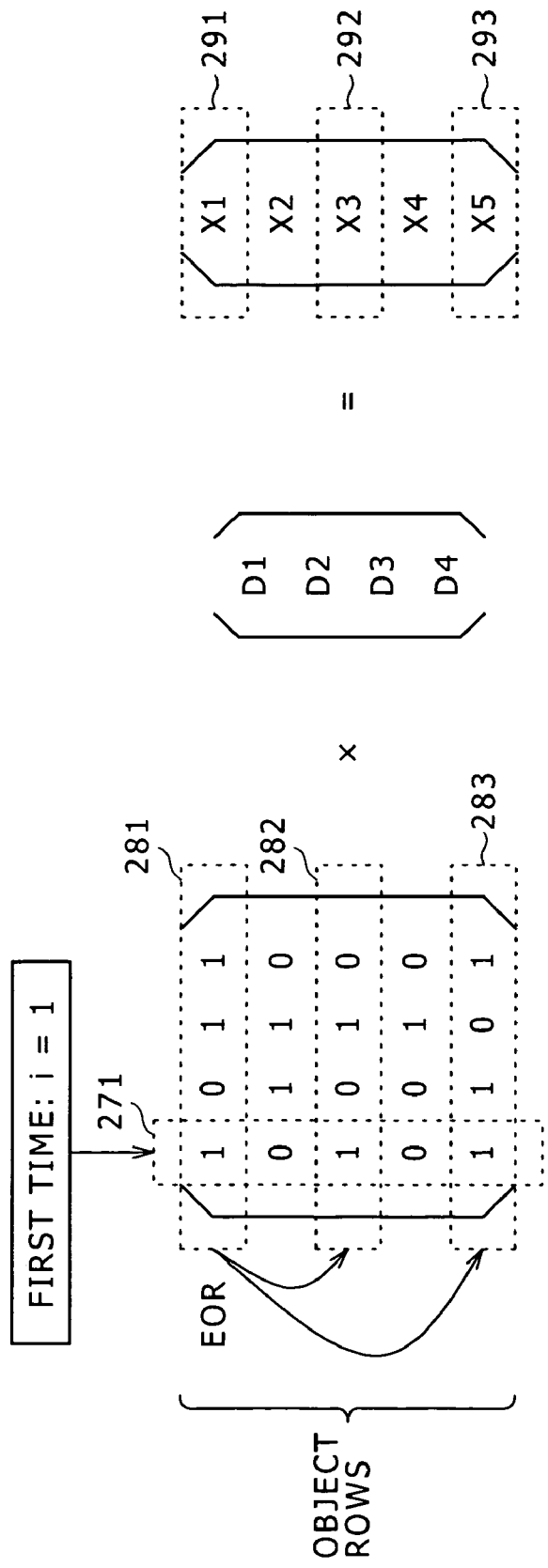

After the matrix illustrated in FIG. 23 is acquired, the determinant arithmetic operation section 256 first executes the process at step S151 of FIG. 21 to decide whether or not a factor whose value is "1" exists in the columns of the coefficient matrix (first term on the left side in FIG. 23). In the coefficient matrix of FIG. 23, a factor whose value is "1" exists in all columns, and therefore, it is possible to determine the base data D1 to D4.

Then, the determinant arithmetic operation section 256 starts forward erasure and sets the first column (i=1) as an object of processing in the process of the first operation cycle. Then, the determinant arithmetic operation section 256 takes note of the first column in all rows as the object rows to successively detect a row in which a factor whose value is "1" exists beginning with the first row among the object rows. In the case of FIG. 23, a row wherein the value of the factor in the first column indicated by a broken line frame 271 is "1" is detected, and the first, third and fifth rows denoted by broken line frameworks 281 to 283 are detected in order.

After those rows wherein the value of the factor in the first column is "1" are detected, the determinant arithmetic operation section 256 performs EOR operation of the factors of the row detected first and the rows detected second and so forth. In the case of FIG. 23, the determinant arithmetic operation section 256 performs EOR operation for each factor between the first row indicated by the broken line framework 281 and the third row indicated by the broken line framework 282. Similarly, the determinant arithmetic operation section 256 performs EOR operation for each factor between the first row indicated by the broken line framework 281 and the fifth row indicated by the broken line framework 283. As a result of the EOR operations, the factors of the coefficient matrix exhibit such values of a coefficient matrix (first term on the left side) illustrated in FIG. 24.

Further, at this time, the determinant arithmetic operation section 256 performs the EOR operation so that the matrix on the right side may correspond to the coefficient matrix in order that the determinant may be established. In the case of FIG. 23, the determinant arithmetic operation section 256 performs EOR operation between the first row (X1) indicated by a broken line framework 291 and the third row (X3) indicated by another broken line framework 292, and then performs EOR operation between the first row (X1) indicated by the broken line framework 291 and the fifth row (X5) indicated by a further broken line framework 293. As a result of the EOR operations, the factors of the matrix of the redundant data for arithmetic operation have such values as in a matrix (right side) of the redundant data for arithmetic operation shown in FIG. 24.

Figure 24:
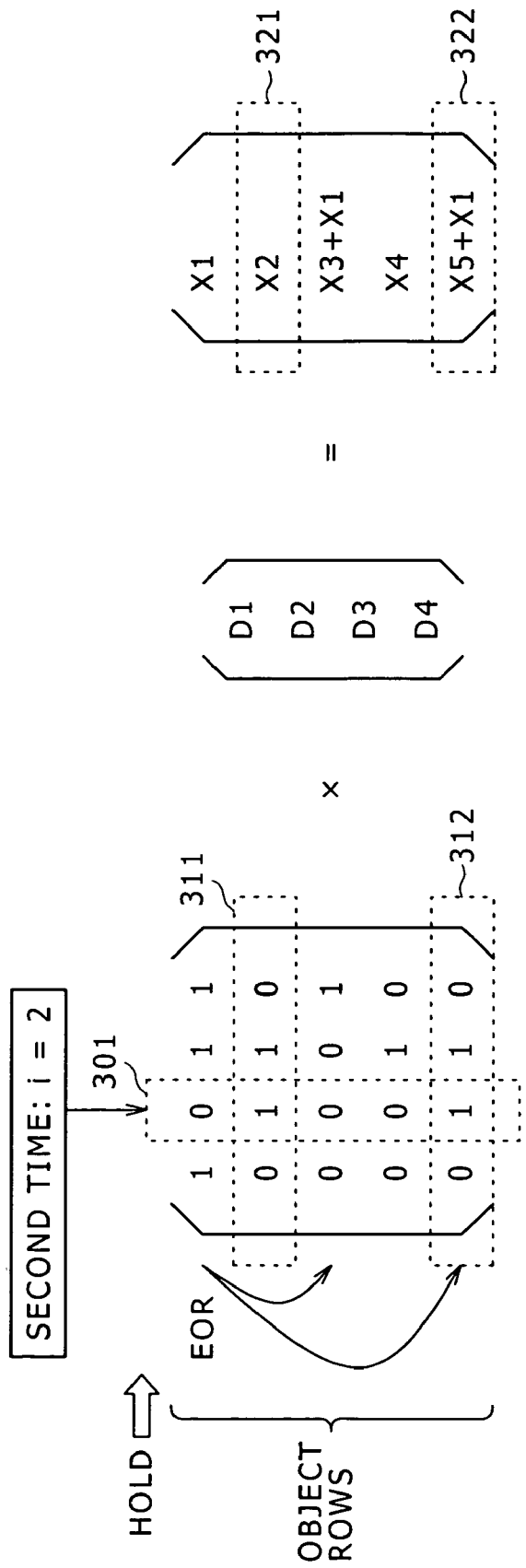

After the row wherein the value of the factor in the first column is "1" in the object rows is reduced only to the first row, the determinant arithmetic operation section 256 starts processing in the second operation cycle and sets the second column in the coefficient matrix as an object of the processing (i=2). Then, the determinant arithmetic operation section 256 holds the first row and now determines the second to fifth rows as object rows. Then, the determinant arithmetic operation section 256 successively detects those rows wherein a factor whose value is "1" exits in the second column of the coefficient matrix beginning with the first row among the object rows (in the case of FIG. 25, beginning with the second row of the coefficient matrix). In the case of FIG. 24, those rows wherein the value of the factor in the second column indicated by a broken line framework 301 is "1" are detected, and the second and fifth rows of the coefficient matrix indicated by broken line frameworks 311 and 312, respectively, are detected in order.

After the rows wherein the value of the factor in the second column is "1" are detected, the determinant arithmetic operation section 256 performs EOR operation between the factors of the row detected first and the rows detected second and so fourth similarly as in the case of the first operation cycle. In the case of FIG. 24, the determinant arithmetic operation section 256 performs EOR operation between the second row indicated by the broken line framework 311 and the fifth row indicated by the broken line framework 312 for each factor. As a result of the EOR operations, the factors of the coefficient matrix have such values as in the coefficient matrix (first term on the left side) illustrated in FIG. 25.

Also at this time, the determinant arithmetic operation section 256 performs EOR operation so that the matrix on the right side may correspond to the coefficient matrix in order that the determinant may be established similarly as in the case of the first operation cycle. In the case of FIG. 24, the determinant arithmetic operation section 256 performs EOR operation between the second row (X2) indicated by a broken line framework 321 and the fifth row (X5+X1) indicated by a broken line framework 322. As a result of the EOR operations, the factors of the matrix of the redundant data for arithmetic operation have such values as in a matrix (right side) of the redundant data for arithmetic operation shown in FIG. 25.

After the rows wherein the value of the factor in the second column is "1" in the object rows are reduced only to the second row, the determinant arithmetic operation section 256 starts processing in the third cycle and sets the third column in the coefficient matrix as an object of the processing (i=3). Then, the determinant arithmetic operation section 256 further holds the second row and now determines the third to fifth rows as object rows. Then, the determinant arithmetic operation section 256 successively detects those rows wherein a factor whose value is "1" exits in the third column of the coefficient matrix beginning with the first row among the object rows (in the case of FIG. 25, beginning with the third row of the coefficient matrix). In the case of FIG. 25, those rows wherein the value of the factor in the third column indicated by a broken line framework 331 is "1" are detected, and only the fourth row of the coefficient matrix indicated by a broken line framework 341 is detected.

Accordingly, in this instance, the determinant arithmetic operation section 256 omits EOR operation. Further, at this time, since the EOR operation is omitted, the determinant arithmetic operation section 256 omits EOR operation also with regard to the matrix on the right side. In the case of FIG. 25, while the fourth row (X4) indicated by a broken line framework 351 in the matrix of redundant data for arithmetic operation on the right side corresponds to the fourth row of the coefficient matrix, the EOR operation is omitted. Accordingly, the values of the factors of the matrices of the terms of the determinant do not exhibit any change as seen in FIG. 26 as a result of the process in the third operation cycle, but are same as those in the case of FIG. 25.

Thereafter, the determinant arithmetic operation section 256 starts processing in the fourth cycle and sets the fourth column in the coefficient matrix as an object of the processing (i=4). Then, the determinant arithmetic operation section 256 further holds the fourth row detected in the preceding operation cycle and now determines the third and fifth rows as object rows. Then, the determinant arithmetic operation section 256 successively detects those rows wherein a factor whose value is "1" exits in the fourth column of the coefficient matrix beginning with the first row among the object rows (in the case of FIG. 25, beginning with the third row of the coefficient matrix). In the case of FIG. 26, those rows wherein the value of the factor in the fourth column indicated by a broken line framework 361 is "1" are detected, and only the fourth row of the coefficient matrix indicated by a broken line framework 371 is detected (the value of the factor in the fourth column of the fifth row is "0").

Accordingly, also in this instance, the determinant arithmetic operation section 256 omits EOR operation similarly as in the processing in the third operation cycle. Further, at this time, since the EOR operation is omitted, the determinant arithmetic operation section 256 omits EOR operation also with regard to the matrix on the right side. In the case of FIG. 26, while the third row (X3+X1) indicated by a broken line framework 381 in the matrix of redundant data for arithmetic operation on the right side corresponds to the third row of the coefficient matrix, the EOR operation is omitted.

Accordingly, the values of the factors of the matrices of the terms of the determinant do not exhibit any change also by the processing in the fourth operation cycle. The determinant arithmetic operation section 256 further holds the third row detected by the processing in the fourth operation cycle.

After the forward erasure is performed for all columns, the determinant arithmetic operation section 256 ends the forward erasure and then starts rearward substitution. In the row held last in the forward erasure, one factor whose value is "1" exists only in the last column. The values of the factors in the other columns have been converted into "0" by the EOR operation in the past. Similarly, in the row held second from the last, the number of factors whose value is "1" is equal to or smaller than 2, and the number of factors held in the preceding operation cycle is equal to or smaller than 3. In this manner, in the row held Yth from the last, the number of factors whose value is "1" is equal to or smaller than Y.

Accordingly, the determinant arithmetic operation section 256 determines one solution from the row held last by the rearward substitution and then substitutes the solution in the reverse order to the holding order to determine all solutions.

Since the determinant arithmetic operation section 256 can solve a determinant by simple arithmetic operation such as EOR operation using the Gaussian elimination in this manner, the loss packet restoration section 228 can restore lost base data readily at a high speed.

Now, a determination method of the value of the coefficient production probability p is described.

Figure 27:
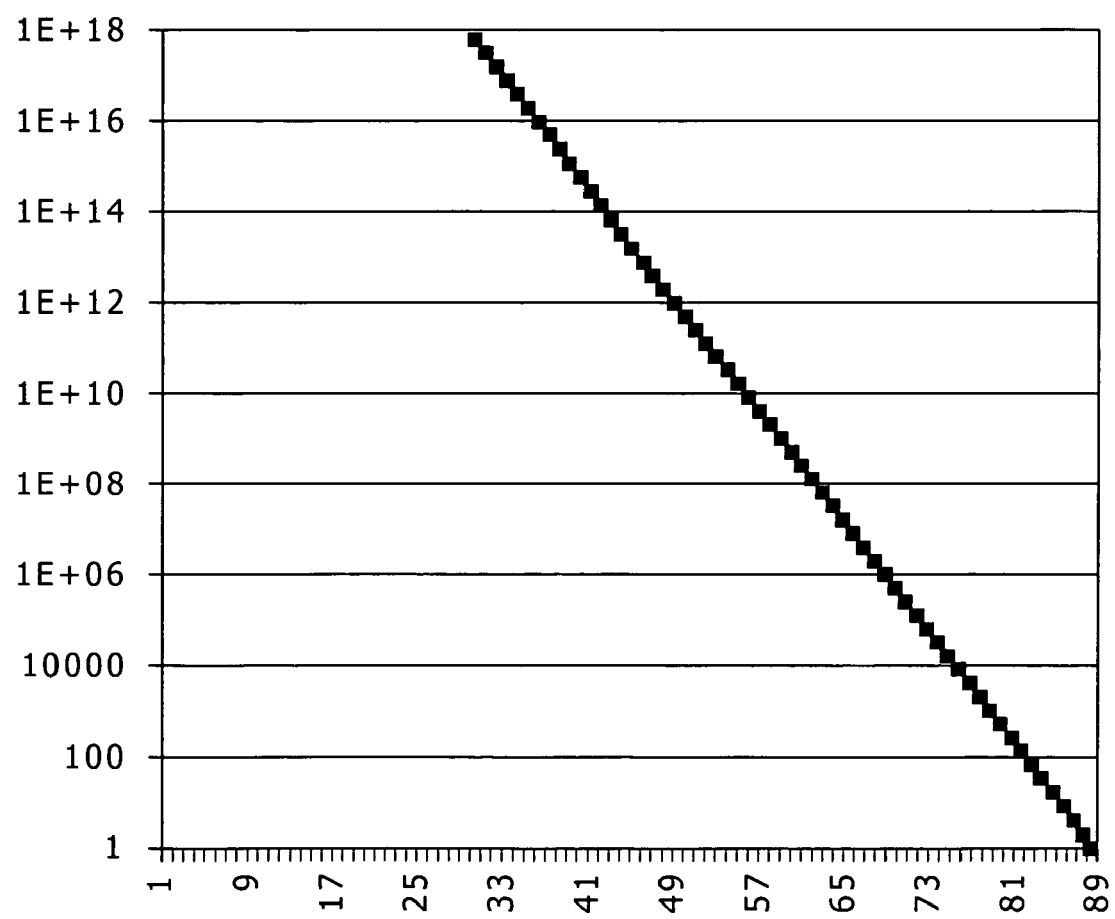
FIGS. 27 and 28 are diagrams illustrating relationships between a coefficient production probability and a restoration capacity.
Figure 28:
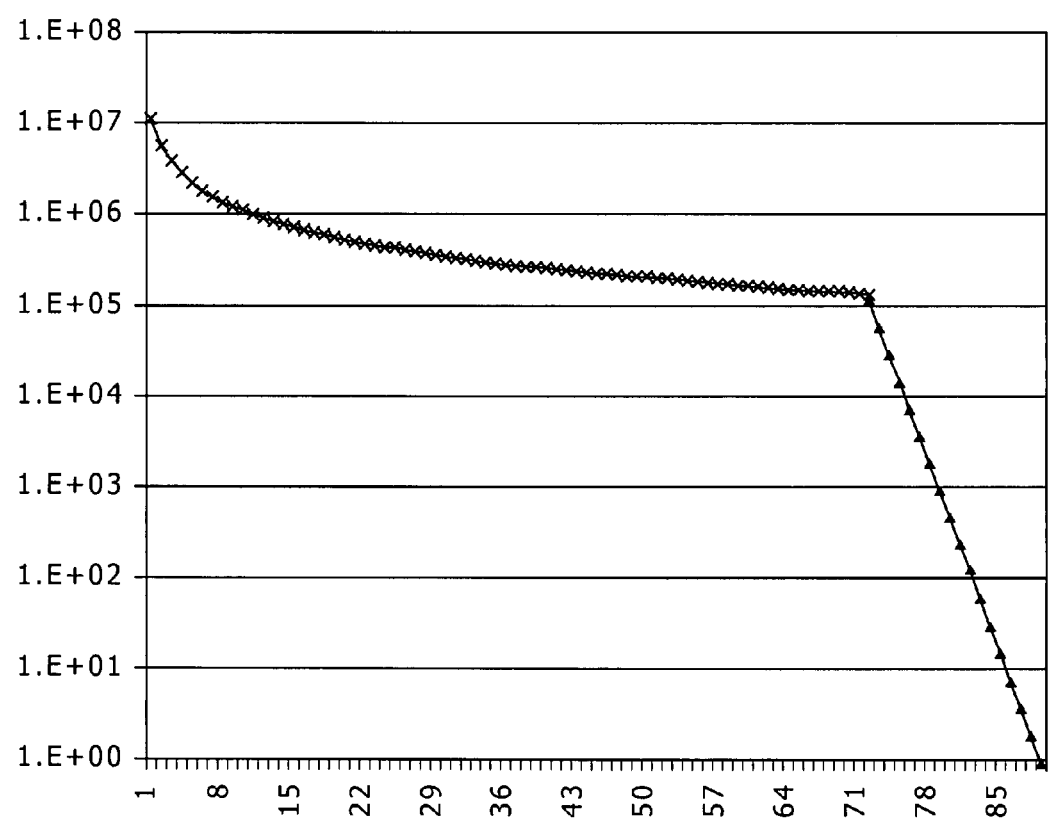

FIGS. 27 and 28 are graphs illustrating the packet restoration capacity of the reception apparatus 13. In both figures, the axis of abscissa represents the lost packet number and the axis of ordinate represents the restoration capacity (number of times of restoration/number of times of failure in restoration). FIG. 27 illustrates the restoration capacity where the value of the coefficient production probability p is 1/2, and FIG. 28 illustrates the restoration capacity where the value of the coefficient production probability p is 1/6.

As seen from FIGS. 27 and 28, the lost packet restoration capacity of the reception apparatus 13 increases as the number of lost packets decreases and increases as the coefficient production probability p becomes higher. However, since naturally the arithmetic operation amount in the restoration process increases as the coefficient production probability p increases, the load of the restoration process increases. As hereinafter described, for example, if compared with a restoration process which uses the Reed Solomon code, also the load of the restoration process by EOR operation processing is very light, as the value of the coefficient production probability p decreases, the restoration process can be performed at a higher speed. Accordingly, from the point of view of the load of processing, it is preferable to set the value of the coefficient production probability p as low as possible. However, the restoration capacity increases as the value of the coefficient production probability p increases as described hereinabove.

In other words, the magnitude of the load of processing and the height of the restoration capacity have a tradeoff relationship to each other, and preferably the value of the coefficient production probability p is set as low as possible within a range within which the restoration capacity has a value suitable for practical use while it is taken into consideration in what degree the packet loss rate in the network 12 is in the actual system.

As described above, in the communication system 1, the transmission apparatus 11 produces, in addition to transmission data, a plurality of redundant data for error correction against packet loss through EOR operation from the transmission data and transmits the redundant data for error correction to the reception apparatus 13 together with the transmission data. The reception apparatus 13 performs, based on the redundant data (received redundant data), a restoration process for those transmission data which have not been received successfully. By the configuration of the communication system 1, the reception apparatus 13 can restore lost data without issuing a re-sending request to the transmission apparatus 11. Accordingly, the communication system 1 can perform accurate communication readily.

FIG. 29 illustrates an example of a relationship between the processing time of the restoration process (EOR) by EOR operation described hereinabove and the processing time of a restoration process which uses the Reed Solomon code (Reed Solomon FEC (Forward Error Correction)).

In FIG. 29, the block size of transmitted contents is 5 seconds, and the bit rate of contents is 4 Mbps while the data size of packet data is 1 KByte. In this instance, one block includes 2,500 packets. A table 391 of FIG. 29 illustrates a relationship between the processing time of the restoration process by EOR operation and the processing time of a restoration process which uses the Reed Solomon code where the packet loss is 10% (250 packets).

As seen from the table 391, when compared with the restoration process which uses the Reed Solomon code, the restoration process by EOR operation exhibits much shorter time in terms of all of the pre-processing, arithmetic operation process by the Gaussian elimination and data restoration process as well as the sum total of them. Also the CPU (Central Processing Unit) population (numerals in parentheses in the column of the sum total) is overwhelmingly lower.

Accordingly, the reception apparatus 13 can perform a restoration process at a very high speed or without applying much load of processing when compared with an alternative case wherein a restoration method which uses the Reed Solomon code is used.

FIG. 30 illustrates a relationship between the restoration capacity (EOR) by EOR operation described hereinabove and the restoration capacity (RE-FEC) of a restoration process which uses the Reed Solomon code.

In a table 401 of FIG. 30, a value suitable for practical use is set as the packet number of one block, and for the restoration process by EOR operation, examples wherein the packet number of one block is 1,000 and 2,000 are listed whereas, for the restoration process by the RS-SFC, an example wherein the packet number of one block is 100 is listed.

In the table 401, the packet loss rate with which the error rate is $10^{-8}$ and the packet loss rate with which the error rate is $10^{-14}$ are indicated. It is indicated by the packet loss rate that a higher value thereof provides a greater margin. As seen from the table 401, the restoration process which uses EOR operation has a greater margin than the restoration process which uses the Reed Solomon code. It is to be noted that the error rate $10^{-8}$ is a rate of once per approximately one year in continuous looking and listening in the case of the Reed Solomon FEC but a rate of once per 10 years in the case of the restoration process by EOR operation. Accordingly, the communication system 1 of FIG. 1 can execute processing with a higher degree of readiness and accuracy.

It is to be noted that, while, in the foregoing description, the header addition section 114 of the application data production section 34 adds a packet number to base data and redundant data, it is only necessary to supply the packet number of application data in such a state that the packet number of the base data and the packet of the redundant data can be identified from each other. Thus, for example, an identifier may be used in place of the offset value as seen in FIG. 31.

Figure 31:
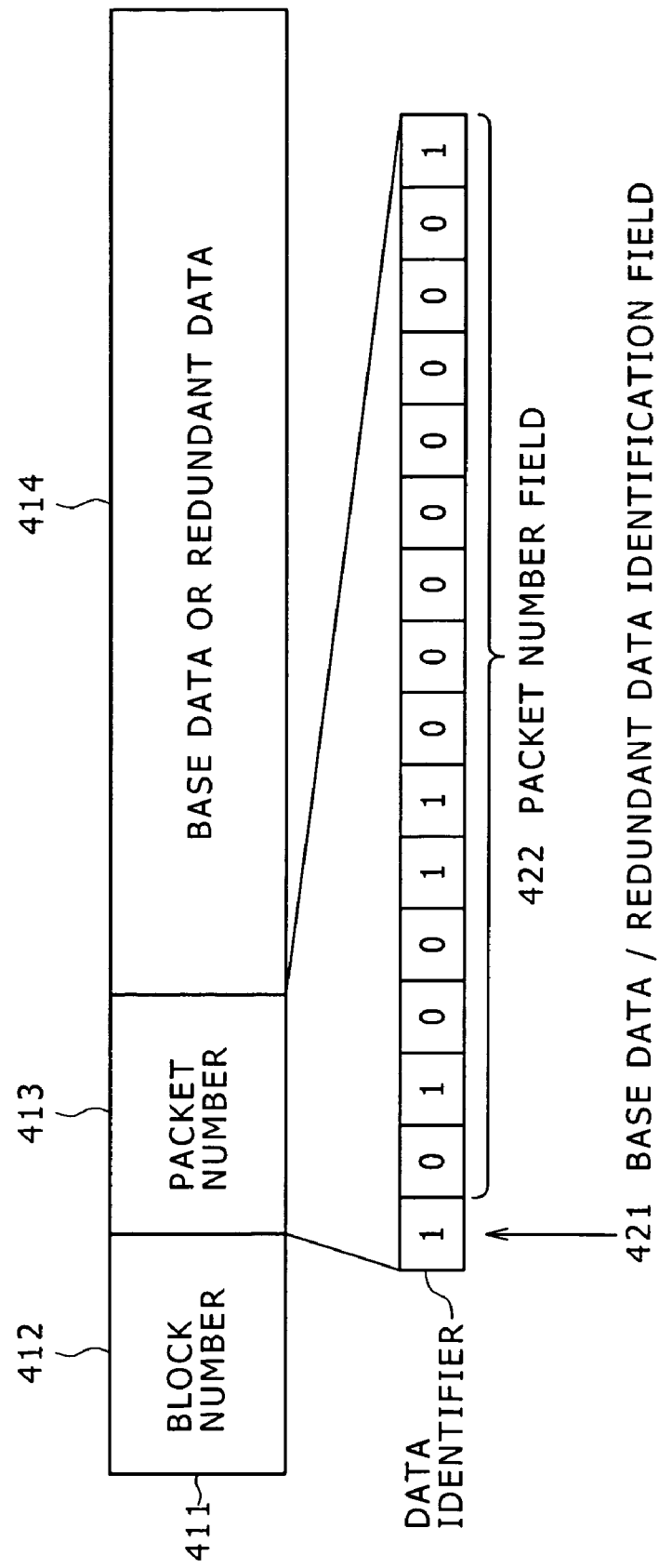
FIG. 31 is a diagrammatic view illustrating another example of a configuration of the application data.

Referring to FIG. 31, application data 411 include data (base data or redundant data) 414, and a block number 412 and a packet number 413 added to the data 414. The leftmost one bit of the packet number 413 is set to a base data/redundant data identification field 421 while the remaining bit train is set to a packet number field 422.

In this instance, the redundant data packet number does not have an offset value added thereto, and a base data packet number is identified as such from the data identifier of the base data/redundant data identification field 421. For example, where the value of the data identifier is "0", this indicates that the data are application data of base data and the packet number is a base data packet number. However, where the value of the data identifier is "1", this indicates that the data are application data of redundant data and the packet number is a redundant data packet number.

It is to be noted that the relationship between the value of the data identifier and the data represented by the value may otherwise be reverse to that described above. Further, naturally the base data/redundant data identification field 421 may otherwise be formed from a plurality of bits.

An example of a configuration of the application data production section 34 which produces such application data as described above is shown in FIG. 32.

Figure 32:
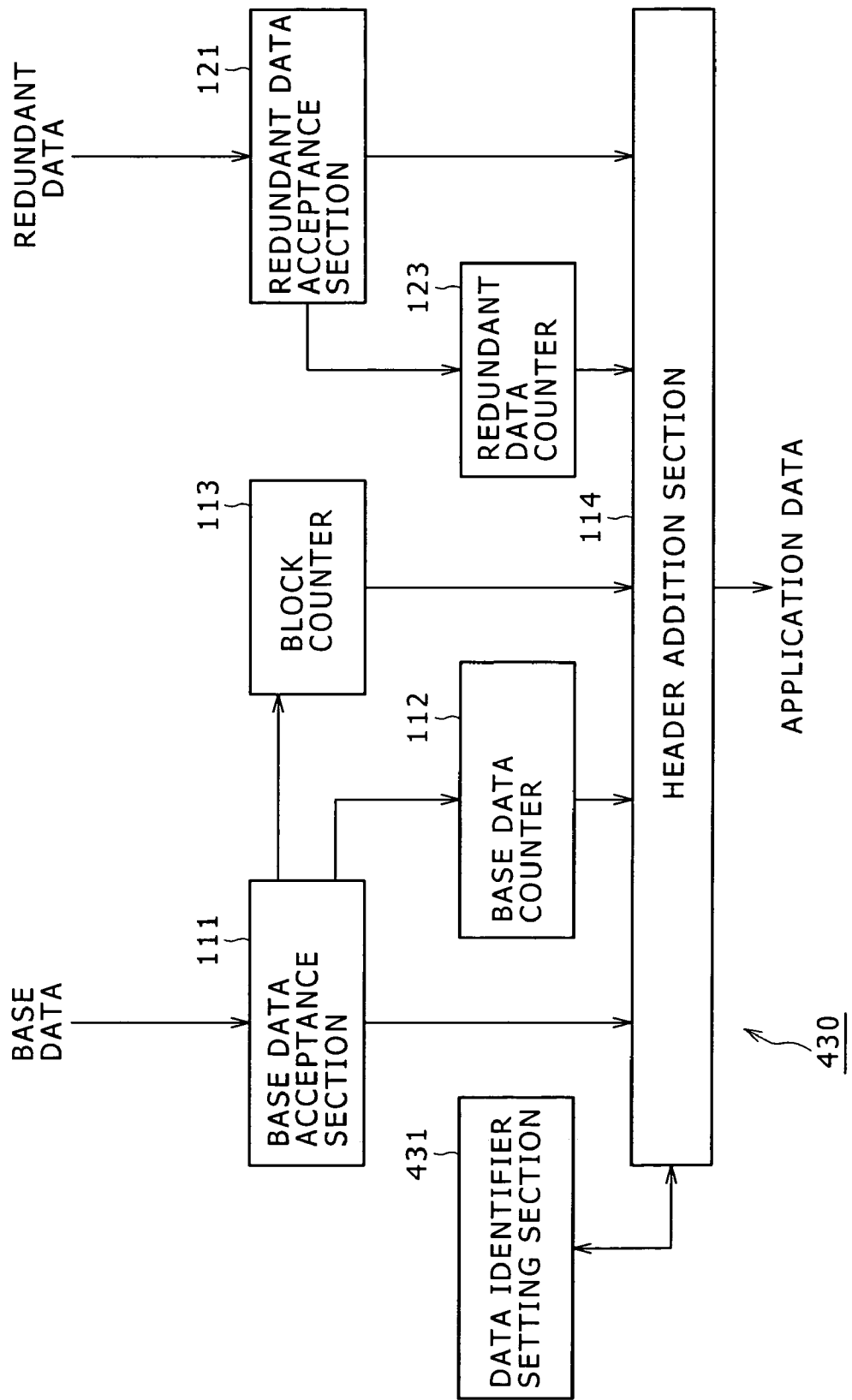
FIG. 32 is a block diagram showing another example of a configuration of the application data production section shown in FIG. 2.

Referring to FIG. 32, the configuration of the application data production section 430 shown is basically similar in configuration to the application data production section 34 described hereinabove with reference to FIG. 9. However, the application data production section 430 does not include the offset value supplying section 122 for supplying an offset value to the redundant data counter 123 but additionally includes a data identifier setting section 431 for setting a data identifier.

The redundant data acceptance section 121 sets the count value of the redundant data counter 123 to "0" when it initializes the redundant data counter 123. In particular, since the application data production section 430 does not include the offset value supplying section 122, the count value of the redundant data counter 123 in its initialized state is "0".

The data identifier setting section 431 sets a data identifier to be supplied to the header addition section 114 and supplies the set value of the data identifier to the header addition section 114. The header addition section 114 adds the set value of the data identifier supplied thereto to the base data/redundant data identification field 421 of application data.

An application data production process executed by the application data production section 430 shown in FIG. 32 is described below with reference to flow charts of FIGS. 33 and 34.

At step S181, the base data acceptance section 111 and the redundant data acceptance section 121 of the application data production section 430 initialize the counters similarly as at step S61 of FIG. 18. It is to be noted, however, that the redundant data acceptance section 121 does not set an offset value to the count value of the redundant data counter 123 but sets, for example, "0" similarly to the other counters.

At step S182, the base data acceptance section 111 decides whether or not base data are accepted similarly as at step S62 of FIG. 18. If it is decided that base data are accepted, then it is decided at step S183 whether or not the accepted base data are the first packet data in a block similarly as at steps S63 through s65 of FIG. 18. If it is decided that the accepted base data are the first packet data of a block, then the processing is advanced to step S184, at which the block counter 113 is caused to count up similarly as at step S64 of FIG. 18. Further, at step S185, the base data counter 112 is caused to count up similarly as at step S65 of FIG. 18. On the other hand, if it is decided at step S183 that the accepted base data are not the first packet data in the block, then the processing at step S184 is omitted, and only the base data counter 112 is caused to count up at step S185. After the counters are caused to count up, the base data acceptance section 111 supplies the acquired base data to the header addition section 114.

At step S186, the data identifier setting section 431 sets the value of the data identifier for the base data acquired by the header addition section 114 to "0" and supplies the data identifier to the header addition section 114.

At step S187, the header addition section 114 adds the count value of the base data counter 112 to the base data similarly as at step S66 of FIG. 18. Then, at step S188, the header addition section 114 adds the data identifier supplied thereto from the data identifier setting section 431 to the base data. Further, at step S189, the header addition section 114 adds the count value of the block counter 113 to the base data similarly as at step S66 of FIG. 18. After the necessary headers are added to the base data, the header addition section 114 supplies the resulting data as application data to the UDP packetization section 35 similarly as at step S67 of FIG. 18. Thereafter, the processing advances to step S201 of FIG. 34.

Figure 33:
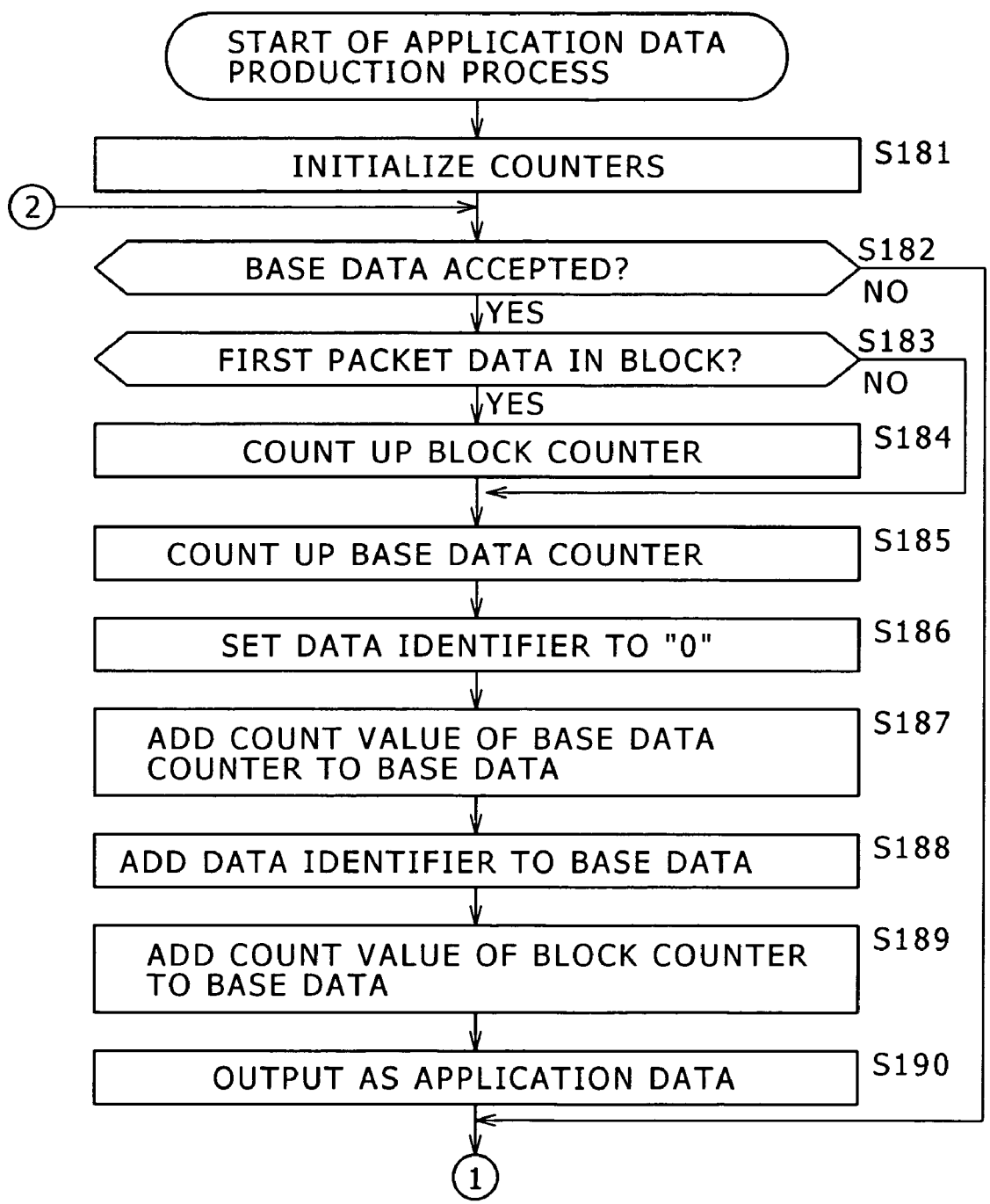
FIGS. 33 and 34 are flow charts illustrating another example of the application data production process.
Figure 34:
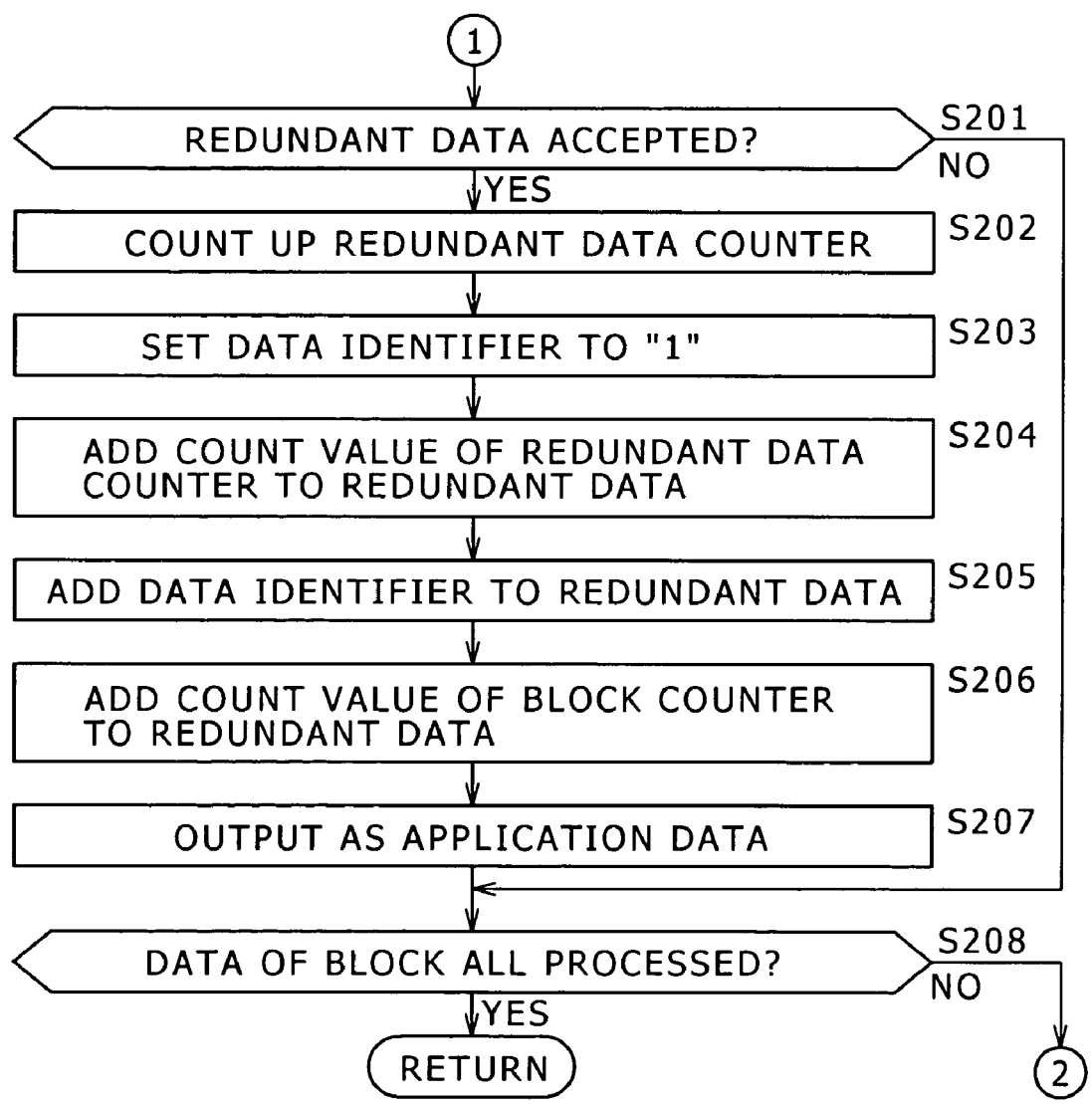

It is to be noted that, if it is decided at step S182 of FIG. 33 that base data are not accepted, then the base data acceptance section 111 bypasses the steps S183 to S190 and advances the processing directly to step S201 of FIG. 34.

At step S201 of FIG. 34, the redundant data acceptance section 121 decides whether or not redundant data are accepted similarly as at step S68 of FIG. 18. If it is decided that redundant data are accepted, then the redundant data acceptance section 121 causes the redundant data counter 123 to count up at step S202 similarly as at step S69 of FIG. 18. After the redundant data counter 123 is caused to count up, the redundant data acceptance section 121 supplies the acquired redundant data to the header addition section 114.

At step S203, the data identifier setting section 431 sets the value of the data identifier for the redundant data acquired by the header addition section 114 to "1" and supplies the data identifier to the header addition section 114.

At step S204, the header addition section 114 adds the count value of the redundant data counter 123 to the redundant data similarly as at step S70 of FIG. 18. Further, at step S205, the header addition section 114 adds the data identifier supplied thereto from the data identifier setting section 431 to the redundant data. Furthermore, at step S206, the header addition section 114 adds the count value of the block counter 113 to the redundant data similarly as at step S70 of FIG. 18. After the necessary headers are added to the redundant data, the header addition section 114 supplies, at step S207, the resulting data as application data to the UDP packetization section 35 similarly as at step S71 of FIG. 18. Thereafter, the processing advances to step S208.

At step S208, the header addition section 114 decides whether or not all of the data of the block are processed. If it is decided that some packet data have not been processed as yet, then the processing returns to step S182 of FIG. 33 so that the processes at the steps beginning with step S182 are repeated. On the other hand, if it is decided at step S208 of FIG. 34 that all packet data are processed, then the header addition section 114 ends the application data production process and returns the processing to step S5 of FIG. 15.

Where an identifier is used to identify a base data packet number and a redundant data packet number from each other in this manner, the reception apparatus 13 can separate packet data similarly as in the alternative case wherein an offset value is used.

In the foregoing description, the transmission apparatus 11 and the reception apparatus 13 use the same coefficient matrix produced using predetermined values equal to each other as seed data to execute a redundant data production process and a lost base data restoration process. More particularly, the transmission apparatus 11 adds, to base data, a base data packet number as information for specifying a packet which the reception apparatus 13 fails to receive and adds, to redundant data, a redundant data packet number as information for aligning packets acquired by the reception apparatus 13, and transmits the resulting base data and redundant data. In particular, the transmission apparatus 11 adds information for specifying a lost packet to base data and adds information for aligning redundant data to the redundant data, and transmits the resulting data.

Figure 35A:
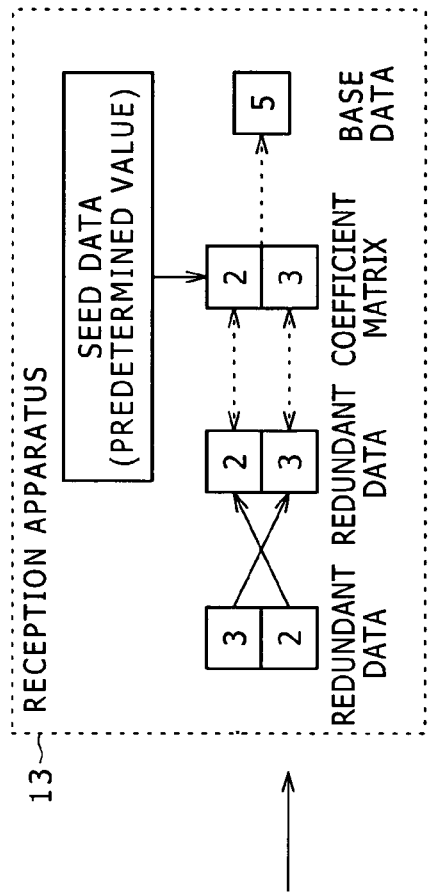
FIGS. 35A and 35B are diagrammatic views illustrating different examples of the coefficient matrix production method.

For example, as seen in FIG. 35A, the transmission apparatus 11 produces coefficient matrices (matrix numbers 1 to 3) using a predetermined value as seed data, calculates redundant data (redundant data packet numbers 1 to 3) using the coefficient matrices, and supplies the redundant data in order of the packet number to the reception apparatus 13.

However, the redundant data produced and transmitted by the transmission apparatus 11 using the coefficient matrices may not be received fully by the reception apparatus 13 or the order of reception of the redundant data may be different from the order of transmission. For example, in FIG. 35A, the reception apparatus 13 receives only the packets having the redundant data packet numbers "2" and "3". Also the reception order in this instance is different from the transmission order, and the redundant data are received in order of the redundant data packet numbers "3" and "2".

Also in the reception apparatus 13, coefficient matrices are produced using a predetermined value as seed data similarly as in the case of the transmission apparatus 11. Therefore, the reception order of the redundant data and the list of the rows of the coefficient matrix do not coincide with each other. Accordingly, the reception apparatus 13 aligns the redundant data so that the order of the received redundant data may coincide with that of a coefficient matrix prepared in advance in order that the coincidence between them may be established. More particularly, the reception apparatus 13 aligns the redundant data using the redundant data packet numbers as described above. For example, in the case of FIG. 35A, the reception apparatus 13 re-arranges the redundant data having the redundant data packet numbers "3" and "2" and received in this order to another order of the redundant data packet numbers "2" and "3" so that the order of the redundant data may correspond to the order of the coefficient matrices. Where the redundant data are re-arranged in this manner, the reception apparatus 13 can restore the lost base data (in the case of FIG. 35A, the base data whose base data packet number is "5").

However, some other method may be used instead. For example, the transmission apparatus 11 and the reception apparatus 13 may not commonly use seed data, but the transmission apparatus 11 may transmit, upon communication, information of such seed data (that is, information for production of a coefficient matrix) to the reception apparatus 13 (FIG. 35B).

Figure 35B:
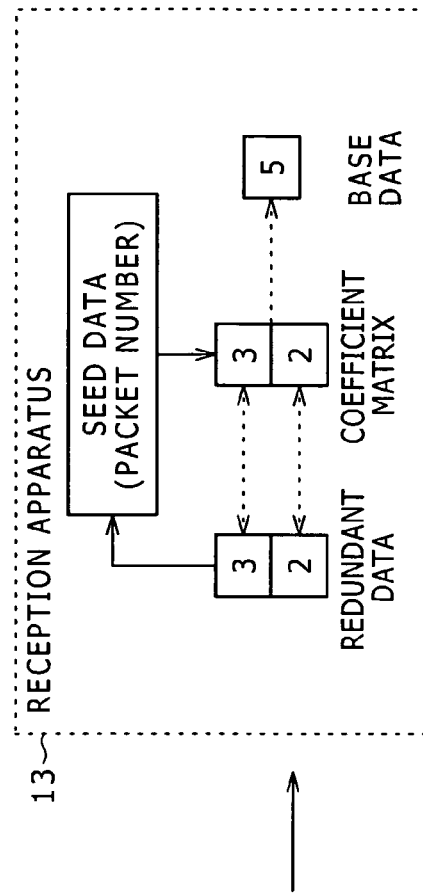

For example, in FIG. 35B, each of the transmission apparatus 11 and the reception apparatus 13 uses a redundant data packet number to produce seed data. At this time, the transmission apparatus 11 and the reception apparatus 13 use one redundant data packet number as seed data to produce a coefficient matrix of one row and synthesize such rows to complete a coefficient matrix. According to the production method, since the reception apparatus 13 uses redundant data packet numbers as seed data in order of acceptance of the received redundant data, it can produce a required coefficient matrix (coefficient matrix including only those rows which correspond to received redundant data). Further, the order of the rows of the produced coefficient matrix corresponds to the reception order of the received redundant data.

In particular, the transmission apparatus 11 adds information (base data packet number) for specifying a lost packet to base data and adds information (redundant data packet number) for producing a coefficient matrix corresponding to redundant data to the redundant data, and transmits the resulting data.

It is to be noted that the process of the transmission apparatus 11 in this instance is basically similar to that described hereinabove although a redundant data packet number to be produced hereafter is used in place of a predetermined value as seed data, and therefore, description of the process is omitted herein to avoid redundancy. Also the reception apparatus 13 performs a data reception process basically similar to that described hereinabove. However, the loss packet restoration section 228 executes, when it executes a base data restoration process, different processing from that described hereinabove with reference to FIG. 20.

The base data restoration process of the loss packet restoration section 228 is described with reference to a flow chart of FIG. 36.

The determinant production section 253 of the loss packet restoration section 228 of FIG. 14 starts the base data restoration process in response to an instruction from the decision result acquisition section 251. At step S221, the determinant production section 253 acquires application data of base data from the base data holding section 252, and at step S222, the determinant production section 253 refers to the base data packet numbers of the acquired application data to specify the packet number of lost base data. Further, at step S223, the determinant production section 253 acquires application data of redundant data from the redundant data holding section 254. The processes at steps S221 to S223 correspond to those at steps S121 to S123 described hereinabove with reference to FIG. 20, respectively.

The determinant production section 253 refers to the redundant data packet numbers of the acquired application data and supplies the redundant data packet numbers to the coefficient matrix supplying section 255. The coefficient matrix supplying section 255 produces, at step S224, a coefficient matrix using the redundant data packet numbers supplied thereto as seed data and supplies the coefficient matrix to the determinant production section 253. The coefficient matrix is a coefficient matrix of M-L rows and N columns formed from rows corresponding to the redundant data acquired by the reception apparatus 13 and columns corresponding to all base data.

Then at step S225, the determinant production section 253 acquires necessary factors from the coefficient matrix produced at step S224 based on the packet numbers of the acquired base data. In particular, the determinant production section 253 extracts column components corresponding to the acquired base data from the coefficient matrix of M-L rows and N columns to produce a coefficient matrix of M-L rows and K columns.

At step S226, the determinant production section 253 produces a determinant for determination of redundant data for calculation and supplies the determinant to the determinant arithmetic operation section 256. Then at step S227, the determinant arithmetic operation section 256 arithmetically operates the determinant supplied thereto to calculate redundant data for calculation and returns the calculated redundant data for arithmetic operation to the determinant production section 253. It is to be noted that the processes at steps S225 and S226 correspond to those at steps S126 and S127 of FIG. 20, respectively.

After the redundant data for calculation are acquired, the determinant production section 253 acquires, at step S228, a portion (M-L rows of K columns) from the coefficient matrix (M-L rows and N columns) produced at step S224 based on the packet number of the lost base data and the packet numbers of the acquired redundant data. Then at step S229, the determinant production section 253 produces a determinant (for example, the expression (4)) for determination of lost base data and supplies the produced determinant to the determinant arithmetic operation section 256. It is to be noted that the processes at steps S228 and S229 correspond to those at steps S128 and S129 of FIG. 20, respectively.

At step S230, the determinant arithmetic operation section 256 executes a solution determination process to determine solutions to the determinant supplied thereto by EOR operation. Then at step S231, the determinant arithmetic operation section 256 outputs the solutions to the determinant as base data. Then, the base data restoration process is ended, and the processing is returned to step S99 of FIG. 19.

Since the determinant production section 253 performs the base data restoration process in such a manner as described above, the reception apparatus 13 can produce a coefficient matrix using the redundant data packet numbers added to the redundant data supplied thereto from the transmission apparatus 11 as seed data and use the coefficient matrix to restore the lost base data. Consequently, the reception apparatus 13 can receive data readily and accurately.

While, in the foregoing description, the transmission apparatus 11 adds a base data packet number as information for allowing the reception apparatus 13 to specify lost base data to base data and transmit the resulting data, naturally some other information may be added as information for allowing the reception apparatus 13 to specify lost base data to base data. Further, the transmission apparatus 11 may not add information for allowing the reception apparatus 13 to specify lost base data to base data but transmit the information as data different from the application data. Furthermore, the transmission apparatus 11 may supply information for allowing the reception apparatus 13 to specify lost base data to the reception apparatus 13 using, for example, a recording medium such as a magnetic disk or a writable optical disk or the like.

Further, while, in the foregoing description, the transmission apparatus 11 adds and transmits a redundant data packet number as information for aligning redundant information acquired by the reception apparatus 13 to and together with redundant data, naturally some other information may be added as information for aligning redundant information acquired by the reception apparatus 13 to redundant data. Further, the transmission apparatus 11 may not add information for aligning redundant information acquired by the reception apparatus 13 to redundant data but transmit the information as data different from the application data. Furthermore, the transmission apparatus 11 may supply information for aligning redundant information acquired by the reception apparatus 13 to the reception apparatus 13 using, for example, a recording medium such as a magnetic disk or a writable optical disk or the like.

Furthermore, while, in the foregoing description, the transmission apparatus 11 adds and transmits a redundant data packet number as information for allowing the reception apparatus 13 to produce a coefficient matrix to and together with redundant data, naturally some other information may be added as information for allowing the reception apparatus 13 to produce a coefficient matrix to redundant data. Further, the transmission apparatus 11 may not add information for allowing the reception apparatus 13 to produce a coefficient matrix to redundant data but transmit the information as data different from the application data. Furthermore, the transmission apparatus 11 may supply information for allowing the reception apparatus 13 to produce a coefficient matrix to the reception apparatus 13 using, for example, a recording medium such as a magnetic disk or a writable optical disk or the like.

It is to be noted that the transmission apparatus 11 may add and transmit two or more of information for allowing the reception apparatus 13 to specify to which one of blocks the acquired packet data belong, information for allowing the reception apparatus 13 to specify lost base data, information for aligning redundant information acquired by the reception apparatus 13, information for allowing the reception apparatus 13 to produce a coefficient matrix and other information to and together with one packet data. Further, even where base data are same, packet data to which such information is added and packet data to which no such information is added may be mixed with each other. Those described above also apply to redundant data similarly.

Further, a coefficient matrix may be changed for every block although the restoration performance is deteriorated when compared with the method described above. In this instance, a plurality of coefficient matrices may be prepared in both of the transmission apparatus 11 and the reception apparatus 13 in advance, or the seed data may be changed for every block. In the foregoing description, where seed data is used to produce a coefficient matrix, a redundant data packet number is used as the seed data. However, where the seed data is changed for every block, for example, if not only a redundant data packet number but also a block number are utilized as the seed data, then a matrix to be produced can be changed readily.

Further, the data size of block data may be common to different blocks or may be different among different blocks. Where block data have different data sizes from each other, some information is supplied from the transmission apparatus 11 to the reception apparatus 13 so that the reception apparatus 13 can grasp the data size of each block (or the number of packet data corresponding to each block).

While, in the foregoing description, the communication system 1 includes the transmission apparatus 11 which transmits data and the reception apparatus 13 which receives the data, the configuration of the communication system is not limited to this. In particular, the communication system may include, for example, two transmission/reception apparatus in each of which both of the transmission apparatus 11 and the reception apparatus 13 described hereinabove with reference to FIG. 1 are formed as modules and serve as a transmission section and a reception section, respectively, as seen in FIG. 37.

Referring to FIG. 37, the communication system 501 includes a transmission/reception apparatus 511 and another transmission/reception apparatus 513 connected to a network 512 similar to the network 12 shown in FIG. 1. The transmission/reception apparatus 511 includes a transmission section 521 and a reception section 522 while the transmission/reception apparatus 513 includes a transmission section 531 and a reception section 532. The transmission section 521 and the transmission section 531 have a configuration basically similar to that of the transmission apparatus 11 shown in FIG.

1 and operate similarly. Therefore, detailed description of the transmission sections 521 and 531 is omitted herein to avoid redundancy.

Further, the reception section 522 and the reception section 532 of FIG. 37 have a configuration basically similar to that of the reception apparatus 13 shown in FIG. 1 and operate similarly, and therefore, detailed description of them is omitted herein to avoid redundancy.

Thus, the communication system 501 of FIG. 37 is formed from the transmission/reception apparatus 511 and the transmission/reception apparatus 513 each having a transmission section and a reception section built therein, and the transmission/reception apparatus 511 and 513 utilize redundant data produced using such EOR operation as described hereinabove to perform a communication process without re-sending control.

According to the configuration described above, also in bidirectional communication, the reception section can implement a high-speed restoration process of a high restoration performance without increasing the production cost. Accordingly, the transmission/reception apparatus 511 and the transmission/reception apparatus 513 can receive data readily and accurately.

It is to be noted that, while it is described that the communication system 1 in FIG. 1 includes a single transmission apparatus 11 and a single reception apparatus 13, the communication system is not limited to this and may otherwise include a plurality of transmission apparatus and/or a plurality of reception apparatus.

Figure 38:
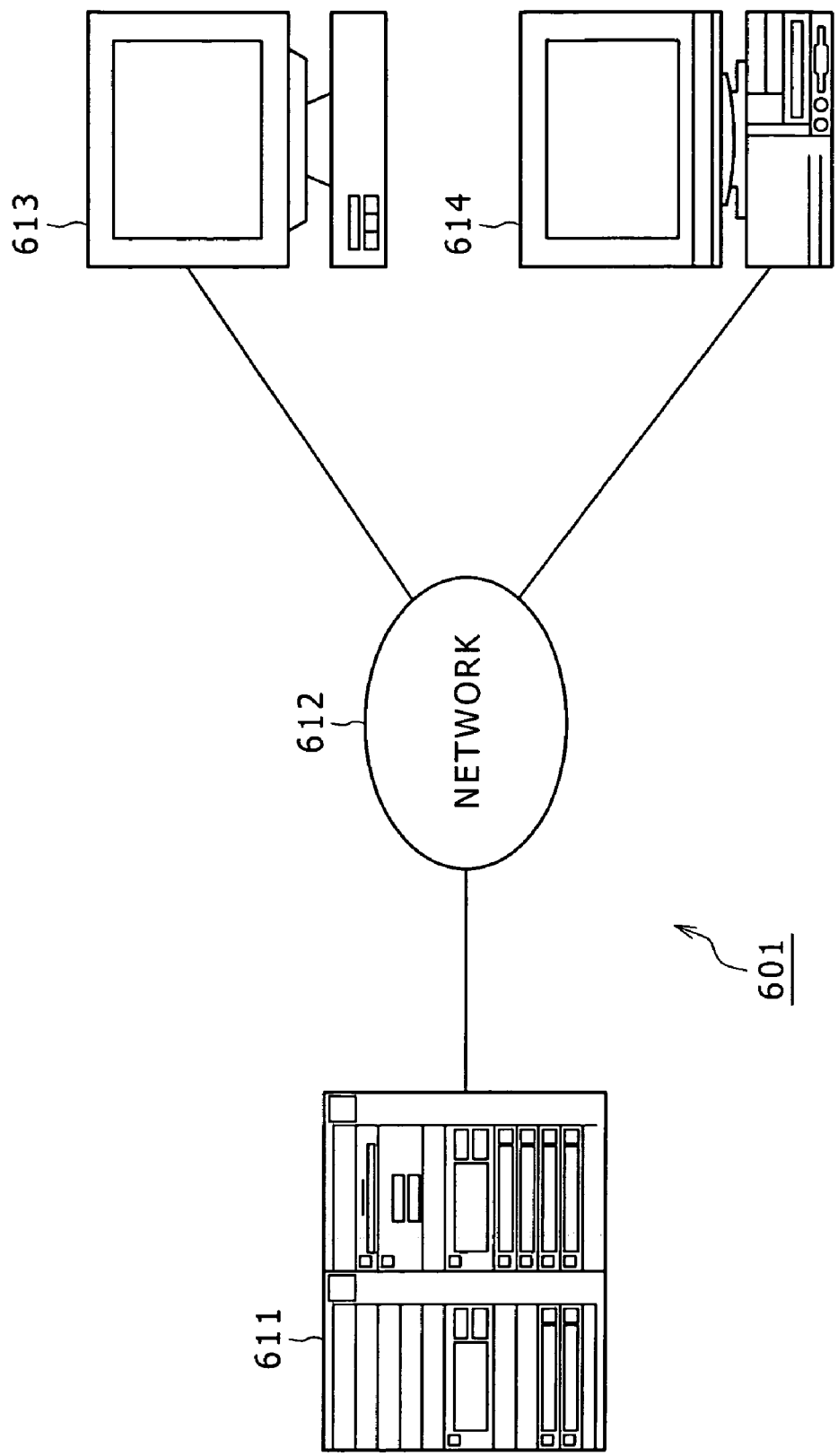
FIG. 38 is a block diagram showing an example of a configuration of a contents distribution system to which the present invention is applied.

FIG. 38 shows an example of a configuration of a contents distribution system to which the present invention is applied. Referring to FIG. 38, a server 611 of the contents distribution system 601 is connected to a network 612 similar to the network shown in FIG. 1 and similarly includes a plurality of terminal apparatus 613 and 614 connected to the network 612.

The server 611 has functions similar to those of the transmission apparatus 11. In particular, the server 611 packetizes contents data such as image data and sound data, adds redundant packets produced by EOR operation as described hereinabove, and transmits the resulting packets in a multicast fashion to the terminal apparatus 613 and the terminal apparatus 614 through the network 612.

The terminal apparatus 613 and the terminal apparatus 614 have functions similar to those of the reception apparatus 13. In particular, each of the terminal apparatus 613 and the terminal apparatus 614 receives packets supplied thereto from the server 611, restores lost packets using redundant data as described above to restore contents data and reproduce the contents data.

It is to be noted that the server 611 may otherwise distribute contents data by streaming distribution or may distribute contents data so that the contents data may be reproduced after they are downloaded.

Where the server 611 distributes packets to a plurality of terminal apparatus 613 and 614 in such a manner as described above, if the terminal apparatus 613 and the terminal apparatus 614 otherwise issue, when they fail to receive some packets, a re-sending request for the packets, then such re-sending requests may possibly be concentrated on the server 611 and increase the load to the server 611 to such a degree that the server 611 is placed into a down state. However, where the server 611 produces redundant data by EOR operation which applies a light load and distributes the redundant data together with contents data, even if the terminal apparatus 613 and the terminal apparatus 614 fail to receive some packets, they can restore contents data without issuing a re-sending request. Accordingly, increase of the load to the server 611 can be suppressed, and the server 611 can provide a stabilized distribution service of contents data.

It is to be noted that naturally the method of adding redundant data produced by EOR operation described above to transmission data and the method of using a re-sending request may be used in combination. In this instance, if the receiver side apparatus detects packet loss, then it first attempts to restore the base data using the received redundant data, if the attempt results in failure, then a re-sending request for the lost packet is issued to the transmission source. Since this can reduce the number of times of issuance of a re-sending request, the load of processing by a re-sending request can be reduced on both of the sender side and the receiver side. In other words, the load to the entire system can be reduced.

Further, in the communication system 1 of FIG. 1, the network 12 to which the transmission apparatus 11 and the reception apparatus 13 are connected may be partly or entirely formed from a wired system or from a wireless system. Further, the network 12 may be formed from a plurality of networks. In other words, the transmission apparatus 11 and the reception apparatus 13 may be connected to each other by a plurality of routers and so forth.

Furthermore, the transmission apparatus 11 and the reception apparatus 13 may include other components than those described hereinabove. For example, the transmission apparatus 11 and the reception apparatus 13 may include a display section such as a monitor or an inputting section such as a keyboard and buttons.

While the series of processes described above can be executed by hardware, it may otherwise be executed by software. Where the series of processes described above are executed by hardware or software, for example, each of the transmission apparatus 11 and the reception apparatus 13 shown in FIG. 1 includes such a personal computer as shown in FIG. 39.

Referring to FIG. 39, a central processing unit (CPU) 711 of the personal computer 701 executes various processes in accordance with a program stored in a ROM (Read Only Memory) 712 or a program loaded from a storage section 723 into a RAM (Random Access Memory) 713. Also data necessary for the CPU 711 to execute the processes are suitably stored into the RAM 713.

The CPU 711, ROM 712 and RAM 713 are connected to one another by a bus 714. Also an input/output interface 720 is connected to the bus 714.

An inputting section 721 including a keyboard, a mouse and so forth, an outputting section 722 including a display unit which may be a CRT (Cathode Ray Tube) or an LCD (Liquid Crystal Display) unit, a speaker and so forth, a storage section 723 formed from a hard disk or the like, a communication section 724 formed from a modem, and so forth are connected to the input/output interface 720. The communication section 724 performs a communication process through a network including the Internet.

Further, as occasion demands, a drive 725 is connected to the input/output interface 720. A removable medium 726 such as a magnetic disk, an optical disk, a magneto-optical disk or a semiconductor memory is suitably loaded into the drive 725, and a computer program read from the removable medium 726 is installed into the storage section 723 as occasion demands.

Where the series of processes described hereinabove are to be executed by software, a program which constructs the software is installed from a network or a recording medium.

The recording medium may be formed as the removable medium 726 such as, for example, as shown in FIG. 39, a magnetic disk (including a floppy disk), an optical disk (including a CD-ROM (Compact Disc-Read Only Memory) and a DVD (Digital Versatile Disk)), a magneto-optical disk (including an MD (Mini-Disc) (trademark)), or a semiconductor memory which has the program recorded thereon or therein or as the ROM 712 having the program recorded therein or a hard disk included in the storage section 723 which is distributed to a user in a form wherein it is incorporated in the apparatus body.

It is to be noted that, in the present specification, the steps which describe the program recorded in a recording medium may be but need not necessarily be processed in a time series in the order as described, and include processes which are executed in parallel or individually without being processed in a time series.

Further, in the present specification, the term "system" is used to represent an entire apparatus composed of a plurality of apparatus.

While preferred embodiments of the present invention have been described using specific terms, such description is for illustrative purposes only, and it is to be understood that changes and variations may be made without departing from the spirit or scope of the following claims.

What is claimed is:

1. A transmission/reception system, comprising:
    a transmission apparatus for transmitting transmission data; and
    a reception apparatus for receiving the transmission data transmitted from the transmission apparatus;
    the transmission apparatus being operable to:
        produce first data by dividing the transmission data into blocks having a predetermined size,
        select a plurality of the blocks of first data,
        produce second data based on results of an exclusive OR operation on the selected plurality of blocks of first data,
        add to the first data first relating information for enabling the reception apparatus to restore the first data,
        add second relating information to the second data,
        packetize the first data and the second data, and
        transmit the resulting packets to the reception apparatus; and
    the reception apparatus being operable to:
        receive both of the first data and the second data,
        decide, based on the first relating information, whether the reception apparatus fails to receive some of the first data,
        produce, when it is decided that the reception apparatus fails to receive some of the first data, an exclusive OR operation-based determinant for restoring the first data by using the second relating information, and
        solve the produced determinant to restore the first data.

2. A transmission apparatus for transmitting transmission data to a reception apparatus, comprising:
    a processor;
    a first production section for producing first data by dividing the transmission data into blocks having a predetermined size;
    a second production section for selecting a plurality of the blocks of the first data and for producing second data based on results of performing an exclusive OR operation on the selected plurality of blocks of the first data;
    an addition section for adding to at least one of the first data and the second data restoration relating information for enabling the reception apparatus to restore the first data when the reception apparatus fails to receive some of at least one of the first data and the second data; and
    a transmission section for packetizing the first data and the second data and for transmitting the resulting packets to the reception apparatus.

3. The transmission apparatus according to claim 2, wherein the restoration relating information comprises first relating information for specifying the first data which the reception apparatus fails to receive and second relating information for allowing the reception apparatus to align the second data received, and
    the addition section adds the first relating information to the first data and adds the second relating information to the second data.

4. The transmission apparatus according to claim 3, wherein the first relating information is a first packet number for identifying the first data and the second relating information is a second packet number for identifying the second data.

5. The transmission apparatus according to claim 3, wherein the restoration relating information further comprises third relating information for specifying the block data corresponding to the first data or to the second data, and
    the addition section adds the third relating information to the first data and the second data.

6. The transmission apparatus according to claim 5, wherein the third relating information is a block number for identifying the block data.

7. The transmission apparatus according to claim 3, wherein the second production section uses a predetermined coefficient matrix for selecting the first data.

8. The transmission apparatus according to claim 2, wherein the restoration relating information comprises first relating information for specifying the first data which the reception apparatus fails to receive and second relating information for allowing the reception apparatus to produce a coefficient matrix for use in the restoration, and
    the addition section adds the first relating information to the first data and adds the second relating information to the second data.

9. The transmission apparatus according to claim 8, wherein the second production section produces a coefficient matrix for selecting the plurality of blocks of the first data based on the second relating information and uses the coefficient matrix to produce the second data.

10. The transmission apparatus according to claim 8, wherein the first relating information is a first packet number for identifying the first data and the second relating information is a second packet number for identifying the second data.

11. The transmission apparatus according to claim 8, wherein the restoration relating information further comprises third relating information for specifying the block data corresponding to the first data or to the second data, and
    the addition section adds the third relating information to the first data and to the second data.

12. The transmission apparatus according to claim 11, wherein the third relating information is a block number for identifying the block data.

13. The transmission apparatus according to claim 2, wherein the transmission section transmits the packetized first data and second data in an arbitrary order.

14. A transmission method of a transmission apparatus for transmitting transmission data to a reception apparatus, comprising:
    producing first data by dividing the transmission data into a plurality of blocks having a predetermined size;

selecting a plurality of the blocks of the first data;
producing second data based on the results of performing an exclusive OR operation on the selected plurality of blocks of the first data;
adding to at least one of the first data and the second data restoration relating information for enabling the reception apparatus to restore the first data when the reception apparatus fails to receive some of at least one of the first data and the second data;
packetizing the first data and the second data; and
transmitting the resulting packets to the reception apparatus.

15. A computer-readable storage medium storing a computer program for causing a computer of a transmission apparatus to perform a method of transmitting transmission data to a reception apparatus, the method comprising:
producing first data by dividing the transmission data into a plurality of blocks having a predetermined size;
selecting a plurality of the blocks of the first data;
producing second data based on results of performing an exclusive OR operation on the selected plurality of the blocks of the first data;
adding to at least one of the first data and the second data restoration relating information for enabling the reception apparatus to restore the first data when the reception apparatus fails to receive some of at least one of the first data and the second data;
packetizing the first data and the second data; and
transmitting the resulting packets to the reception apparatus.

16. A reception apparatus for receiving transmission data transmitted from a transmission apparatus, comprising:
a processor;
a reception section for receiving first data comprising the transmission data divided into selected blocks having a predetermined size and packetized, and for receiving second data representative of the results of performing an exclusive OR operation on the selected plurality of the blocks of the first data;
a decision section for deciding, based on first relating information for enabling the reception apparatus to restore the first data and added to the first data, whether the reception section fails to receive some of the first data;
a determinant production section for producing, when it is decided that the reception section fails to receive some of the first data, an exclusive OR operation-based determinant for restoring the first data by using second relating information added to the second data and relating to the restoration of the first data; and
a restoration section for solving the determinant to thereby restore the first data.

17. The reception apparatus according to claim 16, wherein the first relating information is a first packet number for identifying the first data and the second relating information is a second packet number for identifying the second data.

18. The reception apparatus according to claim 16, wherein the determinant production section aligns the second data based on the second relating information and produces the determinant using the aligned second data, the first data received by the reception section, and a predetermined coefficient matrix.

19. The reception apparatus according to claim 16, further comprising a coefficient matrix production section for producing a coefficient matrix for the restoration of the first data, the determinant production section producing the determinant using the first data, the second data, and the coefficient matrix.

20. A reception method of a reception apparatus for receiving transmission data transmitted from a transmission apparatus, the method comprising:
receiving first data comprising the transmission data divided into selected plurality of blocks having a predetermined size and packetized;
receiving second data representative of results of performing an exclusive OR operation on the selected plurality of blocks of the first data;
deciding, based on first relating information for enabling the reception apparatus to restore the first data added to at least one of the first data and second data, whether the reception apparatus fails to receive some of the first data;
producing, when it is decided that the reception apparatus fails to receive some of the first data, an exclusive OR operation-based determinant for restoring the first data by using second relating information added to the second data and relating to the restoration of the first data; and
solving the determinant to thereby restore the first data.

21. A computer-readable storage medium storing a program for causing a computer of a reception apparatus to perform a reception method of receiving transmission data transmitted from a transmission apparatus, the method comprising:
receiving first data comprising the transmission data divided into a selected plurality of blocks having a predetermined size and packetized;
receiving second data representative of results of performing an exclusive OR operation on the selected plurality of blocks of the first data;
deciding, based on first relating information for enabling the reception apparatus to restore the first data added to at least one of the first data and second data whether the reception apparatus fails to receive some of the first data;
producing, when it is decided that the reception apparatus fails to receive some of the first data, an exclusive OR operation-based determinant for restoring the first data by using second relating information added to the second data and relating to the restoration of the first data; and
solving the determinant to thereby restore the first data.

22. A transmission/reception apparatus for transmitting and receiving transmission data, comprising:
a processor;
a first production section for producing first data by dividing the transmission data into a plurality of blocks having a predetermined size;
a second production section for selecting a plurality of the blocks of the first data and for producing second data representative of results of performing an exclusive OR operation on the selected plurality of blocks of the first data;
an addition section for adding to the first data first relating information for enabling the restoration of the first data and for adding to the second data second relating information which relates to the restoration of the first data;
a transmission section for packetizing the first data and the second data and for transmitting the resulting packets to another transmission/reception apparatus;
a reception section for receiving both of the first data and the second data transmitted from the other transmission/reception apparatus;
a decision section for deciding, based on the first relating information, whether the reception section fails to receive some of the first data;

a determinant production section for producing, when it is decided that the reception section fails to receive some of the first data, an exclusive OR operation-based determinant for restoring the first data by performing using the second relating information; and a restoration section for solving the determinant to thereby restore the first data.

23. A transmission/reception method of a transmission/reception apparatus for transmitting and receiving transmission data, comprising:

producing first data by dividing of the transmission data into a plurality of blocks having a predetermined size;

selecting a plurality of the blocks of the first data;

producing second data representative of results of performing an exclusive OR operation on the selected plurality of blocks of the first data;

adding to the first data first relating information for enabling the restoration of the first data;

adding to the second data second relating information which relates to the restoration of the first data;

packetizing the first data and the second data;

transmitting the resulting packets to another transmission/reception apparatus;

receiving the first data and the second data transmitted from the other transmission/reception apparatus;

deciding, based on the first relating information, whether the other transmission/reception apparatus fails to receive some of the first data;

producing, when it is decided that the other transmission/reception apparatus fails to receive some of the first data, an exclusive OR operation-based determinant for restoring the first data by using the second relating information; and solving the determinant to thereby restore the first data.

24. A computer-readable storage medium storing a program for causing a computer of a transmission/reception apparatus to perform a transmission/reception method for transmitting and receiving transmission data, the method comprising:

producing first data by dividing of the transmission data into a plurality of blocks having a predetermined size;

selecting a plurality of the blocks of the first data;

producing second data representative of results of performing an exclusive OR operation on the selected plurality of blocks of the first data;

adding to the first data first relating information for enabling the restoration of the first data;

adding to the second data second relating information which relates to the restoration of the first data;

packetizing the first data and the second data;

transmitting the resulting packets to another transmission/reception apparatus;

receiving the first data and the second data transmitted from the other transmission/reception apparatus;

deciding, based on the first relating information, whether the other transmission/reception apparatus fails to receive some of the first data;

producing, when it is decided that the other transmission/reception apparatus fails to receive some of the first data, an exclusive OR operaton-based determinant for restoring the first data by using the second relating information; and solving the determinant to thereby restore the first data.

* * * * *